(12) United States Patent
Nagayama et al.

(10) Patent No.: US 12,201,015 B2
(45) Date of Patent: Jan. 14, 2025

(54) IRIDIUM COMPLEX COMPOUND, COMPOSITION CONTAINING THE COMPOUND AND SOLVENT, ORGANIC ELECTROLUMINESCENT ELEMENT CONTAINING THE COMPOUND, DISPLAY DEVICE, AND ILLUMINATION DEVICE

(71) Applicant: Mitsubishi Chemical Corporation, Tokyo (JP)

(72) Inventors: Kazuhiro Nagayama, Tokyo (JP); Yoshiko Kajiyama, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 590 days.

(21) Appl. No.: 17/454,504

(22) Filed: Nov. 11, 2021

(65) Prior Publication Data

US 2022/0069238 A1 Mar. 3, 2022

Related U.S. Application Data

(63) Continuation of application No. PCT/JP2020/019091, filed on May 13, 2020.

(30) Foreign Application Priority Data

May 15, 2019 (JP) .................... 2019-092237

(51) Int. Cl.
| | |
|---|---|
| *H10K 85/30* | (2023.01) |
| *C07F 15/00* | (2006.01) |
| *C09K 11/06* | (2006.01) |
| *H10K 50/11* | (2023.01) |
| *H10K 101/10* | (2023.01) |

(52) U.S. Cl.
CPC ....... *H10K 85/342* (2023.02); *C07F 15/0033* (2013.01); *C09K 11/06* (2013.01); *C09K 2211/1029* (2013.01); *C09K 2211/185* (2013.01); *H10K 50/11* (2023.02); *H10K 2101/10* (2023.02)

(58) Field of Classification Search
CPC .................................................. H10K 85/342
See application file for complete search history.

(56) References Cited

U.S. PATENT DOCUMENTS

| | | | |
|---|---|---|---|
| 9,126,970 B2 | 9/2015 | Pflumm et al. | |
| 9,159,930 B2 | 10/2015 | Anemian et al. | |
| 9,187,456 B2 | 11/2015 | Franz et al. | |
| 9,199,972 B2 | 12/2015 | Parham et al. | |
| 9,212,198 B2 | 12/2015 | Franz et al. | |
| 9,273,080 B2 | 3/2016 | Stoessel et al. | |
| 9,537,105 B2 | 1/2017 | Pflumm et al. | |
| 9,666,806 B2 | 5/2017 | Anemian et al. | |
| 9,882,135 B2 | 1/2018 | Anemian et al. | |
| 10,233,159 B2 | 3/2019 | Franz et al. | |
| 10,490,747 B2 | 11/2019 | Anemian et al. | |
| 10,714,691 B2 | 7/2020 | Anemian et al. | |
| 10,981,880 B2 | 4/2021 | Franz et al. | |

(Continued)

FOREIGN PATENT DOCUMENTS

| | | |
|---|---|---|
| CN | 103002949 A | 3/2013 |
| CN | 104053664 A | 9/2014 |

(Continued)

OTHER PUBLICATIONS

Barcina et al. "Efficient Photoinduced Energy Transfer Mediated by Aromatic Homoconjugated Bridges" Chem. Eur. J. 2010, 16, 6033-6040. (Year: 2010).*

(Continued)

*Primary Examiner* — Peter F Godenschwager
(74) *Attorney, Agent, or Firm* — Oblon, McClelland, Maier & Neustadt, L.L.P.

(57) ABSTRACT

An iridium complex compound denoted by a formula (1) below.

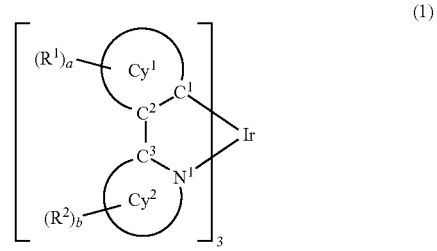

(1)

A ring $Cy^1$ represents a monocyclic or fused aromatic ring or a monocyclic or fused heteroaromatic ring, which includes carbon atoms $C^1$ and $C^2$.

A ring $Cy^2$ represents a monocyclic or fused heteroaromatic ring, which includes carbon atom $C^3$ and a nitrogen atom $N^1$.

Each of $R^1$ and $R^2$ represents a hydrogen atom or a substituent.

At least one of $R^1$ and $R^2$ is a substituent denoted by a formula (2) below or a substituent further substituted with a substituent denoted by a formula (2) below.

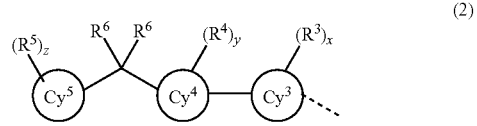

(2)

15 Claims, 1 Drawing Sheet

(56) References Cited

U.S. PATENT DOCUMENTS

| | | |
|---|---|---|
| 2011/0291083 A1 | 12/2011 | Kim et al. |
| 2012/0068170 A1 | 3/2012 | Pflumm et al. |
| 2012/0175561 A1 | 7/2012 | Franz et al. |
| 2012/0228552 A1 | 9/2012 | Parham et al. |
| 2012/0228554 A1 | 9/2012 | Franz et al. |
| 2012/0238105 A1 | 9/2012 | Anemian et al. |
| 2013/0082209 A1 | 4/2013 | Stoessel et al. |
| 2013/0116755 A1 | 5/2013 | Anémian et al. |
| 2013/0200340 A1 | 8/2013 | Otsu et al. |
| 2014/0048745 A1 | 2/2014 | Anemian et al. |
| 2014/0319505 A1 | 10/2014 | Nagayama et al. |
| 2014/0350642 A1 | 11/2014 | Anémian et al. |
| 2015/0318478 A1 | 11/2015 | Pflumm et al. |
| 2015/0364689 A1 | 12/2015 | Anemian et al. |
| 2016/0096809 A1 | 4/2016 | Franz et al. |
| 2017/0125676 A1 | 5/2017 | Anemian et al. |
| 2018/0114912 A1 | 4/2018 | Anemian et al. |
| 2019/0169139 A1 | 6/2019 | Franz et al. |
| 2019/0207114 A9 | 7/2019 | Anemian et al. |
| 2021/0221775 A1 | 7/2021 | Franz et al. |

FOREIGN PATENT DOCUMENTS

| | | |
|---|---|---|
| CN | 104066742 A | 9/2014 |
| CN | 105712986 A | 6/2016 |
| CN | 107614510 A | 1/2018 |
| DE | 10 2010 027 218 A1 | 1/2012 |
| EP | 3 932 927 A1 | 1/2022 |
| WO | WO 2010/061989 A1 | 6/2010 |
| WO | WO 2011/032626 A1 | 3/2011 |
| WO | WO 2013/031794 A1 | 3/2013 |
| WO | WO 2013/097920 A1 | 7/2013 |
| WO | WO 2013/105615 A1 | 7/2013 |
| WO | WO 2013/114674 A1 | 8/2013 |
| WO | WO 2016/194784 A1 | 12/2016 |
| WO | WO 2019/107467 A1 | 6/2019 |

OTHER PUBLICATIONS

International Search Report issued Jul. 14, 2020 in PCT/JP2020/019091 filed on May 13, 2020, 2 pages.
Extended European Search Report issued May 27, 2022, in corresponding European Patent Application No. 20806571.4, 7 pages.
European Office Action issued Nov. 3, 2023 in European Patent Application No. 20806571.4, 4 pages.
Combined Taiwanese Office Action and Search Report issued Nov. 20, 2023 in Taiwanese Patent Application No. 109116136 (with unedited computer-generated English translation), 15 pages.
Yang, C. et al., "High efficiency mer-iridium complexes for organic light-emitting diodes," Chemical Communications, Aug. 23, 2004, 7 pages.
Grzelak, I. et al., "Quantum-chemical studies of homoleptic iridium(III) complexes in OLEDs: fac versus mer isomers," Journal of Molecular Modeling, vol. 25, No. 154, May 10, 2019, 9 pages.
European Office Action issued on Aug. 21, 2023 in European Patent Application No. 20 806 571.4, 4 pages.
Combined Chinese Office Action and Search Report issued Jun. 17, 2023 in Chinese Application No. 202080036080X, (with machine English Translation of Office Action only), 10 pages.
Tsujimura, "Yuuki EL Disupurei Gairon—Kiso kara Ouyou made (Introduction to Organic EL Display—From Fundamentals To Applications)", Sangyo Tosho , Nov. 2010, 9 pages.

\* cited by examiner

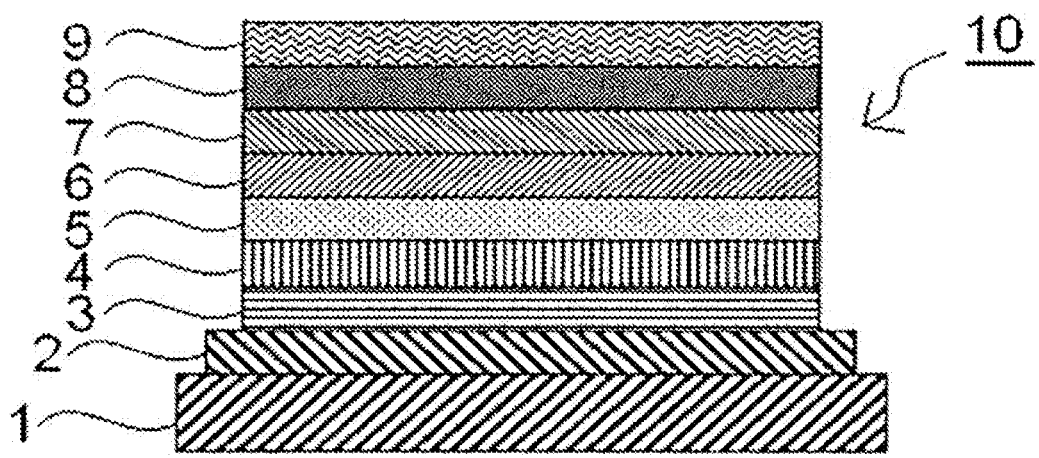

IRIDIUM COMPLEX COMPOUND, COMPOSITION CONTAINING THE COMPOUND AND SOLVENT, ORGANIC ELECTROLUMINESCENT ELEMENT CONTAINING THE COMPOUND, DISPLAY DEVICE, AND ILLUMINATION DEVICE

TECHNICAL FIELD

The present invention relates to an iridium complex compound, and particularly relates to an iridium complex compound useful as a material for a light-emitting layer of an organic electroluminescent element (hereinafter also referred to as an "organic EL element"). The present invention also relates to a composition containing the compound and a solvent, an organic electroluminescent element containing the compound, a display device including the organic electroluminescent element, and an illumination device including the organic electroluminescent element.

BACKGROUND ART

Various electronic devices, in which organic EL elements such as organic EL illuminators and organic EL displays are used, have been put to practical use. Organic EL elements, which consume little power because of their low applied voltage and which can also perform light emission of three primary colors, have been put to practical use not only in large-sized display monitors but also in medium- and small-sized displays typified by cellular phones and smartphones.

Organic EL elements are produced by stacking a plurality of layers such as a light-emitting layer, a charge injection layer, and a charge transport layer. Currently, many of the organic EL elements are produced by depositing organic materials under vacuum. However, vacuum deposition methods involve complex deposition processes and are poor in productivity. It is very difficult to provide a large-sized panel for an illuminator or a display by using an organic EL element produced by a vacuum deposition method. Consequently, in recent years, wet film-forming methods (application methods) have been intensively studied as processes for efficiently producing an organic EL element that can be used in a large-sized display or illuminator (NPL 1). Wet film-forming methods, compared with vacuum deposition methods, have the advantage of being able to readily form stable layers. Therefore, wet film-forming methods are expected to be applied to mass production of displays and illumination devices and to large-sized devices.

To produce an organic EL element by a wet film-forming method, materials used all need to smoothly dissolve in an organic solvent and to be usable in the form of an ink. In particular, regarding a phosphorescent light-emitting element including an iridium complex compound, to increase the element operating lifetime, so-called heavy doping through which the concentration of the iridium complex compound in a light-emitting layer is maximized is performed. As a result, high solubility of the iridium complex compound needs to be maintained. However, there is a problem that the phosphorescent light-emitting element undergoing heavy doping simultaneously causes concentration quenching so as to considerably impair light emission efficiency.

Measures to suppress the light emission efficiency from being reduced due to concentration quenching and to form an light-emitting layer ink capable of undergoing heavy doping include a method in which an alkyl group or an aralkyl group is introduced into an iridium complex compound (PTL 1 to PTL 3). These groups are very flexible and, therefore, can enhance the solubility of the complex. In addition, since the central portion of the iridium complex is electrically insulated and shielded, concentration quenching can be suppressed.

In recent years, car-mounted panels and display devices of car navigation systems have attracted attention as applications of organic EL displays. The reason for this is that the organic EL display is a spontaneous light emission type in contrast to a liquid crystal display and, therefore, has excellent visibility and that a reduction in power consumption can be expected. A wide-range available temperature is required in applications by exploiting car mounting, it is required to operate within the range from a high-temperature state in summer (for example, 80° C.) to a low temperature in winter (for example, 10° C. below the freezing point) without problem, and it is further necessary that a product operating lifetime be not impaired even when exposure to a high temperature state is performed for a long time.

In this regard, as a result of forming an organic EL element by using an iridium complex compound described in PTL 1 to PTL 3 and examining the operation temperature, it was found that the element characteristics considerably deteriorated in the above-described high-temperature state.

PTL 1: International Publication No. 2013/105615
PTL 2: International Publication No. 2011/032626
PTL 3: International Publication No. 2016/194784
NPL 1: Tsujimura Takatoshi "Yuuki EL Disupurei Gairon— Kiso kara Ouyou made— (Introduction to Organic EL Display—From Fundamentals To Applications—) Sangyo Tosho, November 2010

SUMMARY OF INVENTION

An issue to be addressed by the present invention is the provision of an iridium complex compound that ensures compatibility between high solubility suitable for heavy doping and high heat resistance suitable for a car-mounted display.

Solution to Problem

The present inventors found that an iridium complex compound having a specific chemical structure enables the compatibility between high solubility and high heat resistance to be ensured, and the present invention was realized as described below.

[1] An iridium complex compound denoted by a formula (1) below,

[Chem. 1]

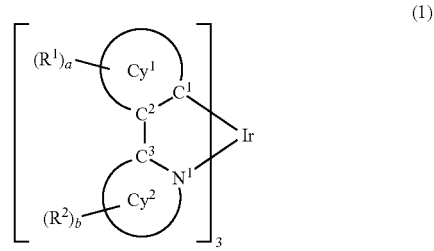

in the formula (1), Ir represents an iridium atom,
a ring $Cy^1$ represents a monocyclic or fused aromatic ring or a monocyclic or fused heteroaromatic ring, which includes carbon atoms $C^1$ and $C^2$, a ring $Cy^2$ represents a monocyclic or fused heteroaromatic ring, which includes carbon atom $C^3$ and a nitrogen atom $N^1$, each of $R^1$ and $R^2$ represents a hydrogen atom or a substituent, a represents an integer of 0 or more, an upper limit of which is the maximum number of possible substituents on the ring $Cy^1$, b represents an integer of 0 or more, an upper limit of which is the maximum number of possible substituents on the ring $Cy^2$, when there are a plurality of $R^1$ and a plurality of $R^2$, the plurality of $R^1$ and the plurality of $R^2$ are independent of each other and may be the same or may differ from each other, and at least one of $R^1$ and $R_2$ is a substituent denoted by a formula (2) below or a substituent further substituted with a substituent denoted by a formula (2) below,

[Chem. 2]

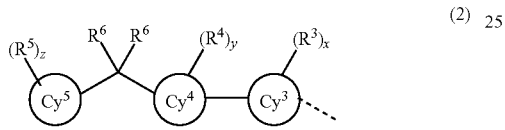

(2)

in the formula (2), a broken line represents a bonding hand, each of a ring $Cy^3$, a ring $cy^4$, and a ring Cy represents an aromatic ring or a heteroaromatic ring, each of $R^3$ to $R^6$ represents a hydrogen atom or a substituent, each of x, y, and z represents an integer of 0 or more, an upper limit of which is the maximum number of possible substituents on the ring $Cy^3$, the ring $cy^4$, and the ring $Cy^1$, respectively, and two $R^6$ and a plurality of $R^3$ to a plurality of R' when there are a plurality of $R^3$ to a plurality of R' are independent of each other and may be the same or may differ from each other.

[2] The iridium complex compound according to [1], wherein the substituent denoted by the formula (2) is a substituent denoted by a formula (3) below,

[Chem. 3]

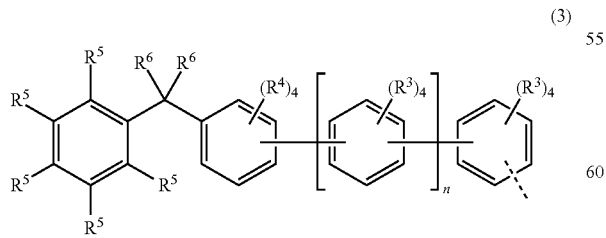

(3)

in the formula (3), each of $R^3$ to $R^6$ is synonymous with that in the formula (2), and n represents an integer of 0 to 10.

[3] The iridium complex compound according to [1], wherein the substituent denoted by the formula (2) is a substituent denoted by a formula (4) below,

[Chem. 4]

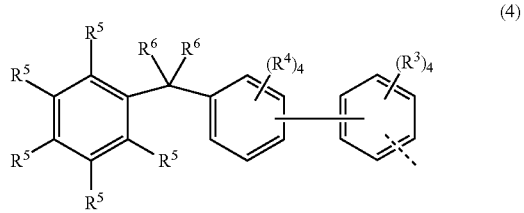

(4)

in the formula (4), each of $R^3$ to $R^6$ is synonymous with that in the formula (2).

[4] The iridium complex compound according to [1], wherein the substituent denoted by the formula (2) is a substituent denoted by a formula (2A) below,

[Chem. 5]

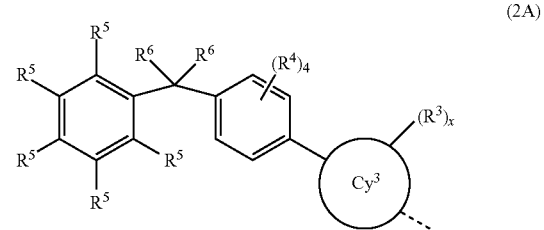

(2A)

in the formula (2A), each of a ring $Cy^3$, $R^3$, $R^4$, $R^5$, $R^6$, and x is synonymous with that in the formula (2).

[5] The iridium complex compound according to [1], wherein the substituent denoted by the formula (2) is a substituent denoted by a formula (3A) below,

[Chem. 6]

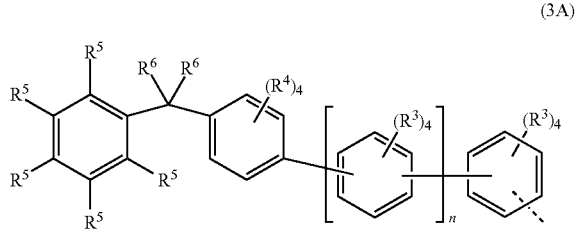

(3A)

in the formula (3A), each of $R^3$ to $R^6$ is synonymous with that in the formula (2), and n represents an integer of 0 to 10.

[6] The iridium complex compound according to [1], wherein the substituent denoted by the formula (2) is a substituent denoted by a formula (4A) below,

[Chem. 7]

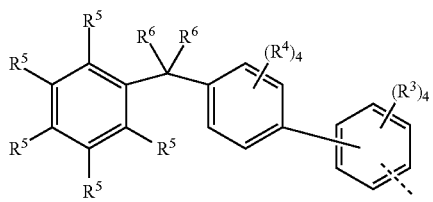

(4A)

in the formula (4A), each of $R^3$ to $R^6$ is synonymous with that in the formula (2).

[7] The iridium complex compound according to any one of [1] to [6], wherein $Cy^3$ in the formula (2) has a partial structure denoted by formula (5) below,

[Chem. 8]

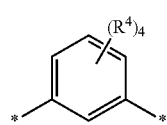

(5)

in the formula (5), $R^4$ is synonymous with that in the formula (2), and "*" represents a bonding position.

[8] The iridium complex compound according to any one of [1] to [7], wherein the ring $Cy^1$ is a benzene ring.

[9] The iridium complex compound according to any one of [1] to [8], wherein the ring $Cy^2$ is a pyridine ring.

[10] The iridium complex compound according to any one of [1] to [9], wherein each of $R^1$ to $R^6$ is a hydrogen atom or a substituent selected from a substituent group W below,

[Substituent Group W]

D, F, Cl, Br, I, —N(R')$_2$, —CN, —NO$_2$, —OH, —COOR', —C(=O)R', —C(=O)NR', —P(=O)(R')$_2$, —S(=O)R', —S(=O)$_2$R', —OSO$_2$R', a linear, branched, or cyclic alkyl group having 1 to 30 carbon atoms, a linear, branched, or cyclic alkoxy group having 1 to 30 carbon atoms, a linear, branched, or cyclic alkylthio group having 1 to 30 carbon atoms, a linear, branched, or cyclic alkenyl group having 2 to 30 carbon atoms, a linear, branched, or cyclic alkynyl group having 2 to 30 carbon atoms, an aromatic group having 5 to 60 carbon atoms, a heteroaromatic group having 5 to 60 carbon atoms, an aryloxy group having 5 to 40 carbon atoms, an arylthio group having 5 to 40 carbon atoms, an aralkyl group having 5 to 60 carbon atoms, a heteroaralkyl group having 5 to 60 carbon atoms, a diarylamino group having 10 to 40 carbon atoms, an arylheteroarylamino group having 10 to 40 carbon atoms, and a diheteroarylamino group having 10 to 40 carbon atoms, the alkyl group, the alkoxy group, the alkylthio group, the alkenyl group, the alkynyl group, the aralkyl group, and the heteroaralkyl group may be further substituted with one or more R', one —CH$_2$— group or two or more non-adjacent —CH$_2$— groups in these groups may be substituted with —C(—R')=C(—R')—, —C≡C—, —Si(—R')$_2$—, —C(=O)—, —NR'—, —O—, —S—, —CONR'—, or a divalent aromatic group, one or more hydrogen atoms in these groups may be substituted with D, F, Cl, Br, I, or —CN, each of two adjacent R' to $R^4$ may lose a hydrogen radical and the residual radicals may be bonded to each other to form an aliphatic, aromatic, or heteroaromatic monocyclic ring or fused ring, the aromatic group, the heteroaromatic group, the aryloxy group, the arylthio group, the diarylamino group, the arylheteroarylamino group, and the diheteroarylamino group may be further substituted with one or more R', each R' is selected from H, D, F, Cl, Br, I, —N(R")$_2$, —CN, —NO$_2$, —Si(R")$_3$, —B(OR") 2, —C(=O)R", —P(=O)(R")$_2$, —S(=O)$_2$R", —OSO$_2$R", a linear, branched, or cyclic alkyl group having 1 to 30 carbon atoms, a linear, branched, or cyclic alkoxy group having 1 to 30 carbon atoms, a linear, branched, or cyclic alkylthio group having 1 to 30 carbon atoms, a linear, branched, or cyclic alkenyl group having 2 to 30 carbon atoms, a linear, branched, or cyclic alkynyl group having 2 to 30 carbon atoms, an aromatic group having 5 to 60 carbon atoms, a heteroaromatic group having 5 to 60 carbon atoms, an aryloxy group having 5 to 40 carbon atoms, an arylthio group having 5 to 40 carbon atoms, an aralkyl group having 5 to 60 carbon atoms, a heteroaralkyl group having 5 to 60 carbon atoms, a diarylamino group having 10 to 40 carbon atoms, an arylheteroarylamino group having 10 to 40 carbon atoms, and a diheteroarylamino group having 10 to 40 carbon atoms (the alkyl group, the alkoxy group, the alkylthio group, the alkenyl group, the alkynyl group, the aralkyl group, and the heteroaralkyl group may be further substituted with one or more R", one CH$_2$ group or two or more non-adjacent CH$_2$ groups in these groups may be substituted with —R"C=CR'—, —C≡C—, —Si(R")$_2$, —C(=O)—, —NR"—, —O—, —S—, —CONR"—, or a divalent aromatic group, one or more hydrogen atoms in these groups may be substituted with D, F, Cl, Br, I, or CN, and the aromatic group, the heteroaromatic group, the aryloxy group, the arylthio group, the diarylamino group, the arylheteroarylamino group, and the diheteroarylamino group may be further substituted with one or more R")

each of two adjacent R' may lose a hydrogen radical and the residual radicals may be bonded to each other to form an aliphatic, aromatic, or heteroaromatic monocyclic ring or fused ring, and each R" is selected from H, D, F, CN, an aliphatic hydrocarbon group having 1 to 20 carbon atoms, an aromatic group having 1 to 20 carbon atoms, and a heteroaromatic group having 1 to 20 carbon atoms, and two or more adjacent R" may be bonded to each other to form an aliphatic, aromatic, or heteroaromatic, monocyclic or fused ring.

[11] The iridium complex compound according to any one of [1] to [10], wherein at least one of R' is a substituent denoted by the formula (2) above or is further substituted with a substituent denoted by the formula (2) above.

[12] A composition comprising the iridium complex compound according to any one of [1] to [11] and an organic solvent.

[13] An organic electroluminescent element comprising the iridium complex compound according to any one of [1] to [11]

[14] A display device comprising the organic electroluminescent element according to [13].

[15] An illumination device comprising the organic electroluminescent element according to [13].

Advantageous Effects of Invention

The iridium complex compound according to the present invention has high solvent solubility and high heat resistance. Consequently, when the organic EL element is produced by a wet film-forming method, a light-emitting layer ink suitable for heavy doping can be prepared. In addition, the element characteristics are suppressed from deteriorating even in a high-temperature state.

According to the iridium complex compound of the present invention, an organic EL element having excellent high-temperature light emission characteristics can be provided.

BRIEF DESCRIPTION OF DRAWINGS

FIG. 1 is a sectional view schematically illustrating an example of a structure of an organic electroluminescent element of the present invention.

DESCRIPTION OF EMBODIMENTS

Embodiments of the present invention will now be described in detail, but the present invention is not limited to the following embodiments and can be practiced with various modifications within the scope of the gist of the invention.

As used herein, the term "aromatic ring" refers to an "aromatic hydrocarbon ring" and is distinct from a "heteroaromatic ring" which includes a heteroatom as an annular atom. Similarly, the term "aromatic group" refers to an "aromatic hydrocarbon ring group", and the term "heteroaromatic group" refers to a "heteroaromatic ring group".

When "aromatic ring" and "heteroaromatic ring" are partial structures constituting the compounds according to the present invention, these structures in the compounds according to the present invention are specified to have a free valence necessary for bonding. For example, an aromatic ring that bonds by a single bond has a free valence of univalence.

An aromatic ring that links two structures has a free valence of bivalence.

In the present invention, the free valence denotes being capable of forming a bond with another free valence, as described in "Yuukikagaku-Seikagaku Meimeihou (jou) (Organic Chemistry-Biochemistry Nomenclature (first volume)) (revised second edition, Nankodo, issued 1992). For example, "a benzene ring having a free valence of 1" is a phenyl group, and "a benzene ring having a free valence of 2" is a phenylene group.

[Iridium Complex Compound]

An iridium complex compound of the present invention is a compound represented by formula (1) below.

[Chem. 9]

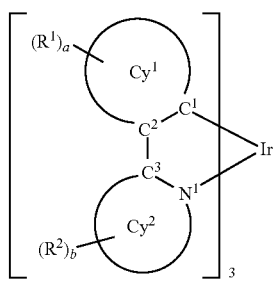

in the formula (1), Ir represents an iridium atom, a ring $Cy^1$ represents a monocyclic or fused aromatic ring or a monocyclic or fused heteroaromatic ring, which includes carbon atoms $C^1$ and $C^2$, a ring $Cy^2$ represents a monocyclic or fused heteroaromatic ring, which includes carbon atom $C^3$ and a nitrogen atom $N^1$, each of $R^1$ and $R^2$ represents a hydrogen atom or a substituent, a represents an integer of 0 or more, an upper limit of which is the maximum number of possible substituents on the ring $Cy^1$, b represents an integer of 0 or more, an upper limit of which is the maximum number of possible substituents on the ring $Cy^2$, when there are a plurality of $R^1$ and a plurality of $R^2$, the plurality of $R^1$ and the plurality of $R^2$ are independent of each other and may be the same or may differ from each other, and at least one of $R^1$ and $R_2$ is a substituent denoted by a formula (2) below or a substituent further substituted with a substituent denoted by a formula (2) below,

[Chem. 10]

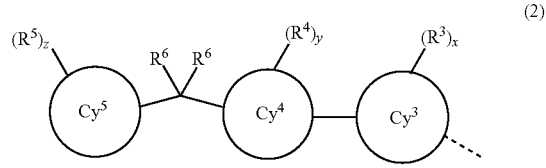

in the formula (2), a broken line represents a bonding hand, each of a ring $Cy^3$, a ring $cy^4$, and a ring Cy represents an aromatic ring or a heteroaromatic ring, each of $R^3$ to $R^6$ represents a hydrogen atom or a substituent, each of x, y, and z represents an integer of 0 or more, an upper limit of which is the maximum number of possible substituents on the ring $Cy^3$, the ring $cy^4$, and the ring $Cy^5$, respectively, and two $R^6$ and a plurality of $R^3$ to a plurality of $R^5$ when there are a plurality of $R^3$ to a plurality of $R^5$ are independent of each other and may be the same or may differ from each other.

<Structural Feature>

It is conjectured that the reason for the iridium complex compound according to the present invention ensuring compatibility between high solubility and high heat resistance is as described below.

To obtain high solubility, it is preferable that the molecule have many available conformations due to rotation of a chemical bond. Regarding the iridium complex compound according to the present invention, available conformations are increased by the benzyl carbon atom ($—C(—R^6)_2-Cy^5$) denoted by formula (2), the ring $Cy^4$ bonded thereto, and another ring $Cy^3$ bonded to the ring $Cy^4$ being linked in series so as to ensure the solubility.

Meanwhile, suppression of concentration quenching due to heavy doping is achieved by the surroundings of the iridium atom being effectively shield by the ring $Cy^5$ that is insulated from the electron clouds of ligands around the iridium atom by the benzyl carbon atom.

Regarding the substituent denoted by formula (2) for realizing the solubility, conformations may be increased but local molecular motion thereof is suppressed compared with the technology to provide solubility due to presence of an alkylene group having 2 or more carbon atoms, as disclosed in PTL 1. Consequently, a phenomenon such as a considerable reduction in glass transition temperature does not occur, and very high glass transition temperature can be exhibited. This is the reason the maintenance of high thermal stability of the light-emitting layer can be expected even when the element is placed at a high temperature of, for example, 80° C. or higher.

<Ring $Cy^1$>

The ring $Cy^1$ represents an aromatic ring or a heteroaromatic ring including the carbon atoms $C^1$ and $C^2$ coordinating with an iridium atom.

The ring $Cy^1$ may be a monocyclic ring or a fused ring in which a plurality of rings are bonded to each other. In the instance of a fused ring, there is no particular limitation regarding the number of rings, 6 or less is preferable, and 5 or less is preferable since the solvent solubility of the complex tends not to be impaired.

Although not particularly limited, when the ring $Cy^1$ is a heteroaromatic ring, the heteroatom included as an annular atom in addition to the carbon atoms is preferably selected from a nitrogen atom, an oxygen atom, a sulfur atom, a silicon atom, a phosphorus atom, and a selenium atom, from the viewpoint of chemical stability of the complex.

Specific examples of the ring $Cy^1$ include, in the case of aromatic rings, monocyclic rings such as a benzene ring; bicyclic rings such as a naphthalene ring; and tri- or higher cyclic rings such as a fluorene ring, an anthracene ring, a phenanthrene ring, a perylene ring, a tetracene ring, a pyrene ring, a benzpyrene ring, a chrysene ring, a triphenylene ring, and a fluoranthene ring. In the case of heteroaromatic rings, specific examples include oxygen-containing rings such as a furan ring, a benzofuran ring, and a dibenzofuran ring; sulfur-containing rings such as a thiophene ring, a benzothiophene ring, and a dibenzothiophene ring; nitrogen-containing rings such as a pyrrole ring, a pyrazole ring, an imidazole ring, a benzimidazole ring, an indole ring, an indazole ring, a carbazole ring, an indolocarbazole ring, an indenocarbazole ring, a pyridine ring, a pyrazine ring, a pyridazine ring, a pyrimidine ring, a triazine ring, a quinoline ring, an isoquinoline ring, a cinnoline ring, a phthalazine ring, a quinoxaline ring, a quinazoline ring, a quinazolinone ring, an acridine ring, a phenanthridine ring, a carboline ring, and a purine ring; and rings including two or more different heteroatoms, such as an oxazole ring, an oxadiazole ring, an isoxazole ring, a benzisoxazole ring, a thiazole ring, a benzothiazole ring, an isothiazole ring, and a benzisothiazole ring.

The aromatic ring may have a linked aromatic ring structure in which a plurality of aromatic rings are linked. Examples of the linked aromatic ring structure include biphenyl, terphenyl, quaterphenyl, and quinquephenyl. The heteroaromatic ring may have a linked heteroaromatic ring structure in which a plurality of heteroaromatic rings are linked.

Of these, to precisely control the emission wavelength, to improve the solubility in an organic solvent, and to improve durability of an organic electroluminescent element, it is preferable that an appropriate substituent be introduced onto these rings. Therefore, rings for which many methods of introducing such a substituent are known are preferred. Thus, of the above specific examples, rings in which the ring including the carbon atoms $C^1$ and $C^2$ is a benzene ring or a pyridine ring are preferred, and a benzene ring is particularly preferred. Examples thereof include, in addition to the aromatic rings described above, a dibenzofuran ring, a dibenzothiophene ring, a carbazole ring, an indolocarbazole ring, an indenocarbazole ring, and a carboline ring. Of these, rings in which the ring including the carbon atoms $C^1$ and $C^2$ is a benzene ring are further preferred. Examples thereof include a benzene ring, a naphthalene ring, a fluorene ring, a dibenzofuran ring, a dibenzothiophene ring, and a carbazole ring.

The number of atoms constituting the ring $Cy^1$ is not particularly limited, but to maintain the solvent solubility of the iridium complex compound, the number of atoms constituting the ring is preferably 5 or more, more preferably 6 or more. The number of atoms constituting the ring is preferably 30 or less, more preferably 20 or less.

<Ring $Cy^2$>

The ring $Cy^2$ represents a heteroaromatic ring including the carbon atom $C^3$ and the nitrogen atom $N^1$ coordinating with the iridium atom. The ring $Cy^2$ may be a monocyclic ring or a fused ring in which a plurality of rings are bonded to each other.

Specific examples of the ring $Cy^2$ include monocyclic rings such as a pyridine ring, a pyridazine ring, a pyrimidine ring, a pyrazine ring, a triazine ring, a pyrrole ring, a pyrazole ring, an isoxazole ring, a thiazole ring, an oxazole ring, an oxadiazole ring, a thiazole ring, and a purine ring; bicyclic fused rings such as a quinoline ring, an isoquinoline ring, a cinnoline ring, a phthalazine ring, a quinazoline ring, a quinoxaline ring, a naphthyridine ring, an indole ring, an indazole ring, a benzisoxazole ring, a benzisothiazole ring, a benzimidazole ring, a benzoxazole ring, and a benzothiazole ring; tricyclic fused rings such as an acridine ring, a phenanthroline ring, a carbazole ring, and a carboline ring; and tetra- or higher cyclic fused rings such as a benzophenanthridine ring, a benzacridine ring, and an indolocarboline ring. Furthermore, carbon atoms constituting these rings may be further substituted with nitrogen atoms.

Of these, the ring $Cy^2$ is preferably a monocyclic ring or a tetra- or lower cyclic fused ring, more preferably a monocyclic ring or a tri- or lower cyclic fused ring, most preferably a monocyclic ring or a bicyclic fused ring, because the emission wavelength and the solvent solubility are easily adjusted due to the ease of introduction of a substituent, and because there are many known methods by which a complex with iridium can be synthesized in good yield. Specifically, the ring $Cy^2$ is preferably an imidazole ring, an oxazole ring, a thiazole ring, a benzimidazole ring, a benzoxazole ring, a benzothiazole ring, a pyridine ring, a quinoline ring, an isoquinoline ring, a pyridazine ring, a pyrimidine ring, a pyrazine ring, a triazine ring, a cinnoline ring, a phthalazine ring, a quinazoline ring, a quinoxaline ring, or a naphthyridine ring, more preferably an imidazole ring, an oxazole ring, a quinoline ring, an isoquinoline ring, a quinazoline ring, a naphthyridine ring, a pyridazine ring, a pyrimidine ring, or a pyrazine ring, particularly preferably a benzimidazole ring, a benzoxazole ring, a benzothiazole ring, a pyridine ring, a quinoline ring, an isoquinoline ring, a quinazoline ring, or a naphthyridine ring. Most preferably, it is a pyridine ring, a quinoline ring or an isoquinoline ring, which has high durability and can be easily adjusted to a preferable emission wavelength for a display.

<$R^1$ and $R^2$>

Each of $R^1$ and $R^2$ represents a hydrogen atom or a substituent. In this regard, there are one or more $R^1$ and one or more $R^2$, and at least one of $R^1$ and $R_2$ is a substituent denoted by formula (2) below or a substituent further substituted with a substituent denoted by formula (2) below.

[Chem. 11]

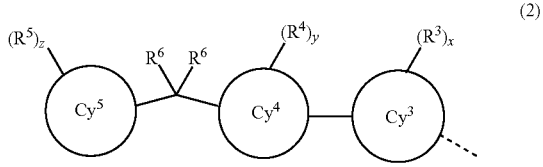

(2)

in the formula (2), a broken line represents a bonding hand, each of a ring $Cy^3$, a ring $cy^4$, and a ring Cy represents an aromatic ring or a heteroaromatic ring, each of $R^3$ to $R^6$ represents a hydrogen atom or a substituent, each of x, y, and z represents an integer of 0 or more, an upper limit of which is the maximum number of possible substituents on the ring $Cy^3$, the ring $cy^4$, and the ring $Cy^1$, respectively, and two $R^6$ and a plurality of $R^3$ to a plurality of R' when there are a plurality of $R^3$ to a plurality of $R^5$ are independent of each other and may be the same or may differ from each other.

$R^1$ and $R^2$ are independent of each other and may be the same or may differ from each other. $R^1$ and $R_2$ may further bond to form an aliphatic, aromatic, or heteroaromatic monocyclic or fused ring.

Preferably, each of $R^3$ to $R^6$ is a hydrogen atom.

When each of $R^1$ and $R^2$ is a substituent other than the substituent denoted by formula (2) and when each of $R^3$ to $R^6$ is a substituent, there is no particular limitation regarding the structure of the substituent, and a most suitable group can be selected in consideration of precise control of the predetermined emission wavelength, compatibility with a solvent used, compatibility with a host compound when serving as the electroluminescent element, and the like. However, if a substituent having an excessively flexible structure is introduced, there is a possibility of the heat resistance of the invention product being impaired. Consequently, a preferable substituent other than a hydrogen atom is independently within a substituent range selected from a substituent group W described below.

[Substituent Group W]

Regarding the substituent group W, any one of D, F, Cl, Br, I, —N(R')$_2$, —CN, —NO$_2$, —OH, —COOR', —C(=O) R', —C(=O)NR', —P(=O)(R')$_2$, —S(=O)R', —S(=O)$_2$ R', —OS(=O)$_2$R', a linear, branched, or cyclic alkyl group having 1 to 30 carbon atoms, a linear, branched, or cyclic alkoxy group having 1 to 30 carbon atoms, a linear, branched, or cyclic alkylthio group having 1 to 30 carbon atoms, a linear, branched, or cyclic alkenyl group having 2 to 30 carbon atoms, a linear, branched, or cyclic alkynyl group having 2 to 30 carbon atoms, an aromatic group having 5 to 60 carbon atoms, a heteroaromatic group having 5 to 60 carbon atoms, an aryloxy group having 5 to 40 carbon atoms, an arylthio group having 5 to 40 carbon atoms, an aralkyl group having 5 to 60 carbon atoms, a heteroaralkyl group having 5 to 60 carbon atoms, a diarylamino group having 10 to 40 carbon atoms, an arylheteroarylamino group having 10 to 40 carbon atoms, and a diheteroarylamino group having 10 to 40 carbon atoms can be used.

The alkyl group, the alkoxy group, the alkylthio group, the alkenyl group, the alkynyl group, the aralkyl group, and the heteroaralkyl group may be further substituted with one or more R'. One —CH$_2$— group or two or more non-adjacent —CH$_2$— groups in these groups may be substituted with —C(—R')=C(—R')—, —C≡C—, —Si(—R')$_2$, —C(=O)—, —NR'—, —O—, —S—, —CONR'—, or a divalent aromatic group. One or more hydrogen atoms in these groups may be substituted with D, F, Cl, Br, I, or —CN.

Each of the aromatic group, the heteroaromatic group, the aryloxy group, the arylthio group, the diarylamino group, the arylheteroarylamino group, and the diheteroarylamino group may be further substituted with one or more R'.

Of the substituent group W, preferable substituents are D, F, —CN, —COOR', —C(=O)R', —C(=O)NR', a linear, branched, or cyclic alkyl group having 1 to 30 carbon atoms, a linear, branched, or cyclic alkoxy group having 1 to 30 carbon atoms, a linear, branched, or cyclic alkylthio group having 1 to 30 carbon atoms, an aromatic group having 5 to 60 carbon atoms, a heteroaromatic group having 5 to 60 carbon atoms, an aryloxy group having 5 to 40 carbon atoms, an arylthio group having 5 to 40 carbon atoms, an aralkyl group having 5 to 60 carbon atoms, a heteroaralkyl group having 5 to 60 carbon atoms, a diarylamino group having 10 to 40 carbon atoms, an arylheteroarylamino group having 10 to 40 carbon atoms, and a diheteroarylamino group having 10 to 40 carbon atoms.

Of the substituent group W, further preferable substituents are D, F, —CN, a linear, branched, or cyclic alkyl group having 1 to 30 carbon atoms, an aromatic group having 5 to 60 carbon atoms, a heteroaromatic group having 5 to 60 carbon atoms, an aralkyl group having 5 to 60 carbon atoms, and a heteroaralkyl group having 5 to 60 carbon atoms.

<R'>

Each R' is selected from H, D, F, Cl, Br, I, —N(R")$_2$, —CN, —NO$_2$, —Si(R")$_3$, —B(OR")$_2$, —C(=O)R", —P(=O)(R")$_2$, —S(=O)$_2$R", —OSO$_2$R", a linear, branched, or cyclic alkyl group having 1 to 30 carbon atoms, a linear, branched, or cyclic alkoxy group having 1 to 30 carbon atoms, a linear, branched, or cyclic alkylthio group having 1 to 30 carbon atoms, a linear, branched, or cyclic alkenyl group having 2 to 30 carbon atoms, a linear, branched, or cyclic alkynyl group having 2 to 30 carbon atoms, an aromatic group having 5 to 60 carbon atoms, a heteroaromatic group having 5 to 60 carbon atoms, an aryloxy group having 5 to 40 carbon atoms, an arylthio group having 5 to 40 carbon atoms, an aralkyl group having 5 to 60 carbon atoms, a heteroaralkyl group having 5 to 60 carbon atoms, a diarylamino group having 10 to 40 carbon atoms, an arylheteroarylamino group having 10 to 40 carbon atoms, and a diheteroarylamino group having 10 to 40 carbon atoms.

The alkyl group, the alkoxy group, the alkylthio group, the alkenyl group, the alkynyl group, the aralkyl group, and the heteroaralkyl group may be further substituted with one or more R". One —CH$_2$— group or two or more non-adjacent —CH$_2$— groups in these groups may be substituted with —C(—R")=C(—R")—, —C≡C—, —Si(—R")$_2$—, —C(=O)—, —NR"—, —O—, —S—, —CONR"—, or a divalent aromatic group. One or more hydrogen atoms in these groups may be substituted with D, F, Cl, Br, I, or —CN.

The aromatic group, the heteroaromatic group, the aryloxy group, the arylthio group, the diarylamino group, the arylheteroarylamino group, and the diheteroarylamino group may be further substituted with one or more R". R" will be described later.

Two or more adjacent R' may be bonded to each other to form an aliphatic, aromatic, or heteroaromatic, monocyclic or fused ring.

The preferable structure of R' above is D, F, —CN, —C(=O)R", a linear, branched, or cyclic alkyl group having 1 to 30 carbon atoms, a linear, branched, or cyclic alkoxy group having 1 to 30 carbon atoms, a linear, branched, or cyclic alkylthio group having 1 to 30 carbon atoms, an aromatic group having 5 to 60 carbon atoms, a heteroaromatic group having 5 to 60 carbon atoms, an aryloxy group having 5 to 40 carbon atoms, an arylthio group having 5 to 40 carbon atoms, an aralkyl group having 5 to 60 carbon atoms, a heteroaralkyl group having 5 to 60 carbon atoms, a diarylamino group having 10 to 40 carbon atoms, an arylheteroarylamino group having 10 to 40 carbon atoms, or a diheteroarylamino group having 10 to 40 carbon atoms.

The further preferable structure of R' is D, F, —CN, a linear, branched, or cyclic alkyl group having 1 to 30 carbon atoms, an aromatic group having 5 to 60 carbon atoms, a heteroaromatic group having 5 to 60 carbon atoms, an aralkyl group having 5 to 60 carbon atoms, or a heteroaralkyl group having 5 to 60 carbon atoms.

<R">

Each R" is selected from H, D, F, —CN, an aliphatic hydrocarbon group having 1 to 20 carbon atoms, an aromatic group having 1 to 20 carbon atoms, and a heteroaromatic group having 1 to 20 carbon atoms.

Two or more adjacent R" may be bonded to each other to form an aliphatic, aromatic, or heteroaromatic, monocyclic or fused ring.

The preferable structures of R" is H, D, F, —CN, an aliphatic hydrocarbon group having 1 to 20 carbon atoms.

A linear, branched, or cyclic alkyl group having 1 to 30 carbon atoms, a linear, branched, or cyclic alkoxy group having 1 to 30 carbon atoms, a linear, branched, or cyclic alkylthio group having 1 to 30 carbon atoms, a linear, branched, or cyclic alkenyl group having 2 to 30 carbon atoms, a linear, branched, or cyclic alkynyl group having 2 to 30 carbon atoms, an aromatic group having 5 to 60 carbon atoms, a heteroaromatic group having 5 to 60 carbon atoms, an aryloxy group having 5 to 40 carbon atoms, an arylthio group having 5 to 40 carbon atoms, an aralkyl group having 5 to 60 carbon atoms, a heteroaralkyl group having 5 to 60 carbon atoms, a diarylamino group having 10 to 40 carbon atoms, an arylheteroarylamino group having 10 to 40 carbon atoms, and a diheteroarylamino group having 10 to 40 carbon atoms listed as the substituent group W, R', or R" will be described below.

Examples of the linear, branched, or cyclic alkyl group having 1 to 30 carbon atoms include a methyl group, an ethyl group, an n-propyl group, an isopropyl group, an n-butyl group, an n-pentyl group, an n-hexyl group, an n-octyl group, a 2-ethylhexyl group, an isopropyl group, an isobutyl group, a cyclopentyl group, a cyclohexyl group, an n-octyl group, a norbornyl group, and an adamantyl group. To avoid the durability and the heat resistance from being impaired, the number of carbon atoms is preferably 1 or more, and preferably 30 or less, more preferably 20 or less, and most preferably 12 or less.

Examples of the linear, branched, or cyclic alkoxy group having 1 to 30 carbon atoms include a methoxy group, an ethoxy group, an n-propyloxy group, an n-butoxy group, an n-hexyloxy group, an isopropyloxy group, a cyclohexyloxy group, a 2-ethoxyethoxy group, and a 2-ethoxyethoxyethoxy group. To avoid the durability and the heat resistance from being impaired, the number of carbon atoms is preferably 1 or more, and preferably 30 or less, more preferably 20 or less, most preferably 12 or less.

Examples of the linear, branched, or cyclic alkylthio group having 1 to 30 carbon atoms include a methylthio group, an ethylthio group, an n-propylthio group, an n-butylthio group, an n-hexylthio group, an isopropylthio group, a cyclohexylthio group, a 2-methylbutylthio group, and an n-hexylthio group. To avoid the durability and the heat resistance from being impaired, the number of carbon atoms is preferably 1 or more, and preferably 30 or less, more preferably 20 or less, most preferably 12 or less.

Examples of the linear, branched, or cyclic alkenyl group having 2 to 30 carbon atoms include a vinyl group, an allyl group, a propenyl group, a heptenyl group, a cyclopentenyl group, a cyclohexenyl group, and a cyclooctenyl group. To avoid the durability and the heat resistance from being impaired, the number of carbon atoms is preferably 2 or more, and preferably 30 or less, more preferably 20 or less, most preferably 12 or less.

Examples of the linear, branched, or cyclic alkynyl group having 2 to 30 carbon atoms include an ethynyl group, a propionyl group, a butynyl group, a pentynyl group, a hexynyl group, a heptynyl group, and an octynyl group. To avoid the durability and the heat resistance from being impaired, the number of carbon atoms is preferably 2 or more, and preferably 30 or less, more preferably 20 or less, most preferably 12 or less.

The aromatic group having 5 to 60 carbon atoms and the heteroaromatic group having 5 to 60 carbon atoms may be present in the form of a single ring or a fused ring, or may be a group formed through bonding or condensation between one ring and another type of aromatic group or heteroaromatic group.

Examples of such groups include a phenyl group, a naphthyl group, an anthracenyl group, a benzanthracenyl group, a phenanthrenyl group, a benzophenanthrenyl group, a triphenylene group, a pyrenyl group, a chrysenyl group, a fluoranthenyl group, a perylenyl group, a benzopyrenyl group, a benzofluoranthenyl group, a naphthacenyl group, a pentacenyl group, a biphenyl group, a terphenyl group, a quaterphenyl group, a quinquephenyl group, a fluorenyl group, a spirobifluorenyl group, a dihydrophenanthrenyl group, a dihydropyrenyl group, a tetrahydropyrenyl group, an indenofluorenyl group, a furyl group, a benzofuryl group, an isobenzofuryl group, a dibenzofuranyl group, a thiophene group, a benzothiophenyl group, a dibenzothiophenyl group, a pyrrolyl group, an indolyl group, an isoindolyl group, a carbazolyl group, a benzocarbazolyl group, an indolocarbazolyl group, an indenocarbazolyl group, a pyridyl group, a quinoline group, a cinnolyl group, an isocinnolyl group, an acridyl group, a phenanthridyl group, a phenothiazinyl group, a phenoxazyl group, a pyrazolyl group, an indazolyl group, an imidazolyl group, a benzimidazolyl group, a naphthoimidazolyl group, a phenanthroimidazolyl group, a pyridinimidazolyl group, an oxazolyl group, a benzoxazolyl group, a naphthoxazolyl group, a thiazolyl group, a benzothiazolyl group, a pyrimidyl group, a benzopyrimidyl group, a pyridazinyl group, a quinoxalinyl group, a diazaanthracenyl group, a diazapyrenyl group, a pyrazinyl group, a phenoxazinyl group, a phenothiazinyl group, a naphthyridinyl group, an azacarbazolyl group, a benzocarbolinyl group, a phenanthrolinyl group, a triazolyl group, a benzotriazolyl group, an oxadiazolyl group, a thiadiazolyl group, a triazinyl group, a 2,6-diphenyl-1,3,5-triazin-4-yl group, a tetrazolyl group, a purinyl group, and a benzothiadiazolyl group.

From the viewpoint of the balance between solubility, durability and heat resistance, the number of carbon atoms in these groups is preferably 5 or more, and preferably 50 or less, more preferably 40 or less, most preferably 30 or less.

Therefore, the aromatic group having 5 to 60 carbon atoms and the heteroaromatic group having 5 to 60 carbon atoms are more preferably a phenyl group, a naphthyl group, a phenanthrenyl group, a benzophenanthrenyl group, a triphenylene group, a biphenyl group, a terphenyl group, a quaterphenyl group, a quinquephenyl group, a fluorenyl group, a spirobifluorenyl group, an indenofluorenyl group, a dibenzofuranyl group, a dibenzothiophenyl group, a carbazolyl group, a benzocarbazolyl group, an indolocarbazolyl group, an indenocarbazolyl group, a pyridyl group, a cinnolyl group, an isocinnolyl group, an acridyl group, a phenanthridyl group, a benzimidazolyl group, a naphthoimidazolyl group, a pyridinimidazolyl group, an oxazolyl group, a benzoxazolyl group, a pyrimidyl group, a benzopyrimidyl group, an azacarbazolyl group, a benzocarbolinyl group, and a 2,6-diphenyl-1,3,5-triazin-4-yl group. A phenyl group, a phenanthrenyl group, a benzophenanthrenyl group, a triphenylene group, a biphenyl group, a terphenyl group, a quaterphenyl group, a quinquephenyl group, a fluorenyl group, a spirobifluorenyl group, an indenofluorenyl group, a dibenzofuranyl group, a dibenzothiophenyl group, a carbazolyl group, a benzocarbazolyl group, an indolocarbazolyl group, an indenocarbazolyl group, and a pyridyl group are more preferred.

Examples of the aryloxy group having 5 to 40 carbon atoms include a phenoxy group, a methylphenoxy group, a naphthoxy group, and a methoxyphenoxy group. From the viewpoint of the balance between solubility, durability and heat resistance, the number of carbon atoms in these groups is preferably 5 or more, and preferably 30 or less, more preferably 25 or less, most preferably 20 or less.

Examples of the arylthio group having 5 to 40 carbon atoms include a phenylthio group, a methylphenylthio group, a naphthylthio group, and a methoxyphenylthio group. From the viewpoint of the balance between solubility, durability and heat resistance, the number of carbon atoms in these groups is preferably 5 or more, and preferably 30 or less, more preferably 25 or less, most preferably 20 or less.

Examples of the aralkyl group having 5 to 60 carbon atoms include a 1,1-dimethyl-1-phenylmethyl group, a 1,1-di(n-butyl)-1-phenylmethyl group, a 1,1-di(n-hexyl)-1-phenylmethyl group, a 1,1-di(n-octyl)-1-phenylmethyl group, a phenylmethyl group, a phenylethyl group, a 3-phenyl-1-propyl group, a 4-phenyl-1-n-butyl group, a 1-methyl-1-phenylethyl group, a 5-phenyl-1-n-propyl group, a 6-phenyl-1-n-hexyl group, a 6-naphthyl-1-n-hexyl group, a 7-phenyl-1-n-heptyl group, an 8-phenyl-1-n-octyl group, and a 4-phenylcyclohexyl group. From the viewpoint of the balance between solubility, durability and heat resistance, the number of carbon atoms in these groups is preferably 5 or more and more preferably 40 or less.

Examples of the heteroaralkyl group having 5 to 60 carbon atoms include a 1,1-dimethyl-1-(2-pyridyl)methyl group, a 1,1-di(n-hexyl)-1-(2-pyridyl)methyl group, a (2-pyridyl)methyl group, a (2-pyridyl)ethyl group, a 3-(2-pyridyl)-1-propyl group, a 4-(2-pyridyl)-1-n-butyl group, a 1-methyl-1-(2-pyridyl)ethyl group, a 5-(2-pyridyl)-1-n-propyl group, a 6-(2-pyridyl)-1-n-hexyl group, a 6-(2-pyrimidyl)-1-n-hexyl group, a 6-(2,6-diphenyl-1,3,5-triazin-4-yl)-1-n-hexyl group, a 7-(2-pyridyl)-1-n-heptyl group, an 8-(2-pyridyl)-1-n-octyl group, and a 4-(2-pyridyl)cyclohexyl group. From the viewpoint of the balance between solubility, durability and heat resistance, the number of carbon atoms in these heteroaralkyl groups is preferably 5 or more, and preferably 50 or less, more preferably 40 or less, most preferably 30 or less.

Examples of the diarylamino group having 10 to 40 carbon atoms include a diphenylamino group, a phenyl (naphthyl)amino group, a di(biphenyl)amino group, and a di(p-terphenyl)amino group. From the viewpoint of the balance between solubility, durability and heat resistance, the number of carbon atoms in these groups is preferably 10 or more, and preferably 36 or less, more preferably 30 or less, most preferably 25 or less.

Examples of the arylheteroarylamino group having 10 to 40 carbon atoms include a phenyl(2-pyridyl)amino group and a phenyl(2,6-diphenyl-1,3,5-triazin-4-yl)amino group. From the viewpoint of the balance between solubility, durability and heat resistance, the number of carbon atoms in these groups is preferably 10 or more, and preferably 36 or less, more preferably 30 or less, most preferably 25 or less.

Examples of the diheteroarylamino group having 10 to 40 carbon atoms include a di(2-pyridyl)amino group and a di(2,6-diphenyl-1,3,5-triazin-4-yl)amino group. From the viewpoint of the balance between solubility, durability and heat resistance, the number of carbon atoms in these diheteroarylamino groups is preferably 10 or more, and preferably 36 or less, more preferably 30 or less, most preferably 25 or less.

In particular, from the viewpoint of avoiding the durability of a light-emitting material in an organic electroluminescent element from being impaired, each of $R^1$ and $R^2$ is preferably a hydrogen atom, F, —CN, a linear, branched, or cyclic alkyl group having 1 to 30 carbon atoms, an aromatic group having 5 to 60 carbon atoms, or a heteroaromatic group having 5 to 60 carbon atoms and is particularly preferably a hydrogen atom, an aromatic group having 5 to 60 carbon atoms, or a heteroaromatic group having 5 to 60 carbon atoms.

When at least one of $R^1$ and $R_2$ is a group further substituted with a substituent denoted by formula (2) above, the group is preferably a linear, branched, or cyclic alkyl group having 1 to 30 carbon atoms, an aromatic group having 5 to 60 carbon atoms, or a heteroaromatic group having 5 to 60 carbon atoms further substituted with the substituent denoted by formula (2) and is particularly preferably an aromatic group having 5 to 60 carbon atoms or a heteroaromatic group having 5 to 60 carbon atoms further substituted with the substituent denoted by formula (2).

<Substituent Denoted by Formula (2)>

The aromatic rings and the heteroaromatic rings in the ring $Cy^3$, the ring $cy^4$, or the ring $Cy^5$ in formula (2) are akin to the aromatic rings and the heteroaromatic rings in the ring $Cy^1$ or the ring $Cy^2$, and such a type that does not readily undergo decomposition under the condition in which electrical oxidation and reduction are repeated in the organic EL element is preferred. A preferable type of the ring $Cy^3$, the ring $cy^4$, and the ring $Cy^5$ from the viewpoint of the durability is preferably composed of a monocyclic ring rather than a fused ring and further preferably composed of a benzene ring, a pyridine ring, a pyrimidine ring, or a triazine ring or a structure in which theses are linked. A benzene ring or a structure in which benzene rings are linked are particularly preferred. The substituents denoted by formula (2) having such a structure are preferably substituents denoted by formula (3) below and substituents denoted by formula (4) below.

When the iridium complex compound according to the present invention having the structure denoted by formula (3) below in which all the ring $Cy^3$, the ring $cy^4$, and the ring Cy$^5$ in the substituent denoted by formula (2) are a benzene ring is used as a light-emitting material of an organic EL element, it is expected that the element operating lifetime is considerably increased due to high electrochemical durability.

The structure denoted by formula (4) below can minimize the influence of a local flection portion of a ligand or rotational motion of a benzene ring in the iridium complex compound according to the present invention and, therefore, enables the heat resistance of not only just the complex but also the organic EL element including the complex to be maximized.

[Chem. 12]

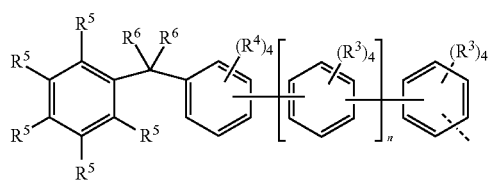

(3)

In formula (3), each of R$^3$ to R$^6$ is synonymous with that in formula (2) above, and n represents an integer of 0 to 10.

In formula (3), larger n is preferred from the viewpoint of solubility. On the other hand, smaller n is preferred from the viewpoint of heat resistance. Even in the instance of large n, a cumyl group or the like being disposed enables the heat resistance to be improved without impairing the glass transition temperature.

[Chem. 13]

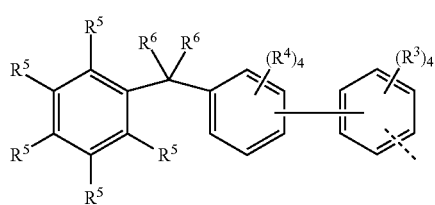

(4)

In formula (4), each of R$^3$ to R' is synonymous with that in formula (2) above.

From the viewpoint of avoiding the solubility from being excessively impaired, preferably, it does not occur that each of R$^4$ and R' loses a hydrogen radical and the residual radicals are bonded to each other to form a ring.

Regarding the solvent solubility of the iridium complex compound according to the present invention, the terminal-side structure of the substituent denoted by formula (2) above has a high effect. To more effectively obtain this effect, the substituent denoted by formula (2) is preferably a substituent denoted by formula (2A) below in which the terminal side is a p-cumylphenyl group.

[Chem. 14]

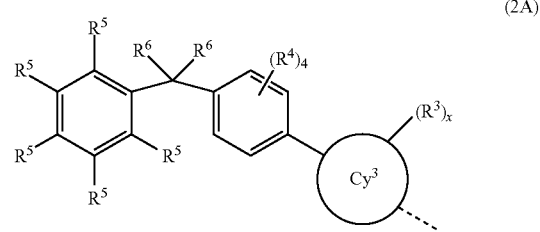

(2A)

In formula (2A), each of the ring Cy$^3$, R$^3$, R$^4$, R$^5$, R$^6$, and x is synonymous with that in formula (2) above.

The substituent denoted by formula (2A) is further preferably a substituent denoted by formula (3A) below or formula (4A) below in which the ring Cy$^3$ is a structure composed of a plurality of benzene rings linked to each other or a benzene ring.

[Chem. 15]

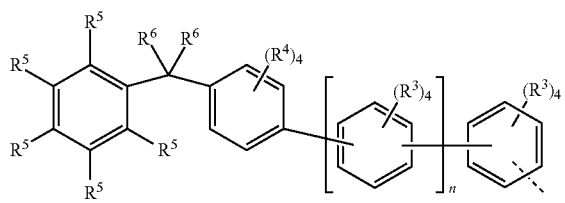

(3A)

In formula (3A), each of R$^3$ to R$^6$ is synonymous with that in formula (2) above, and n represents an integer of 0 to 10.

[Chem. 16]

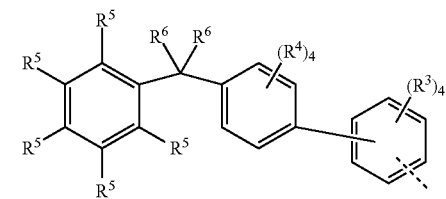

(4A)

In formula (4A), each of R$^3$ to R$^6$ is synonymous with that in formula (2) above.

In addition, since the solubility can be improved and an influence on the emission wavelength can be suppressed without expanding the conjugation, it is preferable that the Cy$^3$ in formula (2) have a partial structure denoted by formula (5) below.

[Chem. 17]

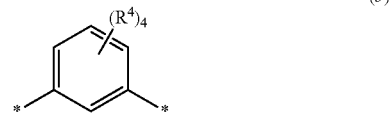

(5)

In formula (5), $R^4$ is synonymous with that in formula (2), and "*" represents a bonding position.

The number of the partial structures denoted by formula (5) that is the partial structure included in the $Cy^3$ in formula (2) is preferably 1 or more, further preferably 2 or more, and still more preferably 3 or more and preferably 6 or less, further preferably 5 or less, and still more preferably 4 or less.

Regarding the iridium complex compound according to the present invention, at least one of $R^1$ and $R_2$ needs to be a substituent denoted by formula (2) or a substituent further substituted with a substituent denoted by formula (2) from the viewpoint of the solubility and the heat resistance. The substituent denoted by formula (2) being present partly shields the iridium complex compound. Consequently, when the iridium complex compound is made to be present in the light-emitting layer of an organic EL element, even if the concentration is increased, concentration quenching can be suppressed from occurring. As a result, the operating lifetime can be increased while high light emission efficiency of the element is maintained.

There is no particular limitation regarding the number and the position of the substituents denoted by formula (2) introduced relative to the ring $Cy^1$ or the ring $Cy^2$ or relative to $R^1$ or $R^2$ that is a substituent therefor. However, if the number of the substituents introduced is excessively small, there is a concern that the solubility of the iridium complex compound may deteriorate, while the effect of shielding the iridium center metal by the substituent denoted by formula (2) is not obtained at all and concentration quenching and the like readily occur due to heavy doping. In contrast, if the number of the substituents introduced is excessively large, the surroundings of the iridium center metal are highly shielded, and during use as the light-emitting material of the organic EL element, there is a possibility of causing hindrance to transfer of electric charge or energy in the light-emitting layer. Therefore, the number of the substituents denoted by formula (2) introduced relative to a ligand is usually 6 or less, preferably 4 or less, more preferably 2 or less, and most preferably 1. In this regard, the position at which the substituent denoted by formula (2) is introduced is preferably a substitution position that may maximize the distance between the position of the iridium metal center and the ring $Cy^5$. Consequently, it is conjectured that the shielding effect of the ring Cy insulated by benzyl carbon is realized to the greatest extent and that contribution to the solubility can be maximized. Simultaneously with this, highly mobile benzyl carbon and the ring Cy portion being located away from the iridium center metal vicinity of the iridium complex compound enables the heat resistance to be more improved by localizing the intramolecular movement caused by heating to the benzyl carbon and the ring Cy portion and maintaining the stiffness of the complex center.

Further, when the iridium complex compound exhibits green emission, there is a possibility of the color of the emitted light being considerably changed by introduction of the substituent denoted by formula (2) above. Therefore, the position of substitution is preferably on the ring $Cy^1$ or on $R^1$ that is a substituent thereof.

SPECIFIC EXAMPLES

Specific examples of preferable iridium complex compound according to the present invention will be described below. The present invention is not limited to these.

[Chem. 18]

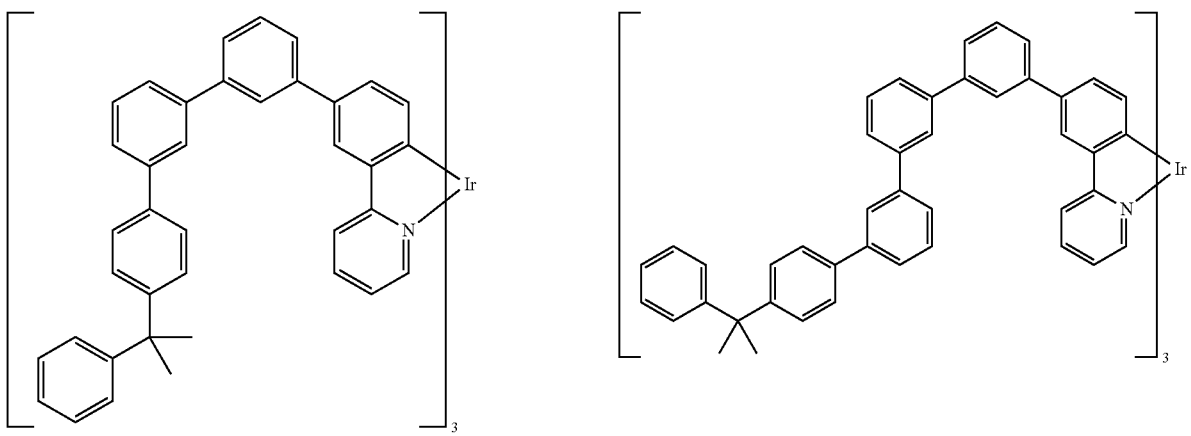

-continued
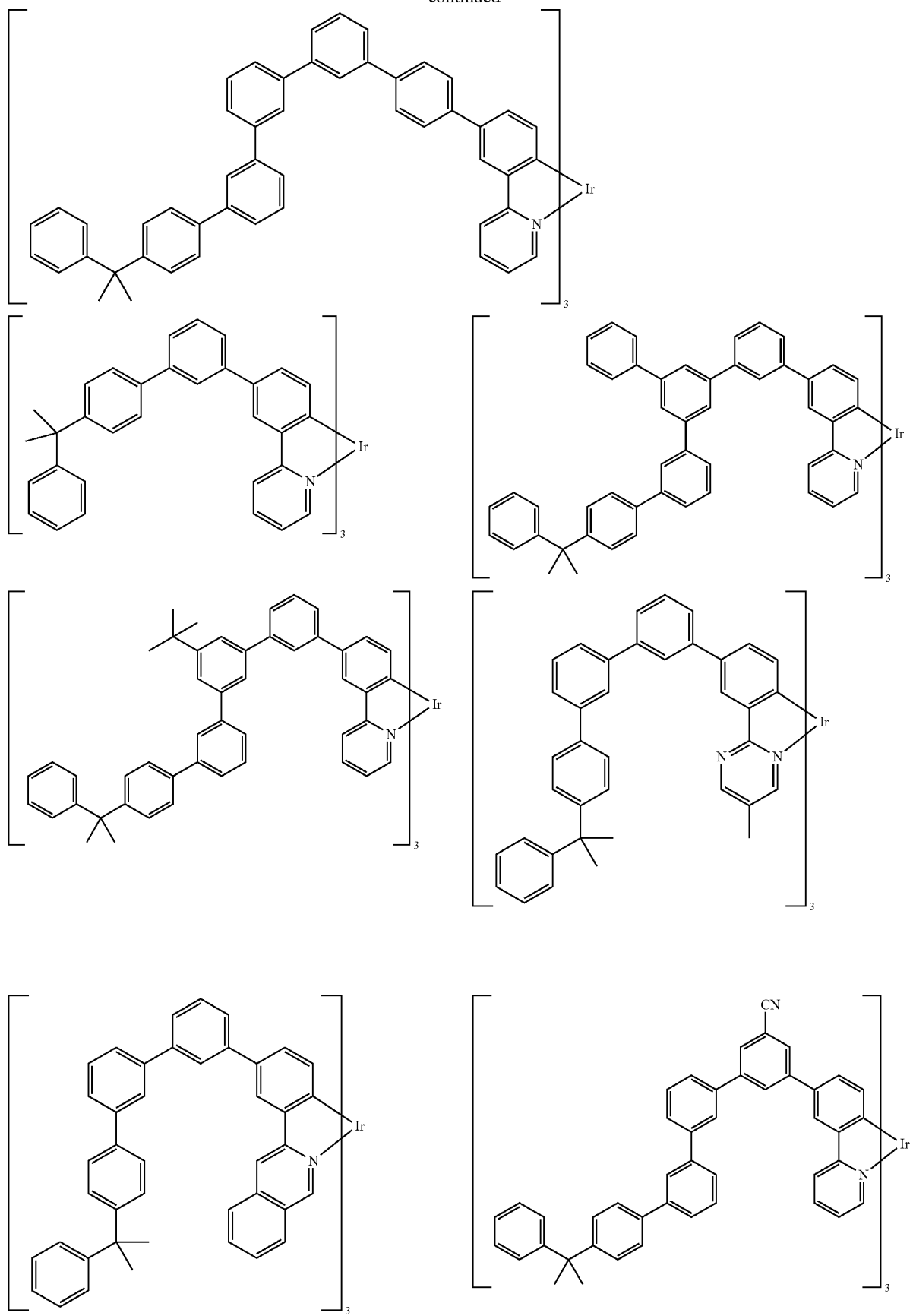

23
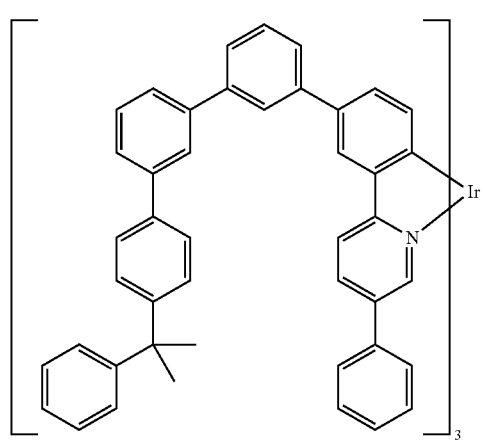
24
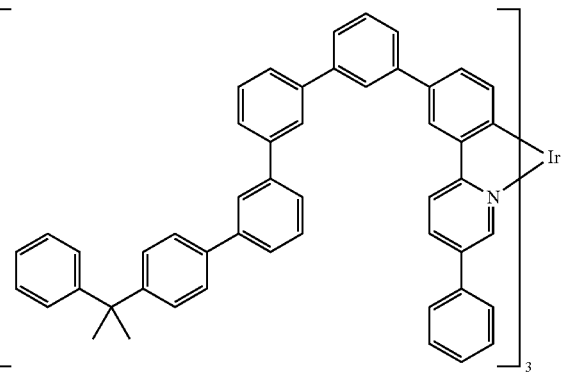
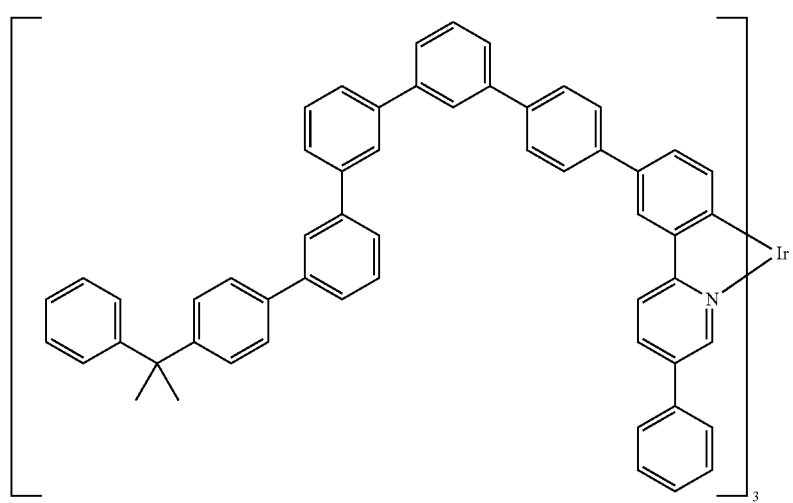
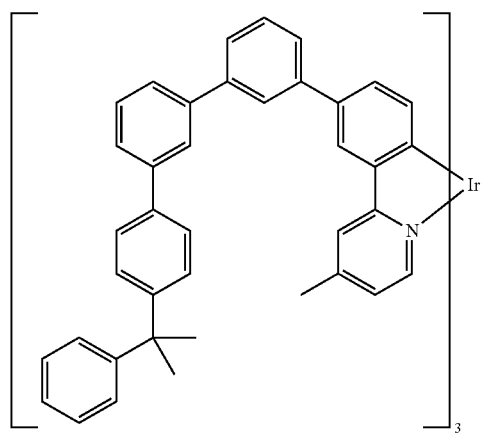

-continued
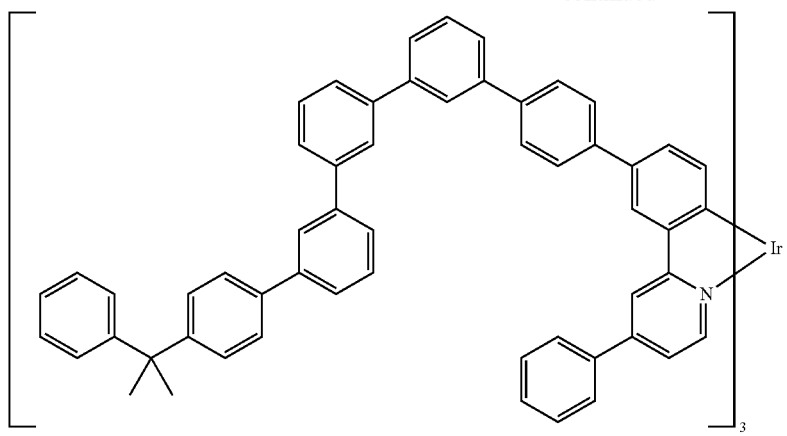
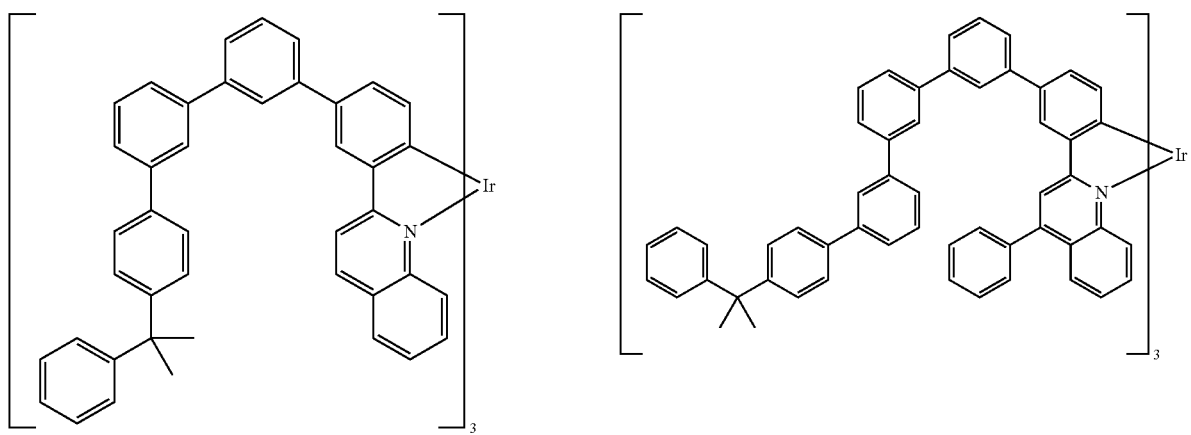
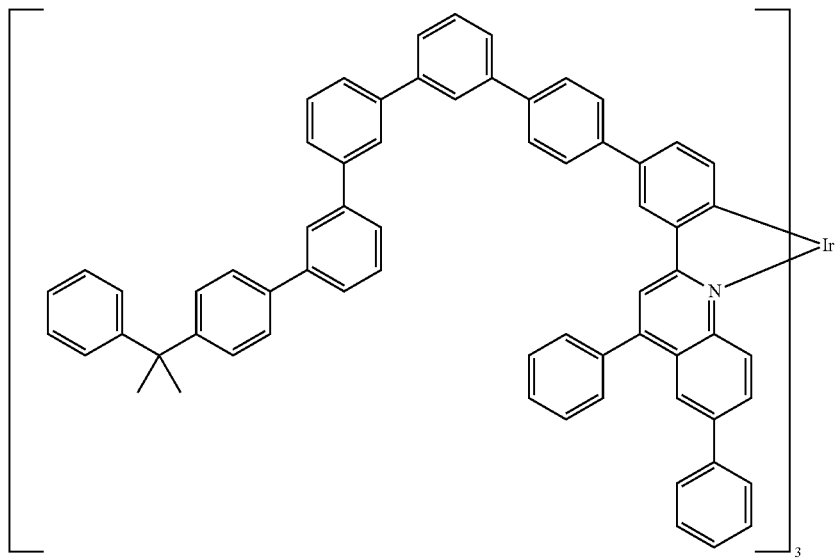

[Chem. 19]
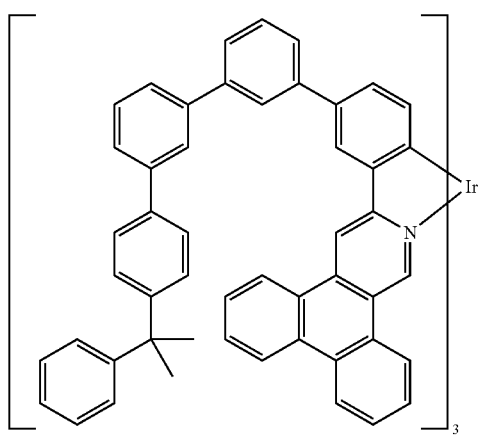
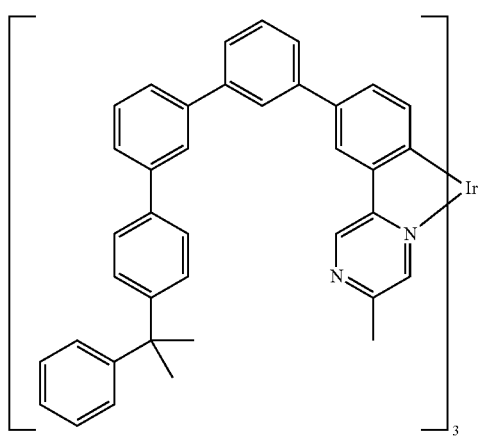
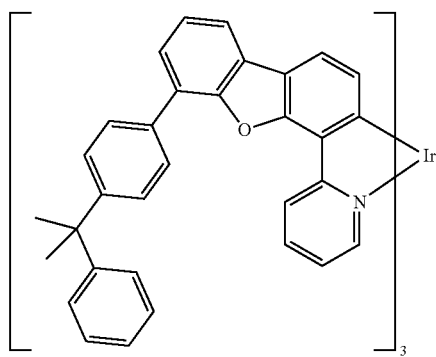
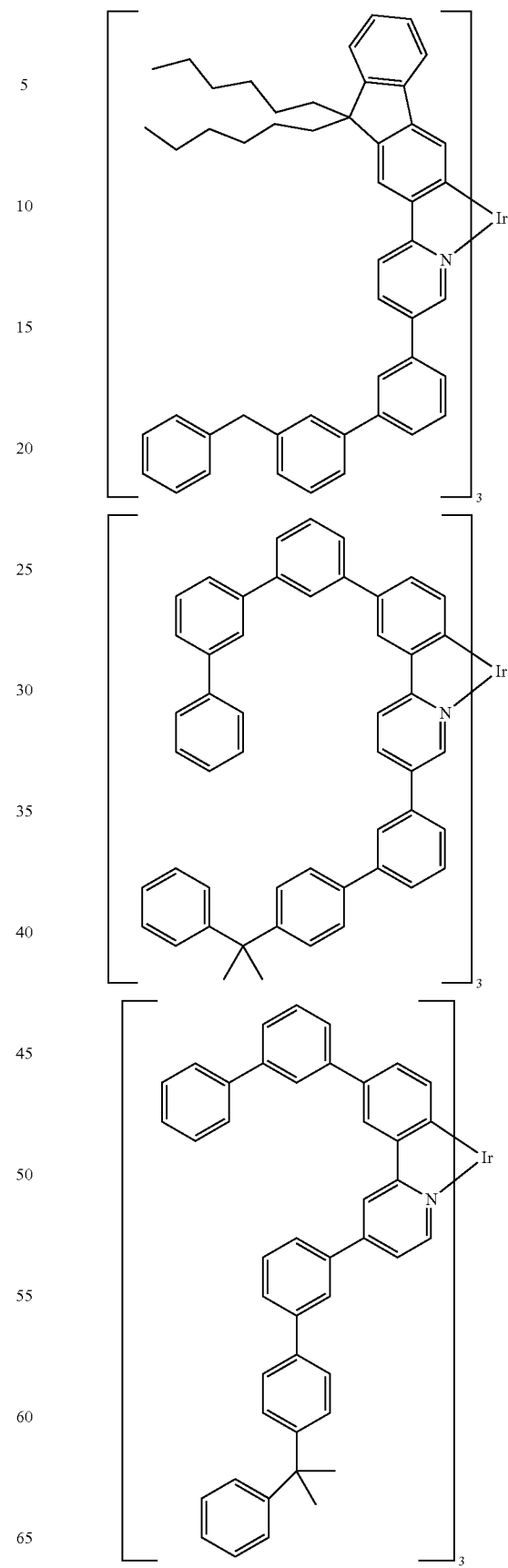

-continued
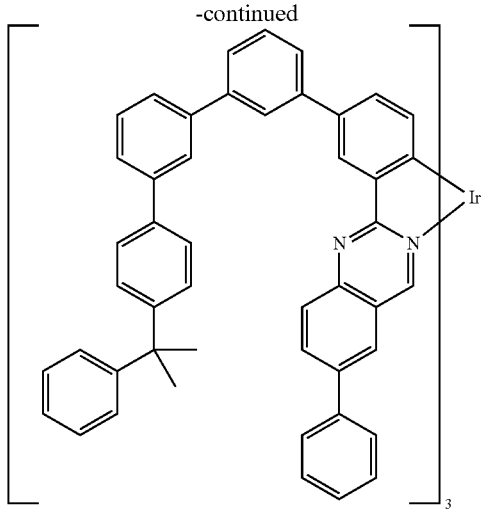
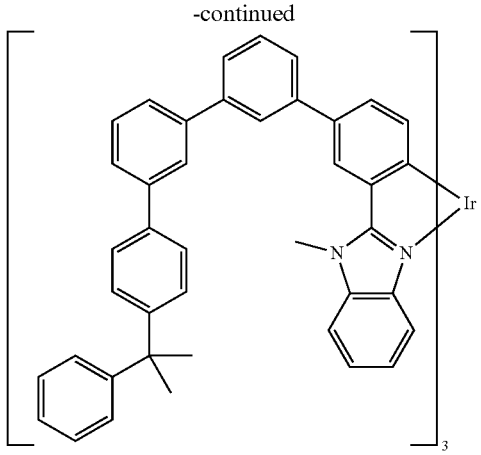
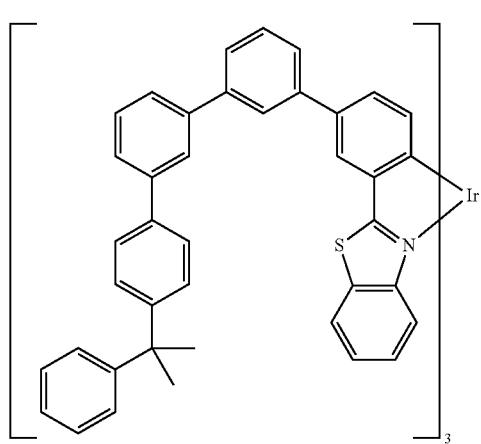
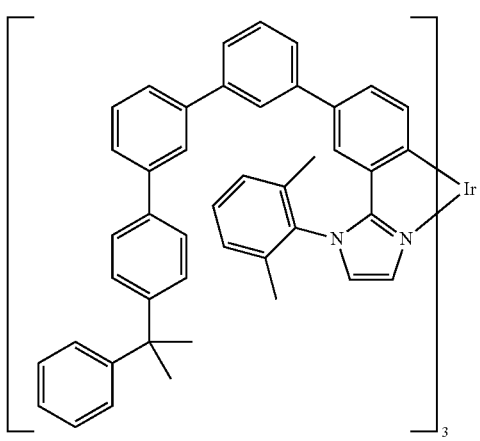
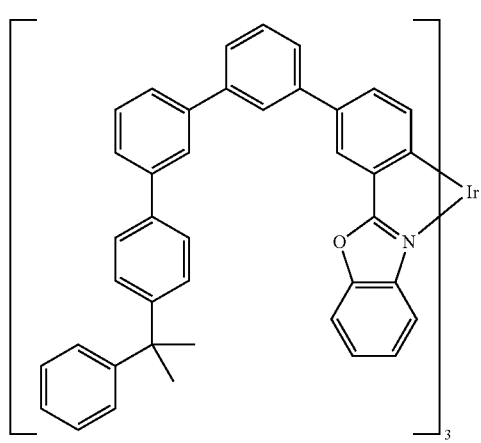
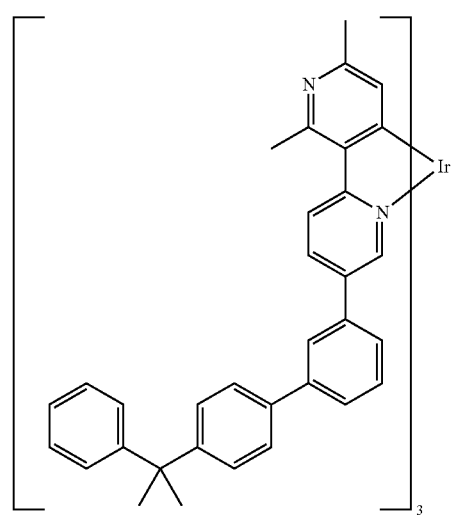

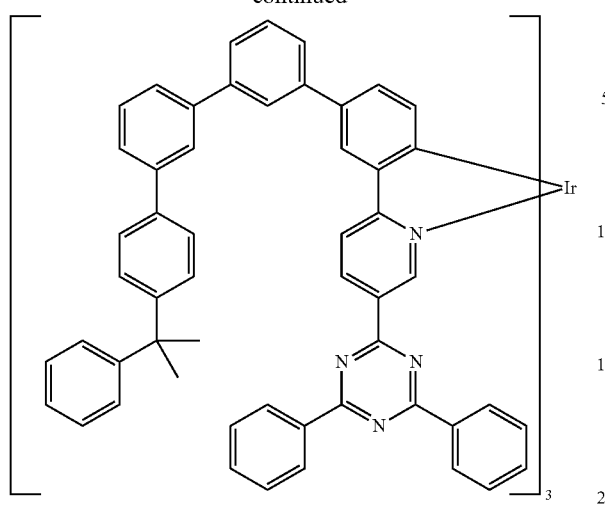
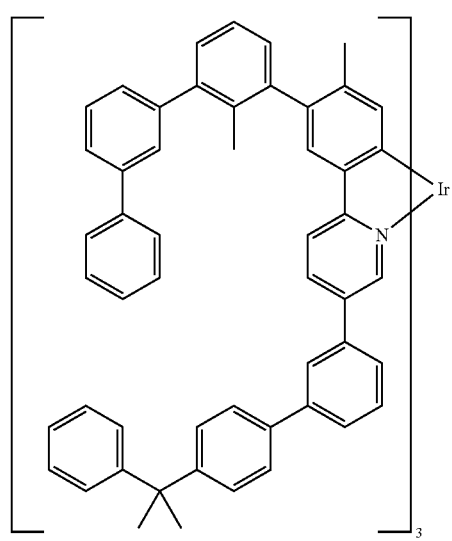
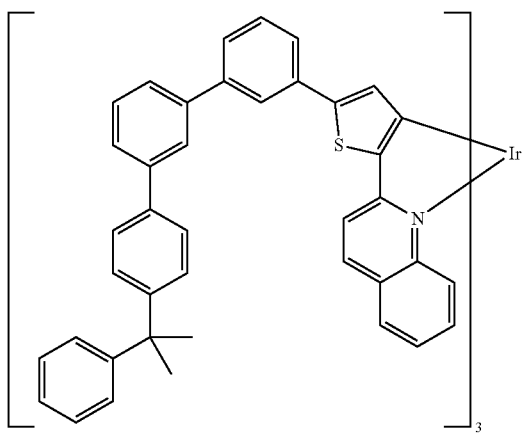
[Chem. 20]
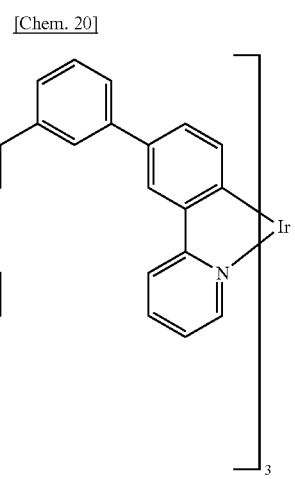
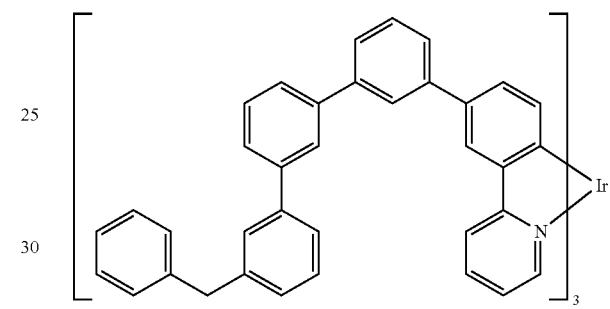
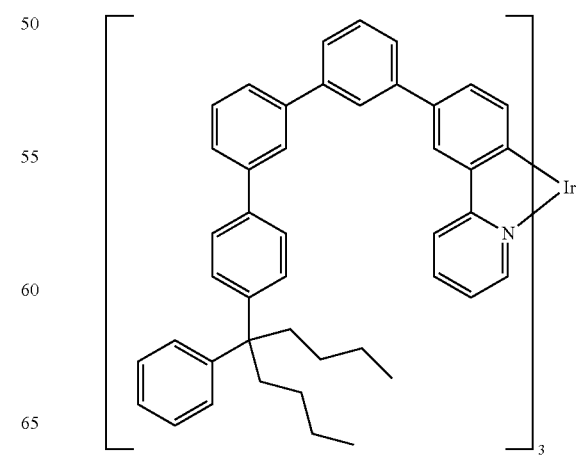

33
-continued
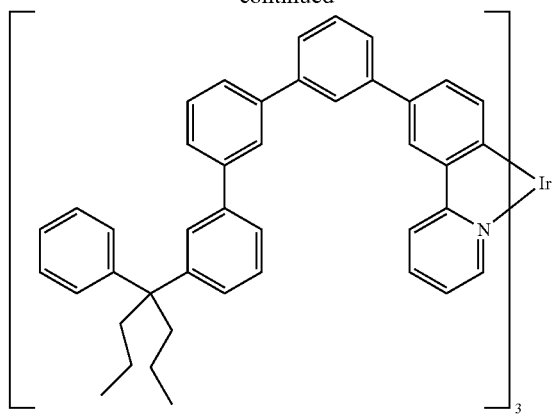
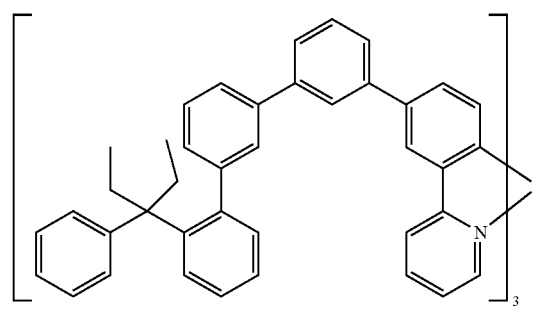
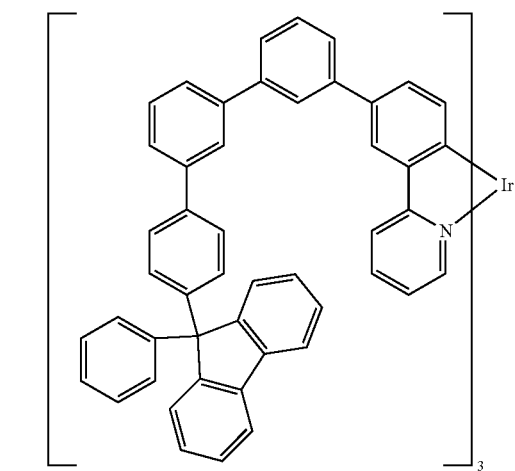
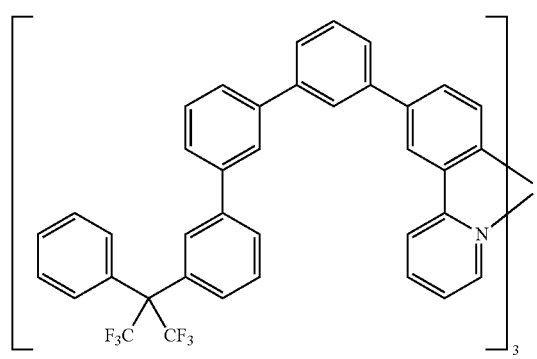
34
-continued
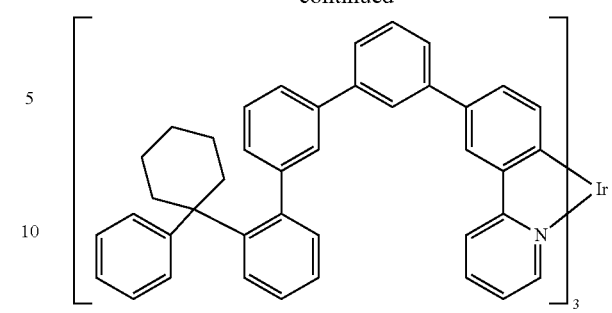
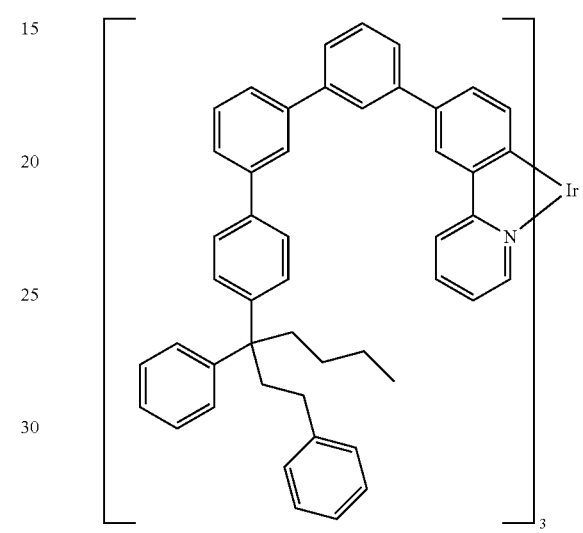
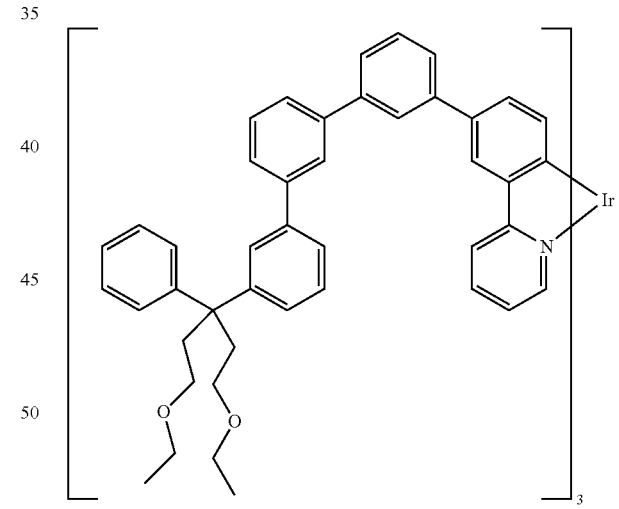
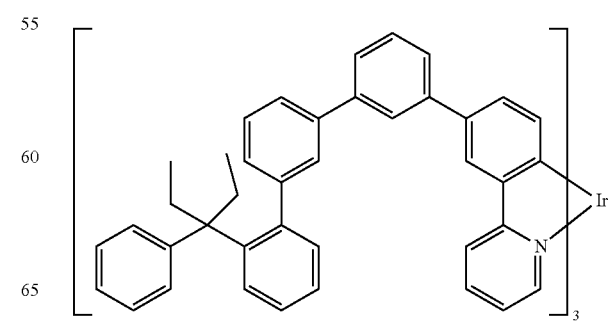

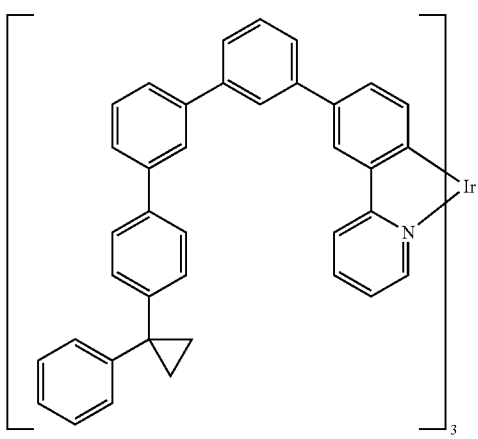

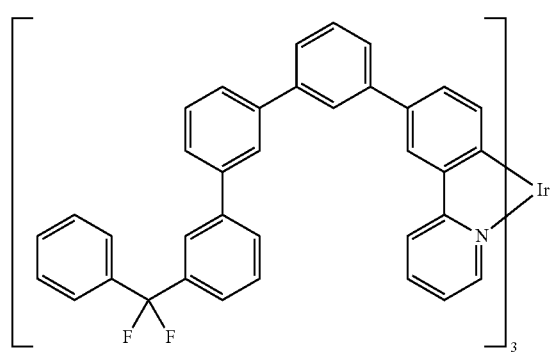

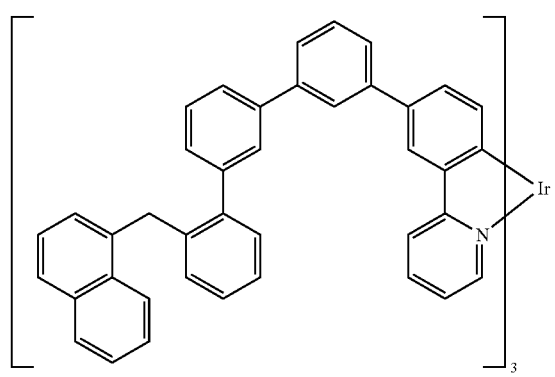

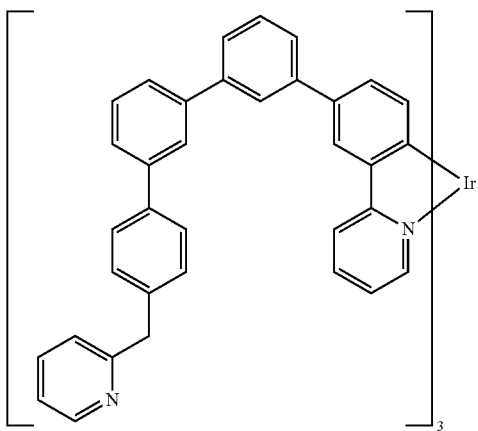

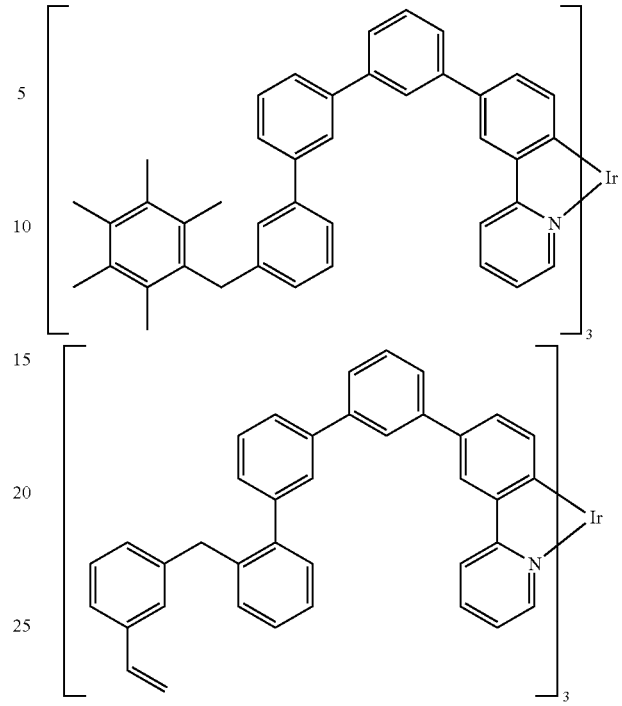

There is no particular limitation regarding the maximum emission wavelength of the iridium complex compound according to the present invention. The maximum emission wavelength of the iridium complex compound according to the present invention can be measured by, for example, a method described below.

(Method of Measuring Maximum Emission Wavelength)

At normal temperature, the phosphorescence spectrum of a solution obtained by dissolving the iridium complex compound in 2-methyltetrahydrofuran at a concentration of $1 \times 10^{-4}$ mol/L or less is measured with a spectrophotometer ($C^{9920}$-02 Organic EL quantum yield spectrometer manufactured by Hamamatsu Photonics K.K.). The wavelength at a maximum intensity in the measured phosphorescence spectrum is assumed to be a maximum emission wavelength in the present invention.

<Method of Synthesizing Iridium Complex Compound>
<Method of Synthesizing Ligand>

The ligands of the iridium complex compound according to the present invention can be synthesized by combining known organic synthesis methods. In particular, various derivatives for ligands can be synthesized by mainly using Suzuki-Miyaura coupling reaction and/or pyridine ring synthesis reaction and by further combining a reaction to introduce substituents thereto.

<Method of Synthesizing Iridium Complex Compound>

The iridium complex compound of the present invention can be synthesized, for example, by a combination of known methods. Details will be described below.

Examples of the method of synthesizing the iridium complex compound includes, but are not limited to, a method by which the target compound is obtained through a chloro-bridged iridium binuclear complex as expressed by reaction formula [A] below (M. G. Colombo, T. C. Brunold, T. Riedener, H. U. Gudel, Inorg. Chem., 1994, 33, 545-550), where a phenylpyridine ligand is used for ease of understanding, and a method by which the target compound is obtained after a binuclear complex is converted into a mononuclear complex by exchanging a chloro bridge for acetylacetonate as expressed by reaction formula [B] below (S. Lamansky, P. Djurovich, D. Murphy, F. Abdel-Razzaq, R. Kwong, I. Tsyba, M. Borz, B. Mui, R. Bau, M. Thompson, Inorg. Chem., 2001, 40, 1704-1711).

For example, conditions for the typical reaction expressed by reaction formula [A] below are as follows.

In the first stage, a chloro-bridged iridium binuclear complex is synthesized through a reaction of 2 equivalents of a ligand and 1 equivalent of iridium chloride n-hydrate. Typically, a mixed solvent of 2-ethoxyethanol and water is used, but the reaction may be performed without a solvent or with another solvent. The reaction can be promoted by using the ligand in excess amount or using an additive such as a base. Instead of chlorine, other crosslinkable anionic ligands such as bromine can be used.

The reaction temperature is not particularly limited, and typically, it is preferably 0° C. or more, more preferably 50° C. or more, and preferably 250° C. or less, more preferably 150° C. or less. When the reaction temperature is in this range, the desired reaction alone tends to proceed with no by-products or decomposition reaction, thus achieving high selectivity.

[Chem. 21]

[A]

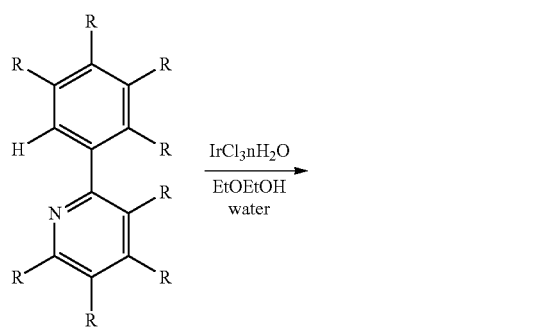

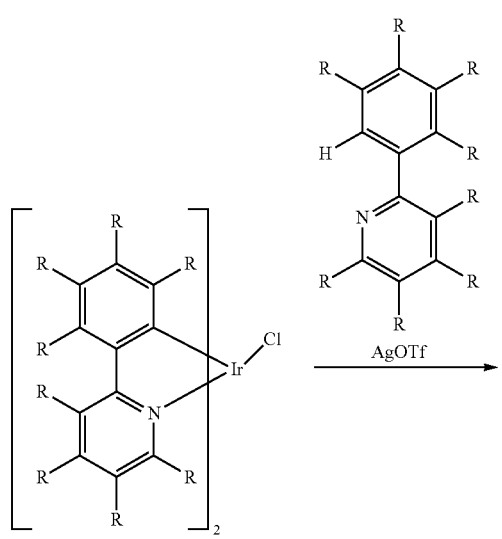

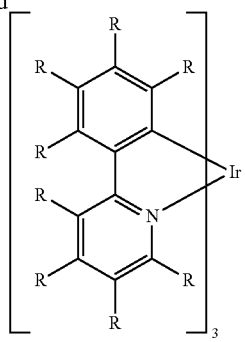

In the second stage, a halogen ion scavenger such as silver trifluoromethanesulfonate is added to bring the chloro-bridged iridium binuclear complex into contact with a newly added ligand, whereby the target complex is obtained. Typically, ethoxyethanol or diglyme is used as a solvent, but depending on the type of ligand, the reaction may be performed without a solvent, with another solvent, or with a mixture of two or more solvents. Although the halogen ion scavenger is not essential since the reaction may proceed without it, the addition of the scavenger is advantageous for increasing the reaction yield and selectively synthesizing a facial isomer having a higher quantum yield. The reaction temperature is typically, but not necessarily, in the range of 0° C. to 250° C.

Typical reaction conditions expressed by reaction formula [B] below will be described.

The binuclear complex in the first stage can be synthesized in the same manner as in reaction formula [A].

In the second stage, the binuclear complex is allowed to react with 1 equivalent or more of a 1,3-dione compound such as acetylacetone and 1 equivalent or more of a basic compound, such as sodium carbonate, that can abstract active hydrogen of the 1,3-dione compound, to thereby convert into a mononuclear complex coordinated with a 1,3-dionate ligand. Typically, a solvent such as ethoxyethanol or dichloromethane that can dissolve the starting binuclear complex is used, but when the ligand is liquid, the reaction can be performed without a solvent. The reaction temperature is typically, but not necessarily, in the range of 0° C. to 200° C.

[Chem. 22]

[B]

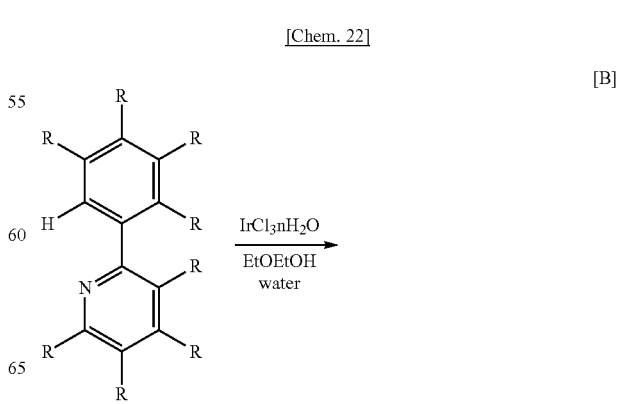

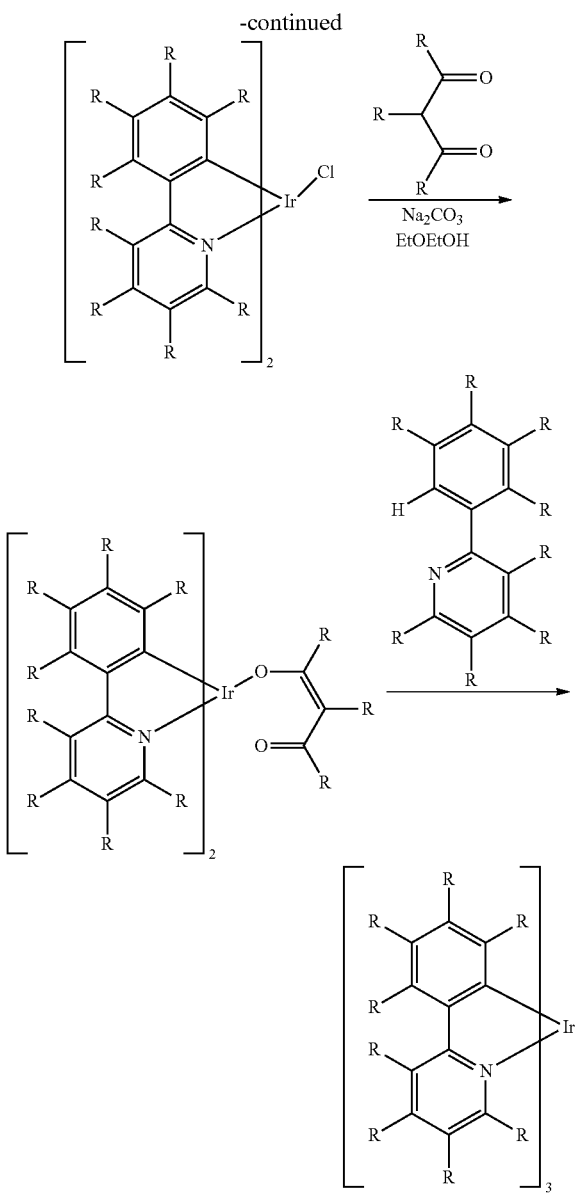

In the third stage, 1 equivalent or more of the ligand is allowed to react. The type and amount of solvent is not particularly limited, and when the ligand is liquid at a reaction temperature, the reaction may be performed without a solvent. The reaction temperature is also not particularly limited, but the reaction is often performed at a relatively high temperature of 100° C. to 300° C. because the reactivity is somewhat low. Thus, a high-boiling solvent such as glycerol is preferably used.

Regarding the third stage reaction, it is also a known method to synthesize a predetermined tris(phenylpyridine) iridium complex by using bis(acetylacetonato)iridium(III) in place of mononuclear iridium complex with which acetylacetone coordinates, adding 3 equivalent or more of phenylpyridine ligand, and performing a reaction under substantially the same condition (K. Dedeian, P. I. Djurovich, F. O. Graces, G. Carson, R. J. Watts, Inorganic Chemistry 30(8), 1685 (1991)). Just the reaction is very simple and, therefore, is favorably used for the synthesis in a laboratory.

After the final reaction, purification is performed to remove unreacted raw materials, by-products, and the solvents. While a standard purification operation in synthetic organic chemistry can be used, purification by normal silica gel column chromatography is mainly performed as described in NPL above. As an eluent, hexane, heptane, dichloromethane, chloroform, ethyl acetate, toluene, methyl ethyl ketone, methanol, or a mixture thereof can be used. The purification may be performed more than once under different conditions. Purification operations such as other chromatography techniques (reverse phase silica gel chromatography, size exclusion chromatography, and paper chromatography), separate washing, reprecipitation, recrystallization, washing by powder suspension, and vacuum drying can be performed as required.

<Applications for Iridium Complex Compound>

The iridium complex compound of the present invention can be suitably used as a material used for an organic electroluminescent element, that is, a light-emitting material for an organic electroluminescent element, and can also be suitably used as a light-emitting material for an other light-emitting elements.

[Iridium Complex Compound-Containing Composition]

The iridium complex compound of the present invention has high solvent solubility and thus is preferably used together with a solvent. A composition of the present invention containing the iridium complex compound of the present invention and a solvent (hereinafter also referred to as an "iridium complex compound-containing composition") will be described below.

The iridium complex compound-containing composition of the present invention contains the iridium complex compound of the present invention and a solvent. The iridium complex compound-containing composition of the present invention is typically used to form a layer or a film by a wet film-forming method, and in particular, the composition is preferably used to form an organic layer of an organic electroluminescent element. In particular, the organic layer is preferably a light-emitting layer.

The iridium complex compound-containing composition is preferably a composition for an organic electroluminescent element, and is particularly preferably used as a composition for light-emitting layer formation.

The content of the iridium complex compound of the present invention in the iridium complex compound-containing composition is typically 0.001 mass % or more, preferably 0.01 mass % or more, and typically 99.9 mass % or less, preferably 99 mass % or less. When the content of the iridium complex compound in the composition is in this range, holes and electrons are efficiently injected from adjacent layers (e.g., a hole transport layer and a hole blocking layer) into a light-emitting layer, thus leading to a low drive voltage.

The iridium complex compound of the present invention may be contained in the iridium complex compound-containing composition in the form of a single compound or a combination of two or more compounds.

The iridium complex compound-containing composition, when used, for example, for an organic electroluminescent element, may contain, in addition to the iridium complex compound of the present invention and the solvent, a charge transport compound used for an organic electroluminescent element, particularly, for a light-emitting layer.

The iridium complex compound-containing composition of the present invention, when used to form a light-emitting layer of an organic electroluminescent element, preferably contains the iridium complex compound of the present invention as a light-emitting material and another charge transport compound as a charge transport host material.

The solvent contained in the iridium complex compound-containing composition of the present invention is a volatile liquid component used to form a layer containing the iridium complex compound by wet film-formation.

Since the iridium complex compound of the present invention serving as a solute has high solvent solubility, the solvent is not particularly limited as long as it is an organic solvent in which the charge transport compounds described later are dissolved well.

Examples of preferred solvents include alkanes such as n-decane, cyclohexane, ethylcyclohexane, decalin, and bicyclohexane; aromatic hydrocarbons such as toluene, xylene, mesitylene, phenylcyclohexane, and tetralin; halogenated aromatic hydrocarbons such as chlorobenzene, dichlorobenzene, and trichlorobenzene; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole, and diphenyl ether; aromatic esters such as phenyl acetate, phenyl propionate, methyl benzoate, ethyl benzoate, propyl benzoate, and n-butyl benzoate; alicyclic ketones such as cyclohexanone, cyclooctanone, and fenchone; alicyclic alcohols such as cyclohexanol and cyclooctanol; aliphatic ketones such as methyl ethyl ketone and dibutyl ketone; aliphatic alcohols such as butanol and hexanol; and aliphatic ethers such as ethylene glycol dimethyl ether, ethylene glycol diethyl ether, and propylene glycol-1-monomethyl ether acetate (PGMEA).

Of these, alkanes and aromatic hydrocarbons are preferred. In particular, phenylcyclohexane has a viscosity and boiling point preferred for a wet film-forming process.

These solvents may be used alone, or two or more of them may be used in any combination and ratio.

The boiling point of the solvent used is typically 80° C. or more, preferably 100° C. or more, more preferably 120° C. or more, and typically 270° C. or less, preferably 250° C. or less, more preferably 230° C. or less. Below this range, the solvent may evaporate from the composition during wet film-formation, resulting in unstable film formation.

The content of the solvent in the iridium complex compound-containing composition is preferably 1 mass % or more, more preferably 10 mass % or more, particularly preferably 50 mass % or more, and preferably 99.99 mass % or less, more preferably 99.9 mass % or less, particularly preferably 99 mass % or less. The thickness of the light-emitting layer is typically about 3 to 200 nm, and when the content of the solvent is below this lower limit, the viscosity of the composition may be excessively high, resulting in low workability in film formation. When the content of the solvent is above this upper limit, the thickness of a film obtained by removing the solvent after film formation tends to be insufficient, thus resulting in unsuccessful film formation.

As the other charge transport compound that may be contained in the iridium complex compound-containing composition of the present invention, a compound conventionally used as a material for an organic electroluminescent element can be used. Examples include pyridine, carbazole, naphthalene, perylene, pyrene, anthracene, chrysene, naphthacene, phenanthrene, coronene, fluoranthene, benzophenanthrene, fluorene, acetonaphthofluoranthene, coumarin, p-bis(2-phenylethenyl)benzene, derivatives thereof, quinacridone derivatives, DCM (4-(dicyanomethylene)-2-methyl-6-(p-dimethylaminostyryl)-4H-pyran) compounds, benzopyran derivatives, rhodamine derivatives, benzothioxanthene derivatives, azabenzothioxanthene, arylamino-substituted fused aromatic ring compounds, and arylamino-substituted styryl derivatives.

These may be used alone, or two or more of them may be used in any combination and ratio.

Relative to 1 part by mass of the iridium complex compound of the present invention in the iridium complex compound-containing composition, the content of the other charge transport compound in the iridium complex compound-containing composition is typically 1,000 parts by mass or less, preferably 100 parts by mass or less, still more preferably 50 parts by mass or less, and typically 0.01 parts by mass or more, preferably 0.1 parts by mass or more, still more preferably 1 part by mass or more.

The iridium complex compound-containing composition of the present invention may optionally further contain other compounds in addition to the above-described compounds. For example, other solvents may be contained in addition to the above-described solvents. Examples of the other solvents include amides such as N,N-dimethylformamide and N,N-dimethylacetamide, and dimethylsulfoxide. These may be used alone, or two or more of them may be used in any combination and ratio.

[Organic Electroluminescent Element]

An organic electroluminescent element of the present invention contains the iridium complex compound of the present invention.

The organic electroluminescent element of the present invention preferably includes a substrate, an anode and a cathode on the substrate, and one or more organic layers between the anode and the cathode, and at least one of the organic layers contains the iridium complex compound of the present invention. The organic layers include a light-emitting layer.

The organic layer containing the iridium complex compound of the present invention is more preferably a layer formed using the composition of the present invention, still more preferably a layer formed by a wet film-forming method. The layer formed by a wet film-forming method is preferably a light-emitting layer.

In the present invention, the term "wet film-forming method" refers to a method of forming a film in which film formation, that is, application is performed by a wet method, such as a spin coating method, a dip coating method, a die coating method, a bar coating method, a blade coating method, a roll coating method, a spray coating method, a capillary coating method, an ink-jet method, a nozzle printing method, a screen printing method, a gravure printing method, or a flexographic printing method, to form a film and the film formed by any of these methods is dried.

FIG. 1 is a schematic sectional view of an exemplary structure suitable for an organic electroluminescent element 10 of the present invention. In FIG. 1, reference numeral 1 denotes a substrate, reference numeral 2 an anode, reference numeral 3 a hole injection layer, reference numeral 4 a hole transport layer, reference numeral 5 a light-emitting layer, reference numeral 6 a hole blocking layer, reference numeral 7 an electron transport layer, reference numeral 8 an electron injection layer, and reference numeral 9 a cathode.

Materials used for the structure may be known materials and are not particularly limited. For each layer, an exemplary material and production method will be described below. It is intended that the content of any patent publications and journals cited herein may be appropriately applied or used within the common knowledge of a person skilled in the art.

<Substrate 1>

A substrate 1 serves as a support for the organic electroluminescent element and is typically, for example, a quartz or glass plate, a metal plate or metal foil, or a plastic film or sheet. In particular, the substrate 1 is preferably a glass plate or a transparent synthetic resin plate made of, for example, polyester, polymethacrylate, polycarbonate, or polysulfone. The substrate 1 is preferably made of a material with high gas barrier properties to prevent deterioration of the organic electroluminescent element due to ambient air. In particular, when a material with low gas barrier properties, such as a synthetic resin substrate, is used, a dense silicon oxide film or the like is preferably disposed on at least one surface of the substrate 1 to improve the gas barrier properties.

<Anode 2>

An anode 2 functions to inject holes into a layer on the light-emitting layer side. The anode 2 is typically made of a metal such as aluminum, gold, silver, nickel, palladium, or platinum; a metal oxide such as indium and/or tin oxide; a halogenated metal such as copper iodide; a conductive polymer such as carbon black, poly(3-methylthiophene), polypyrrole, or polyaniline; or the like.

The anode 2 is typically formed by a dry method such as a sputtering method or a vacuum deposition method. When the anode 2 is formed by using, for example, fine particles of a metal such as silver, fine particles of copper iodide or the like, carbon black, fine particles of a conductive metal oxide, or fine powder of a conductive polymer, a dispersion of such a material in an appropriate binder resin solution may be applied to the substrate to form the anode 2. In the case of a conductive polymer, the anode 2 can be formed by forming a thin film directly on a substrate through electrolytic polymerization or applying the conductive polymer on a substrate (Appl. Phys. Lett., vol. 60, p. 2711, 1992).

The anode 2 typically has a single-layer structure but may have a multilayer structure as appropriate. When the anode 2 has a multilayer structure, a different conductive material may be stacked on a first anode layer.

The thickness of the anode 2 may be determined according to, for example, the transparency required and the material used. When particularly high transparency is required, the thickness is preferably such that the visible light transmittance of the anode 2 is 60% or more, more preferably 80% or more. The thickness of the anode 2 is typically 5 nm or more, preferably 10 nm or more, and typically 1,000 nm or less, preferably 500 nm or less. When transparency is not required, the anode 2 may have any thickness according to, for example, the strength required. In this case, the anode 2 may have the same thickness as the substrate 1.

When a film is formed on a surface of the anode 2, it is preferable to perform, before the film formation, a treatment with ultraviolet rays+ozone, oxygen plasma, argon plasma, or the like to thereby remove impurities on the anode and adjust the ionization potential thereof to improve hole injection ability.

<Hole injection layer 3>

The layer that functions to transport holes from the anode 2 side to the light-emitting layer 5 side is typically called a hole injection-transport layer or a hole transport layer. When there are two or more layers that function to transport holes from the anode 2 side to the light-emitting layer 5 side, the layer closer to the anode 2 side may be called a hole injection layer 3. The hole injection layer 3 is preferably used to enhance the function of transporting holes from the anode 2 to the light-emitting layer 5 side. When the hole injection layer 3 is used, the hole injection layer 3 is typically formed on the anode 2.

The thickness of the hole injection layer 3 is typically 1 nm or more, preferably 5 nm or more, and typically 1,000 nm or less, preferably 500 nm or less.

The hole injection layer 3 may be formed by a vacuum deposition method or a wet film-forming method. In terms of high film formability, the hole injection layer 3 is preferably formed by a wet film-forming method.

The hole injection layer 3 preferably contains a hole-transporting compound, more preferably contains a hole-transporting compound and an electron-accepting compound. Furthermore, the hole injection layer 3 preferably contains a cation radical compound, particularly preferably contains a cation radical compound and a hole-transporting compound.

(Hole-Transporting Compound)

A composition for hole injection layer formation typically contains a hole-transporting compound that will form the hole injection layer 3.

In the case of a wet film-forming method, typically, a solvent is further contained. The composition for hole injection layer formation preferably has a high hole transport ability and can efficiently transport injected holes. Thus, the composition preferably has high hole mobility and is less likely to generate trapping impurities, for example, during production or use. In addition, the composition preferably has high stability, a low ionization potential, and high transparency to visible light. Particularly when the hole injection layer 3 is in contact with the light-emitting layer 5, the composition preferably does not quench light emitted from the light-emitting layer 5 and does not form an exciplex together with the light-emitting layer 5 to reduce light emission efficiency.

The hole-transporting compound is preferably a compound having an ionization potential of 4.5 eV to 6.0 eV from the viewpoint of a barrier to charge injection from the anode 2 to the hole injection layer 3. Examples of the hole-transporting compound include aromatic amine compounds, phthalocyanine compounds, porphyrin compounds, oligothiophene compounds, polythiophene compounds, benzylphenyl compounds, compounds having tertiary amines connected to each other through a fluorene group, hydrazone compounds, silazane compounds, and quinacridone compounds.

Among the above exemplary compounds, aromatic amine compounds are preferred, and aromatic tertiary amine compounds are particularly preferred, in terms of amorphous properties and visible light transmittance. Aromatic tertiary amine compounds are compounds having an aromatic tertiary amine structure and also include compounds having a group derived from an aromatic tertiary amine.

The type of aromatic tertiary amine compound is not particularly limited, but it is preferable to use a polymer compound having a weight average molecular weight of 1,000 or more and 1,000,000 or less (polymerized compound having a series of repeating units) because uniform light emission is readily provided due to the surface-smoothing effect. Examples of preferred aromatic tertiary amine polymer compounds include a polymer compound having a repeating unit represented by formula (I) below.

[Chem. 23]

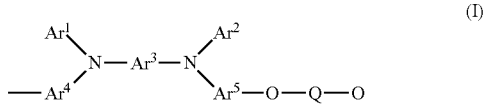

In formula (I), Ar¹ and Ar² each independently represent an optionally substituted aromatic group or an optionally substituted heteroaromatic group. Ar³ to Ar⁵ each independently represent an optionally substituted aromatic group or an optionally substituted heteroaromatic group. Q represents a linking group selected from the group of linking groups given below. Among Ar¹ to Ar⁵, two groups bonded to the same N atom may be bonded together to form a ring.

The linking groups are given below.

[Chem. 24]

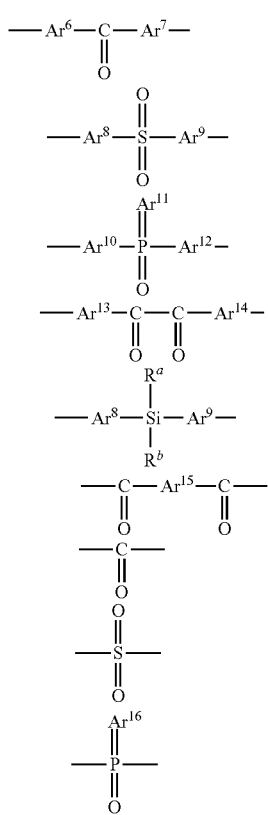

In each of the above formulae, Ar⁶ to Ar¹⁶ each independently represent an optionally substituted aromatic group or an optionally substituted heteroaromatic group. $R^a$ to $R^b$ each independently represent a hydrogen atom or a substituent.

In terms of solubility, heat resistance, and hole injection transport ability of the polymer compound, the aromatic groups and the heteroaromatic groups represented by Ar¹ to Ar¹⁶ are each preferably a group derived from a benzene ring, a naphthalene ring, a phenanthrene ring, a thiophene ring, or a pyridine ring, more preferably a group derived from a benzene ring or a naphthalene ring.

Specific examples of the aromatic tertiary amine polymer compound having the repeating unit represented by formula (I) include compounds described in International Publication No. 2005/089024.

(Electron-Accepting Compound)

The hole injection layer 3 preferably contains an electron-accepting compound because the electric conductivity of the hole injection layer 3 can be improved through oxidation of the hole-transporting compound.

The electron-accepting compound is preferably a compound having oxidizing power and capable of accepting one electron from the above hole-transporting compound. Specifically, a compound having an electron affinity of 4 eV or more is preferred, and a compound having an electron affinity of 5 eV or more is more preferred.

Examples of such electron-accepting compounds include one or more compounds selected from the group consisting of triaryl boron compounds, halogenated metals, Lewis acids, organic acids, onium salts, salts of an arylamine and a halogenated metal, and salts of an arylamine and a Lewis acid. Specific examples include onium salts with a substituted organic group, such as 4-isopropyl-4'-methyldiphenyliodonium tetrakis(pentafluorophenyl)borate and triphenylsulfonium tetrafluoroborate (International Publication No. 2005/089024); high-valent inorganic compounds such as iron (III) chloride (Japanese Unexamined Patent Application Publication No. 11-251067) and ammonium peroxodisulfate; cyano compounds such as tetracyanoethylene; aromatic boron compounds such as tris(pentafluorophenyl)borane (Japanese Unexamined Patent Application Publication No. 2003-31365); fullerene derivatives; and iodine.

(Cation Radical Compound)

The cation radical compound is preferably an ionic compound composed of a cation radical, which is a chemical species resulting from the removal of one electron from a hole-transporting compound, and a counter anion. When the cation radical is derived from a hole-transporting polymer compound, the cation radical has a structure resulting from the removal of one electron from the repeating unit of the polymer compound.

The cation radical is preferably a chemical species that results from the removal of one electron from any of the compounds listed above as a hole-transporting compound. A chemical species that results from the removal of one electron from a compound preferred as a hole-transporting compound is suitable in terms of, for example, amorphous properties, visible light transmittance, heat resistance, and solubility.

The cation radical compound can be produced by mixing the hole-transporting compound and the electron-accepting compound. The mixing of the hole-transporting compound and the electron-accepting compound causes electrons to migrate from the hole-transporting compound to the electron-accepting compound, as a result of which a cationic compound composed of a cation radical of the hole-transporting compound and a counter anion is produced.

Polymer compound-derived cation radical compounds such as PEDOT/PSS (Adv. Mater., 2000, vol. 12, p. 481) and emeraldine hydrochloride (J. Phys. Chem., 1990, vol. 94, p. 7716) are produced also through oxidation polymerization (dehydrogenation polymerization).

As used herein, oxidation polymerization refers to oxidizing a monomer, in an acidic solution, chemically using peroxodisulfate or the like or electrochemically. In the case of oxidation polymerization (dehydrogenation polymerization), a monomer is oxidized to form a polymer, while one electron is removed from the repeating unit of the polymer to produce a cation radical, with an anion derived from an acidic solution serving as a counter anion.

(Formation of Hole Injection Layer 3 by Wet Film-Forming Method)

When the hole injection layer 3 is formed by a wet film-forming method, it is typically formed by mixing a material that will form the hole injection layer 3 with an appropriate solvent (a solvent for a hole injection layer) to prepare a composition for film formation (composition for hole injection layer formation), applying the composition for hole injection layer formation onto a layer (typically, the anode 2) corresponding to an underlayer of the hole injection layer 3 by a wet film-forming method to form a film, and drying the film. The drying of the formed film can be performed in the same manner as the drying in the formation of the light-emitting layer 5 by a wet film-forming method.

The concentration of the hole-transporting compound in the composition for hole injection layer formation, although not particularly limited as long as the effects of the present invention are not greatly impaired, is preferably low in terms of thickness uniformity, and is preferably high in terms of defect resistance of the hole injection layer 3. The concentration of the hole-transporting compound in the composition for hole injection layer formation is preferably 0.01 mass % or more, more preferably 0.1 mass % or more, particularly preferably 0.5 mass % or more, and preferably 70 mass % or less, more preferably 60 mass % or less, particularly preferably 50 mass % or less.

Examples of the solvent include ether solvents, ester solvents, aromatic hydrocarbon solvents, and amide solvents.

Examples of ether solvents include aliphatic ethers such as ethylene glycol dimethyl ether, ethylene glycol diethyl ether, and propylene glycol-1-monomethyl ether acetate (PGMEA) and aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, and 2,4-dimethylanisole.

Examples of ester solvents include aromatic esters such as phenyl acetate, phenyl propionate, methyl benzoate, ethyl benzoate, propyl benzoate, and n-butyl benzoate.

Examples of aromatic hydrocarbon solvents include toluene, xylene, cyclohexylbenzene, 3-isopropylbiphenyl, 1,2,3,4-tetramethylbenzene, 1,4-diisopropylbenzene, and methylnaphthalene.

Examples of amide solvents include N,N-dimethylformamide and N,N-dimethylacetamide.

Other solvents such as dimethylsulfoxide can also be used.

The formation of the hole injection layer 3 by a wet film-forming method is typically performed by preparing the composition for hole injection layer formation, then applying the composition onto a layer (typically, the anode 2) corresponding to an underlayer of the hole injection layer 3 to form a film, and drying the film. In forming the hole injection layer 3, typically, the coating film is dried, for example, by heating or vacuum drying after the film formation.

(Formation of Hole Injection Layer 3 by Vacuum Deposition Method)

When the hole injection layer 3 is formed by a vacuum deposition method, it is typically formed as described below. One or more of the constituent materials (e.g., the hole-transporting compound and the electron-accepting compound) of the hole injection layer 3 are placed in a crucible mounted in a vacuum chamber (when two or more materials are used, they are typically placed in different crucibles), and the vacuum chamber is evacuated with a vacuum pump to about $10^{-4}$ Pa. Thereafter, the crucible is heated (when two or more materials are used, the crucibles are typically each heated), and the material in the crucible is evaporated while controlling the amount of evaporation (when two or more materials are used, the materials are typically independently evaporated while controlling the amount of evaporation) to form the hole injection layer 3 on the anode 2 on a substrate placed so as to face the crucible. When two or more materials are used, a mixture thereof may be placed in a crucible, and heated and evaporated to form the hole injection layer 3.

The degree of vacuum during the deposition is not particularly limited as long as the effects of the present invention are not greatly impaired, and is typically $0.1 \times 10^{-6}$ Torr ($0.13 \times 10^{-4}$ Pa) or more and $9.0 \times 10^{-6}$ Torr ($12.0 \times 10^{-4}$ Pa) or less. The rate of deposition is not particularly limited as long as the effects of the present invention are not greatly impaired, and is typically 0.1 Å/s or more and 5.0 Å/s or less. The film formation temperature during the deposition is not particularly limited as long as the effects of the present invention are not greatly impaired, and is preferably 10° C. or more and 50° C. or less.

<Hole Transport Layer 4>

A hole transport layer 4 is a layer that functions to transport holes from the anode 2 side to the light-emitting layer 5 side. Although the hole transport layer 4 is not essential in the organic electroluminescent element of the present invention, this layer is preferably provided in order to enhance the function of transporting holes from the anode 2 to the light-emitting layer 5. When the hole transport layer 4 is provided, the hole transport layer 4 is typically formed between the anode 2 and the light-emitting layer 5. When the hole injection layer 3 is present, the hole transport layer 4 is formed between the hole injection layer 3 and the light-emitting layer 5.

The thickness of the hole transport layer 4 is typically 5 nm or more, preferably 10 nm or more, and typically 300 nm or less, preferably 100 nm or less.

The hole transport layer 4 may be formed by a vacuum deposition method or a wet film-forming method. In terms of high film formability, the hole transport layer 4 is preferably formed by a wet film-forming method.

The hole transport layer 4 typically contains a hole-transporting compound that will form the hole transport layer 4. Specific examples of the hole-transporting compound contained in the hole transport layer 4 include aromatic diamines which contain two or more tertiary amines and in which two or more fused aromatic rings are substituted with nitrogen atoms, such as 4,4'-bis[N-(1-naphthyl)-N-phenylamino]biphenyl (Japanese Unexamined Patent Application Publication No. 5-234681); aromatic amine compounds having a starburst structure, such as 4,4',4''-tris(1-naphthylphenylamino)triphenylamine (J. Lumin., vols. 72-74, p. 985, 1997); aromatic amine compounds composed of a tetramer of triphenylamine (Chem. Commun., p. 2175, 1996); spiro compounds such as 2,2',7,7'-tetrakis-(diphenylamino)-9,9'-spirobifluorene (Synth. Metals, vol. 91, p. 209, 1997); and carbazole derivatives such as 4,4'-N,N'-dicarbazolebiphenyl. Polyvinylcarbazole, polyvinyltriphenylamine (Japanese Unexamined Patent Application Publication No. 7-53953), polyarylene ether sulfone containing tetraphenylbenzidine (Polym. Adv. Tech., vol. 7, p. 33, 1996), and the like can also be preferably used.

(Formation of Hole Transport Layer 4 by Wet Film-Forming Method)

When the hole transport layer 4 is formed by a wet film-forming method, it is typically formed as in the case where the hole injection layer 3 is formed by a wet film-forming method, except that the composition for hole injection layer formation is replaced with a composition for hole transport layer formation.

When the hole transport layer 4 is formed by a wet film-forming method, the composition for hole transport layer formation typically further contains a solvent. The solvent used for the composition for hole transport layer formation may be the same solvent as used for the composition for hole injection layer formation.

The concentration of the hole-transporting compound in the composition for hole transport layer formation may be in the same range as that of the concentration of the hole-transporting compound in the composition for hole injection layer formation.

The formation of the hole transport layer 4 by a wet film-forming method can be performed in the same manner as the formation of the hole injection layer 3.

(Formation of Hole Transport Layer 4 by Vacuum Deposition Method)

Also when the hole transport layer 4 is formed by a vacuum deposition method, it can be typically formed as in the case where the hole injection layer 3 is formed by a vacuum deposition method, except that the constituent materials of the hole injection layer 3 are replaced with constituent materials of the hole transport layer 4. The film formation conditions, including the degree of vacuum during the deposition, the rate of deposition, and the temperature, may be the same as the conditions for the vacuum deposition of the hole injection layer 3.

<Light-Emitting Layer 5>

The light-emitting layer 5 is a layer that functions to emit light upon being excited by recombination of holes injected from the anode 2 and electrons injected from a cathode 9 in response to an electric field applied between the pair of electrodes.

The light-emitting layer 5 is a layer formed between the anode 2 and the cathode 9. When the hole injection layer 3 is present on the anode 2, the light-emitting layer 5 is formed between the hole injection layer 3 and the cathode 9, and when the hole transport layer 4 is present on the anode 2, the light-emitting layer 5 is formed between the hole transport layer 4 and the cathode 9.

The thickness of the light-emitting layer 5, although not particularly limited as long as the effects of the present invention are not greatly impaired, is preferably large to prevent defects of the film, and is preferably small to help achieve a low drive voltage. The thickness of the light-emitting layer 5 is preferably 3 nm or more, more preferably 5 nm or more, and preferably 200 nm or less, more preferably 100 nm or less.

The light-emitting layer 5 contains at least a material having light-emitting properties (light-emitting material), and preferably also contains a material having charge transport ability (charge-transporting material). It is only required that at least one of the light-emitting layers contain the iridium complex compound of the present invention as a light-emitting material, and other light-emitting materials may be used as appropriate. Light-emitting materials other than the iridium complex compound of the present invention will be described below in detail.

(Light-Emitting Material)

The light-emitting material is not particularly limited as long as it emits light at a desired emission wavelength and the effects of the present invention are not impaired, and a known light-emitting material can be used. The light-emitting material may be a fluorescent material or a phosphorescent material, and is preferably a material with good light emission efficiency, preferably a phosphorescent material from the viewpoint of internal quantum efficiency.

Examples of the fluorescent material include the following materials.

Examples of fluorescent materials that provide blue-light emission (blue fluorescent materials) include naphthalene, perylene, pyrene, anthracene, coumarin, chrysene, p-bis(2-phenylethenyl)benzene, and derivatives thereof.

Examples of fluorescent materials that provide green-light emission (green fluorescent materials) include quinacridone derivatives, coumarin derivatives, and aluminum complexes such as $Al(C_9H_6NO)_3$.

Examples of fluorescent materials that provide yellow-light emission (yellow fluorescent materials) include rubrene and perimidone derivatives.

Examples of fluorescent materials that provide red-light emission (red fluorescent materials) include DCM (4-(dicyanomethylene)-2-methyl-6-(p-dimethylaminostyryl)-4H-pyran) compounds, benzopyran derivatives, rhodamine derivatives, benzothioxanthene derivatives, and azabenzothioxanthene.

Examples of the phosphorescent material include organometallic complexes containing a metal selected from groups 7 to 11 of the long-form periodic table (hereinafter, when the term "the periodic table" is used, it refers to the long-form periodic table, unless otherwise specified). Preferred examples of the metal selected from groups 7 to 11 of the periodic table include ruthenium, rhodium, palladium, silver, rhenium, osmium, iridium, platinum, and gold.

The ligand of such an organometallic complex is preferably a ligand in which a (hetero)aryl group is linked to pyridine, pyrazole, phenanthroline, or the like, such as a (hetero)arylpyridine ligand or a (hetero)arylpyrazole ligand, particularly preferably a phenylpyridine ligand or a phenylpyrazole ligand. Here, (hetero) aryl means an aryl group or a heteroaryl group.

Specific examples of preferred phosphorescent materials include phenylpyridine complexes such as tris(2-phenylpyridine)iridium, tris(2-phenylpyridine)ruthenium, tris(2-phenylpyridine)palladium, bis(2-phenylpyridine)platinum, tris(2-phenylpyridine)osmium, and tris(2-phenylpyridine)rhenium; and porphyrin complexes such as platinum octaethylporphyrin, platinum octaphenylporphyrin, palladium octaethylporphyrin, and palladium octaphenylporphyrin.

Examples of polymeric light-emitting materials include polyfluorene materials such as poly(9,9-dioctylfluorene-2,7-diyl), poly[(9,9-dioctylfluorene-2,7-diyl)-co-(4,4'-(N-(4-sec-butylphenyl))diphenylamine)], and poly[(9,9-dioctylfluorene-2,7-diyl)-co-(1,4-benzo-2{2,1'-3}-triazole)]; and polyphenylenevinylene materials such as poly[2-methoxy-5-(2-ethylhexyloxy)-1,4-phenylenevinylene].

(Charge-Transporting Material)

The charge-transporting material is a material having a positive charge (hole) or negative charge (electron) transport ability and may be any known material as long as the effects of the present invention are not impaired.

The charge-transporting material may be, for example, a compound conventionally used for the light-emitting layer 5 of an organic electroluminescent element, and, in particular, is preferably a compound used as a host material of the light-emitting layer 5.

Specific examples of the charge-transporting material include the compounds exemplified as the hole-transporting compound of the hole injection layer 3, such as aromatic amine compounds, phthalocyanine compounds, porphyrin compounds, oligothiophene compounds, polythiophene compounds, benzylphenyl compounds, compounds having tertiary amines connected to each other through a fluorene group, hydrazone compounds, silazane compounds, silanamine compounds, phosphamine compounds, and quinacridone compounds; and electron-transporting compounds such as anthracene compounds, pyrene compounds, carbazole compounds, pyridine compounds, phenanthroline compounds, oxadiazole compounds, and silole compounds.

Also preferred for use as the charge-transporting material are, for example, the compounds exemplified as the hole-transporting compound of the hole transport layer 4, such as aromatic diamines which contain two or more tertiary amines and in which two or more fused aromatic rings are substituted with nitrogen atoms, as typified by 4,4'-bis[N-(1-naphthyl)-N-phenylamino]biphenyl (Japanese Unexamined Patent Application Publication No. 5-234681); aromatic amine compounds having a starburst structure, such as 4,4',4''-tris(1-naphthylphenylamino)triphenylamine (J. Lumin., vols. 72-74, p. 985, 1997); aromatic amine compounds composed of a tetramer of triphenylamine (Chem. Commun., p. 2175, 1996); fluoren compounds such as 2,2',7,7'-tetrakis-(diphenylamino)-9,9'-spirobifluorene (Synth. Metals, vol. 91, p. 209, 1997); and carbazole compounds such as 4,4'-N,N'-dicarbazolebiphenyl. Examples of the charge-transporting material also include oxadiazole compounds such as 2-(4-biphenylyl)-5-(p-tert-butylphenyl)-1,3,4-oxadiazole (tBu-PBD) and 2,5-bis(1-naphthyl)-1,3,4-oxadiazole (BND); silole compounds such as 2,5-bis(6'-(2',2''-bipyridyl))-1,1-dimethyl-3,4-diphenylsilole (PyPy-SPyPy); and phenanthroline compounds such as bathophenanthroline (BPhen) and 2,9-dimethyl-4,7-diphenyl-1,10-phenanthroline (BCP, bathocuproine).

(Formation of Light-Emitting Layer 5 by Wet Film-Forming Method)

The light-emitting layer 5 may be formed by a vacuum deposition method or a wet film-forming method. In terms of high film formability, the wet film-forming method is preferred.

When the light-emitting layer 5 is formed by a wet film-forming method, it is typically formed as in the case where the hole injection layer 3 is formed by a wet film-forming method, except that the composition for hole injection layer formation is replaced with a composition for light-emitting layer formation prepared by mixing a material that will form the light-emitting layer 5 with an appropriate solvent (a solvent for a light-emitting layer). In the present invention, the iridium complex compound-containing composition of the present invention is preferably used as the composition for light-emitting layer formation.

Examples of the solvent include the solvents exemplified for the formation of the hole injection layer 3, such as ether solvents, ester solvents, aromatic hydrocarbon solvents, and amide solvents; and alkane solvents, halogenated aromatic hydrocarbon solvents, aliphatic alcohol solvents, alicyclic alcohol solvents, aliphatic ketone solvents, and alicyclic ketone solvents. The solvent used is as exemplified also as the solvent of the iridium complex compound-containing composition of the present invention. Specific examples of the solvent are given below, but other solvents may also be used as long as the effects of the present invention are not impaired.

Examples include aliphatic ether solvents such as ethylene glycol dimethyl ether, ethylene glycol diethyl ether, and propylene glycol-1-monomethyl ether acetate (PGMEA); aromatic ether solvents such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole, and diphenyl ether; aromatic ester solvents such as phenyl acetate, phenyl propionate, methyl benzoate, ethyl benzoate, propyl benzoate, and n-butyl benzoate; aromatic hydrocarbon solvents such as toluene, xylene, mesitylene, cyclohexylbenzene, tetralin, 3-isopropylbiphenyl, 1,2,3,4-tetramethylbenzene, 1,4-diisopropylbenzene, and methylnaphthalene; amide solvents such as N,N-dimethylformamide and N,N-dimethylacetamide; alkane solvents such as n-decane, cyclohexane, ethylcyclohexane, decalin, and bicyclohexane; halogenated aromatic hydrocarbon solvents such as chlorobenzene, dichlorobenzene, and trichlorobenzene; aliphatic alcohol solvents such as butanol and hexanol; alicyclic alcohol solvents such as cyclohexanol and cyclooctanol; aliphatic ketone solvents such as methyl ethyl ketone and dibutyl ketone; and alicyclic ketone solvents such as cyclohexanone, cyclooctanone, and fenchone. Of these, alkane solvents and aromatic hydrocarbon solvents are particularly preferred.

To form a more uniform film, the solvent is preferably evaporated from a freshly formed liquid film at an appropriate rate. Thus, the boiling point of the solvent used, as described above, is typically 80° C. or more, preferably 100° C. or more, more preferably 120° C. or more, and typically 270° C. or less, preferably 250° C. or less, more preferably 230° C. or less.

The solvent may be used in any amount as long as the effects of the present invention are not greatly impaired, but the total content of the solvent in the composition for light-emitting layer formation, that is, the iridium complex compound-containing composition is preferably high in terms of ease of film-forming operation due to a low viscosity, and is preferably low in terms of ease of film formation due to a thick film. As described above, the content of the solvent in the iridium complex compound-containing composition is preferably 1 mass % or more, more preferably 10 mass % or more, particularly preferably 50 mass % or more, and preferably 99.99 mass % or less, more preferably 99.9 mass % or less, particularly preferably 99 mass % or less.

The solvent can be removed after the wet film formation, for example, by heating or pressure reduction. The heating means used for heating is preferably a clean oven or a hot plate because heat is uniformly applied to the whole film.

The heating temperature in the heating process, although not particularly limited as long as the effects of the present invention are not greatly impaired, is preferably high in terms of reduction in drying time, and is preferably low in terms of reduction in damage to the materials. The upper limit of the heating temperature is typically 250° C. or less, preferably 200° C. or less, more preferably 150° C. or less. The lower limit of the heating temperature is typically 30° C. or more, preferably 50° C. or more, more preferably 80° C. or more. Temperatures over the upper limit are higher than the level of heat resistance of a commonly used charge transport material or phosphorescent material and may disadvantageously cause decomposition or crystallization. When the heating temperature is below the lower limit, removal of the solvent disadvantageously requires a long time. The heating temperature in the heating process is appropriately determined according to the boiling point of the solvent in the composition for light-emitting layer formation, the vapor pressure, the heat resistance of the materials, and the heating conditions.

(Formation of Light-Emitting Layer 5 by Vacuum Deposition Method)

When the light-emitting layer 5 is formed by a vacuum deposition method, it is typically formed as described below.

One or more of the constituent materials (e.g., the light-emitting material and the charge transport compound) of the light-emitting layer 5 are placed in a crucible mounted in a vacuum chamber (when two or more materials are used, they are typically placed in different crucibles), and the vacuum chamber is evacuated with a vacuum pump to about $10^{-4}$ Pa. Thereafter, the crucible is heated (when two or more materials are used, the crucibles are typically each heated), and the material in the crucible is evaporated while controlling the amount of evaporation (when two or more materials are used, the materials are typically independently evaporated while controlling the amount of evaporation) to form the light-emitting layer 5 on the hole injection layer 3 or the hole transport layer 4 placed so as to face the crucible. When two or more materials are used, a mixture thereof may be placed in a crucible, and heated and evaporated to form the light-emitting layer 5.

The degree of vacuum during the deposition is not particularly limited as long as the effects of the present invention are not greatly impaired, and is typically $0.1 \times 10^{-6}$ Torr ($0.13 \times 10^{-4}$ Pa) or more and $9.0 \times 10^{-6}$ Torr ($12.0 \times 10^{-4}$ Pa) or less. The rate of deposition is not particularly limited as long as the effects of the present invention are not greatly impaired, and is typically 0.1 Å/s or more and 5.0 Å/s or less. The film formation temperature during the deposition is not particularly limited as long as the effects of the present invention are not greatly impaired, and is preferably 10° C. or more and 50° C. or less.

<Hole Blocking Layer 6>

A hole blocking layer 6 may be disposed between the light-emitting layer 5 and an electron injection layer 8 described later. The hole blocking layer 6 is a layer stacked on the light-emitting layer 5 so as to be in contact with a surface of the light-emitting layer 5 on the cathode 9 side.

The hole blocking layer 6 serves to prevent holes moving from the anode 2 from reaching the cathode 9 and to efficiently transport electrons injected from the cathode 9 toward the light-emitting layer 5. The material forming the hole blocking layer 6 is required to have physical properties such as high electron mobility, low hole mobility, a large energy gap (difference between HOMO and LUMO), and a high excited triplet level (T1).

Examples of materials of the hole blocking layer 6 that satisfy such requirements include mixed ligand complexes such as bis(2-methyl-8-quinolinolate) (phenolate)aluminum and bis(2-methyl-8-quinolinolate) (triphenylsilanolate)aluminum; metal complexes such as a bis(2-methyl-8-quinolate)aluminum-p-oxo-bis-(2-methyl-8-quinolinolate)aluminum dinuclear metal complex; styryl compounds such as distyrylbiphenyl derivatives (Japanese Unexamined Patent Application Publication No. 11-242996); triazole derivatives such as 3-(4-biphenylyl)-4-phenyl-5(4-tert-butylphenyl)-1,2,4-triazole (Japanese Unexamined Patent Application Publication No. 7-41759); and phenanthroline derivatives such as bathocuproine (Japanese Unexamined Patent Application Publication No. 10-79297). A compound having at least one pyridine ring substituted at the 2-, 4-, and 6-positions described in International Publication No. 2005/022962 is also preferred as the material of the hole blocking layer 6.

The hole blocking layer 6 may be formed by any method, and can be formed in the same manner as the light-emitting layer 5.

The thickness of the hole blocking layer 6, although not particularly limited as long as the effects of the present invention are not greatly impaired, is typically 0.3 nm or more, preferably 0.5 nm or more, and typically 100 nm or less, preferably 50 nm or less.

<Electron Transport Layer 7>

An electron transport layer 7 is disposed between the light-emitting layer 5 or the hole blocking layer 6 and the electron injection layer 8 for the purpose of further improving the current efficiency of the element.

The electron transport layer 7 is formed of a compound that, between the electrodes under an electric field, is capable of efficiently transporting electrons injected from the cathode 9 toward the light-emitting layer 5. The electron-transporting compound used for the electron transport layer 7 needs to be a compound into which electrons from the cathode 9 or the electron injection layer 8 are injected with high efficiency and which has high electron mobility so that injected electrons can be efficiently transported.

Examples of electron-transporting compounds that satisfy such requirements include metal complexes such as aluminum complexes of 8-hydroxyquinoline (Japanese Unexamined Patent Application Publication No. 59-194393), metal complexes of 10-hydroxybenzo[h]quinoline, oxadiazole derivatives, distyrylbiphenyl derivatives, silole derivatives, 3-hydroxyflavone metal complexes, 5-hydroxyflavone metal complexes, benzoxazole metal complexes, benzothiazole metal complexes, trisbenzimidazolylbenzene (U.S. Pat. No. 5,645,948), quinoxaline compounds (Japanese Unexamined Patent Application Publication No. 6-207169), phenanthroline derivatives (Japanese Unexamined Patent Application Publication No. 5-331459), 2-t-butyl-9,10-N,N'-dicyanoanthraquinonediimine, n-type hydrogenated amorphous silicon carbide, n-type zinc sulfide, and n-type zinc selenide.

The thickness of the electron transport layer 7 is typically 1 nm or more, preferably 5 nm or more, and typically 300 nm or less, preferably 100 nm or less.

The electron transport layer 7 is formed by being stacked on the light-emitting layer 5 or the hole blocking layer 6 by a wet film-forming method or a vacuum deposition method as with the light-emitting layer 5. Typically, a vacuum deposition method is used.

<Electron Injection Layer 8>

The electron injection layer 8 serves to efficiently inject electrons injected from the cathode 9 into the electron transport layer 7 or the light-emitting layer 5.

To achieve efficient electron injection, the material forming the electron injection layer 8 is preferably a metal with a low work function. Examples include alkali metals such as sodium and cesium and alkaline-earth metals such as barium and calcium.

The thickness of the electron injection layer 8 is preferably 0.1 to 5 nm.

To interpose, as the electron injection layer 8, an ultrathin insulating film (about 0.1 to 5 nm thick) of LiF, $MgF_2$, $Li_2O$, $Cs_2CO_3$, or the like between the cathode 9 and the electron transport layer 7 is also an effective means for improving the efficiency of the element (Appl. Phys. Lett., vol. 70, p. 152, 1997; Japanese Unexamined Patent Application Publication No. 10-74586; IEEE Trans. Electron. Devices, vol. 44, p. 1245, 1997; and SID 04 Digest, p. 154).

Furthermore, to dope an organic electron transport material, as typified by nitrogen-containing heterocyclic compounds such as bathophenanthroline and metal complexes such as aluminum complexes of 8-hydroxyquinoline, with an alkali metal such as sodium, potassium, cesium, lithium, or rubidium (described in Japanese Unexamined Patent Application Publication No. 10-270171, Japanese Unexamined Patent Application Publication No. 2002-100478, Japanese Unexamined Patent Application Publication No. 2002-

100482, etc.) is preferred because the electron injection/ transport ability can be improved to achieve excellent film quality. In this case, the thickness of the film is typically 5 nm or more, preferably 10 nm or more, and typically 200 nm or less, preferably 100 nm or less.

The electron injection layer 8 is formed by being stacked on the light-emitting layer 5 or on the hole blocking layer 6 or the electron transport layer 7 thereon by a wet film-forming method or a vacuum deposition method as with the light-emitting layer 5.

Details in the case of a wet film-forming method are the same as in the case of the light-emitting layer 5.

<Cathode 9>

The cathode 9 serves to inject electrons into a layer on the light-emitting layer 5 side (e.g., the electron injection layer 8 or the light-emitting layer 5). The material of the cathode 9 may be the same as the material used for the anode 2. For efficient electron injection, it is preferable to use a metal with a low work function, such as tin, magnesium, indium, calcium, aluminum, silver, or an alloy thereof. Examples of the material of the cathode 9 include alloy electrodes with a low work function, such as magnesium-silver alloys, magnesium-indium alloys, and aluminum-lithium alloys.

In terms of element stability, a metal layer having a high work function and stable to the atmosphere is preferably stacked on the cathode 9 to protect the cathode 9 formed of a metal with a low work function. Examples of the metal stacked include metals such as aluminum, silver, copper, nickel, chromium, gold, and platinum.

The thickness of the cathode is typically the same as that of the anode 2.

<Other Constituent Layers>

While the description has been made mainly in the context of an element with a layer structure illustrated in FIG. 1, any desired layers, in addition to the layers described above, may be disposed between the anode 2 and the light-emitting layer 5 and between the cathode 9 and the light-emitting layer 5 in the organic electroluminescent element of the present invention, or any of the layers other than the light-emitting layer 5 may be omitted, as long as the performance of the element is not impaired.

For example, to dispose an electron blocking layer between the hole transport layer 4 and the light-emitting layer 5 is also effective for the same purpose as that of the hole blocking layer 6. The electron blocking layer serves to prevent electrons moving from the light-emitting layer 5 from reaching the hole transport layer 4, thereby increasing the probability of recombination of electrons with holes in the light-emitting layer 5 and confining the resultant excitons in the light-emitting layer 5, and also serves to efficiently transport holes injected from the hole transport layer 4 toward the light-emitting layer 5.

The electron blocking layer is required to have properties such as high hole transport ability, a large energy gap (difference between HOMO and LUMO), and a high excited triplet level (T1).

When the light-emitting layer 5 is formed by a wet film-forming method, the electron blocking layer is also preferably formed by a wet film-forming method for ease of element production.

Thus, the electron blocking layer also preferably has suitability for wet film formation, and examples of materials used for such electron blocking layers include copolymers of dioctylfluorene and triphenylamine, as typified by F8-TFB (International Publication No. 2004/084260).

The structure in FIG. 1 may be reversed; specifically, the cathode 9, the electron injection layer 8, the electron trans-port layer 7, the hole blocking layer 6, the light-emitting layer 5, the hole transport layer 4, the hole injection layer 3, and the anode 2 may be stacked in this order on the substrate 1. It is also possible to dispose the organic electroluminescent element of the present invention between two substrates at least one of which is highly transparent.

A structure formed of a plurality of the layer structures illustrated in FIG. 1 stacked on top of each other (a structure formed of a plurality of light-emitting units stacked on top of each other) is also possible. In this case, from the viewpoint of light emission efficiency and drive voltage, it is more preferable to use, for example, $V_2O_5$ as a charge generation layer in place of the interfacial layer (when the anode is ITO and the cathode is Al, the interfacial layer means these two layers) between the stages (between the light-emitting units) because such a configuration reduces the barrier between the stages.

The present invention can be applied to any of a single organic electroluminescent element, organic electroluminescent elements configured in an array arrangement, and a structure in which anodes and cathodes are arranged in an X-Y matrix.

[Display Device and Illumination Device]

A display device and an illumination device of the present invention each include the organic electroluminescent element of the present invention as described above. The display device and the illumination device of the present invention may be of any type and may have any structure, and can be assembled according to an ordinary method by using the organic electroluminescent element of the present invention.

For example, the display device and the illumination device of the present invention can be formed by a method as described in "Organic EL Display" (Ohmsha, Ltd., published Aug. 20, 2004, written by Shizuo Tokito, Chihaya Adachi, and Hideyuki Murata).

EXAMPLES

The present invention will now be described in more detail with reference to examples. The present invention is not limited to the following examples, and any modifications can be made without departing from the scope of the present invention.

In the following synthesis examples, all reactions were performed under a stream of nitrogen. Solvents and solutions used for the reactions were used after being deaerated by appropriate methods such as nitrogen bubbling.

Synthesis of Iridium Complex Compound

Synthesis Example 1: Synthesis of Compound 1

Reaction 1

[Chem. 25]

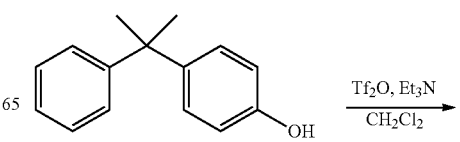

-continued

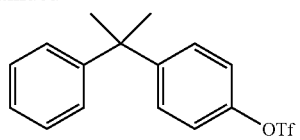

In a 1 L recovery flask, 50.1 g of p-cumylphenol, 400 mL of dry dichloromethane, and 40 mL of triethylamine were placed, and dipping into an ice-salt bath and stirring for 10 minutes were performed. Thereafter, a solution of 66.7 g of trifluoromethanesulfonic acid anhydride in 100 mL of dichloromethane was dripped over 25 minutes. After stirring was performed for 1 hour at room temperature, a solution in which 34 g of potassium carbonate was dissolved in 300 mL of water was added, a water phase was removed, and an oil phase was further washed with 500 mL of water. After the oil phase was dried with magnesium sulfate, the solvent was removed under reduced pressure from the filtered solution, and the residue was refined by silica gel column chromatography (neutral gel of 700 mL, dichloromethane/hexane=1/9) so as to obtain 70.3 g of p-cumylphenyl trifluoromethanesulfonate as a colorless oily substance.

Reaction 2

[Chem. 26]

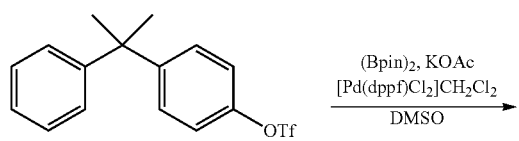

In a 1 L recovery flask, 70.3 g of p-cumylphenyl trifluoromethanesulfonate, 59.4 g of bis(pinacolato)diboron, 5.0 g of [1,1'-bis(diphenylphosphino)ferrocene]palladium(II) dichloride dichloromethane adduct, 100.0 g of potassium acetate, and 580 mL of dimethylsulfoxide were placed, and stirring was performed for 3 hours in an oil bath at 90° C. After cooling to room temperature was performed, 1 L of water and 0.4 L of dichloromethane were added, liquid separation was performed, and a water phase was extracted with further 50 mL of dichloromethane. The oil phases were collected and were dried with magnesium sulfate. Thereafter, the solvent was removed under reduced pressure, and the resulting residue was refined by silica gel column chromatography (neutral gel of 900 mL, dichloromethane/hexane=3/7 to 5/5) so as to obtain 62.1 g of p-cumylphenylboronic acid pinacol ester as a white solid.

Reaction 3

[Chem. 27]

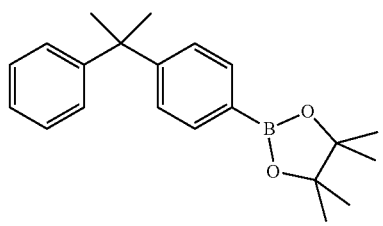

In a 500 mL recovery flask, 14.5 g of p-cumylphenylboronic acid pinacol ester, 14.1 g of 3-iodo-1-bromobenzene, 1.23 g of tetrakis(triphenylphosphine)palladium(0), 23.6 g of 2M-tripotassium phosphate, 50 mL of water, 50 mL of ethanol, and 100 mL of toluene were placed, and stirring was performed for 3 hours in an oil bath at 105° C. A water phase was removed, the solvent was removed under reduced pressure, and the resulting residue was refined by silica gel column chromatography (neutral gel of 700 mL, dichloromethane/hexane=5/95) so as to obtain 12.9 g of 3-bromo-4'-α-cumyl-1,1'-biphenyl as a colorless oily substance.

Reaction 4

[Chem. 28]

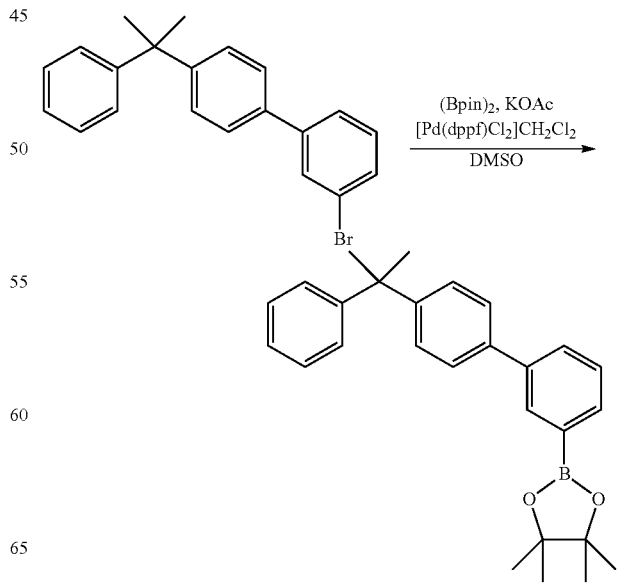

In a 1 L recovery flask, 12.9 g of 3-bromo-4'-α-cumyl-1,1'-biphenyl, 10.7 g of bis(pinacolato)diboron, 0.92 g of [1,1'-bis(diphenylphosphino)ferrocene]palladium(II) dichloride dichloromethane adduct, 18.4 g of potassium acetate, and 100 mL of dimethylsulfoxide were placed, and stirring was performed for 3 hours in an oil bath at 85° C. After cooling to room temperature was performed, 500 mL of water and 100 mL of dichloromethane were added, liquid separation was performed, and a water phase was extracted two times with further 50 mL of dichloromethane. The oil phases were collected and were dried with magnesium sulfate. Thereafter, the solvent was removed under reduced pressure, and the resulting residue was refined by silica gel column chromatography (neutral gel of 900 mL, dichloromethane/hexane=4/6 to 6/4) so as to obtain 12.0 g of 4'-α-cumyl-1,1'-biphenyl-3-ylboronic acid pinacol ester as a light green solid.

Reaction 5

[Chem. 29]

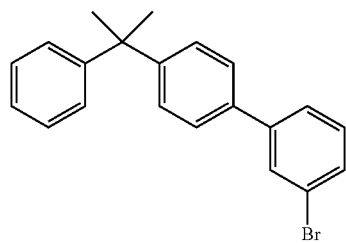

In a 1 L recovery flask, 8.6 g of 3-bromo-3'-(2-pyridyl)-1,1'-biphenyl synthesized by the method described in PTL 1, 12.2 g of 4'-α-cumyl-1,1'-biphenyl-3-ylboronic acid pinacol ester, 0.88 g of tetrakis(triphenylphosphine)palladium(0), 65 mL of 2M-tripotassium phosphate, 65 mL of ethanol, and 200 mL of toluene were placed, and stirring was performed for 3 hours in an oil bath at 100° C. A water phase was removed, the solvent was removed under reduced pressure, and the resulting residue was refined by silica gel column chromatography (neutral gel of 700 mL, ethyl acetate/hexane=1/9 to 2/8) so as to obtain 12.6 g of ligand 1 as a colorless amorphous.

Reaction 6

[Chem. 30]

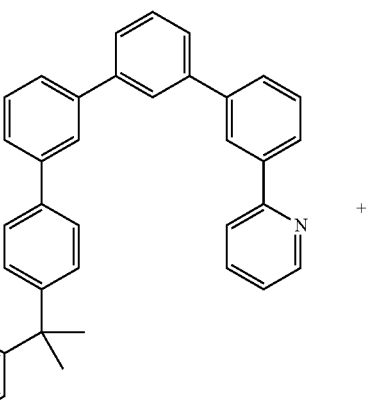

(ligand 1)

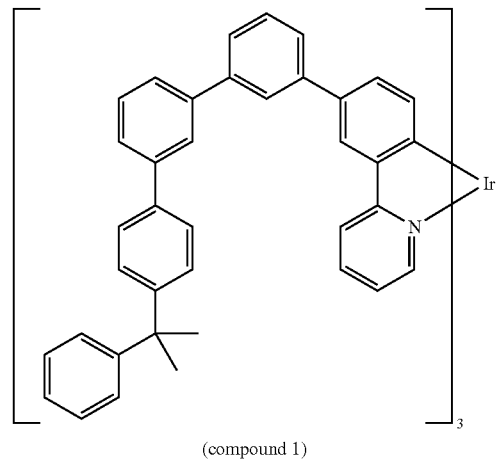

(compound 1)

In a 100 mL recovery flask provided with Dimroth condenser with a side tube, 8.1 g of ligand 1, 2.0 g of tris(acetylacetonato)iridium(III) (produced by Furuya Metal Co., Ltd.), and 10 g of glycerin were placed, and dipping into an oil bath at 180° C. was performed. The oil bath temperature was increased to 230° C. over 1 hour while stirring was performed. After stirring was performed for 5 hours, the temperature was increased to 235° C., and stirring was further performed for 2 hours. After cooling to room temperature was performed, liquid separation washing of the residue was performed with 50 mL of water and 100 mL of dichloromethane, and an oil phase was subjected to solvent removal under reduced pressure. The remaining solid was refined by silica gel column chromatography (basic gel of 600 mL, dichloromethane/hexane=1/1). As a result, 3.0 g of compound 1 was obtained as a yellow solid.

Synthesis Example 2: Synthesis of Compound 2

Reaction 7

Reaction 8

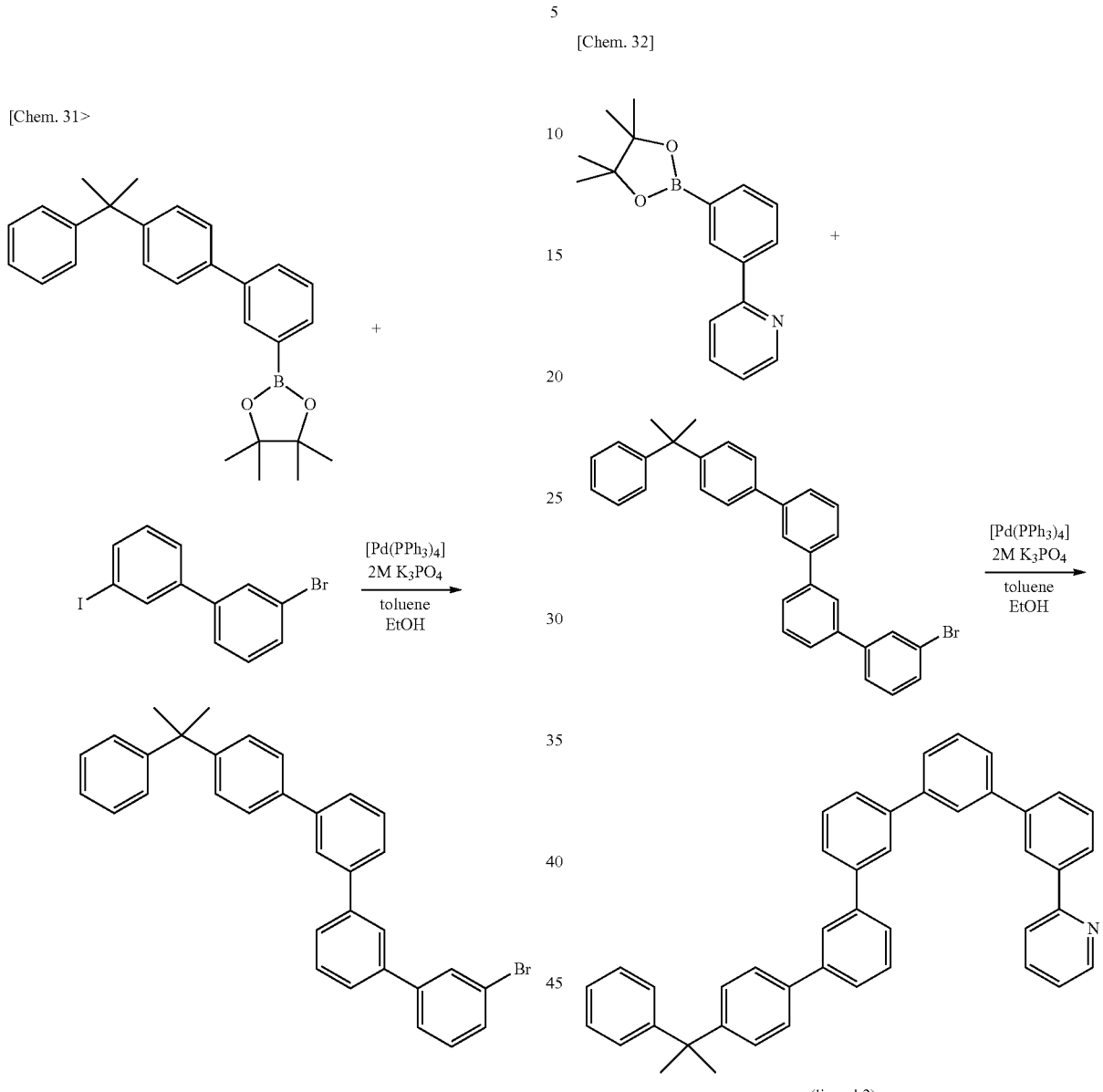

[Chem. 31]

[Chem. 32]

(ligand 2)

In each of two 1 L recovery flasks, 38 g of 4'-α-cumyl-1,1'-biphenyl-3-ylboronic acid pinacol ester, 38 g of 3-bromo-3'-iodo-1,1'-biphenyl, 2.6 g of tetrakis(triphenylphosphine)palladium(0), 34 g of 2M-tripotassium phosphate, 120 mL of water, 125 mL of ethanol, and 250 mL of toluene were placed, and stirring was performed for 3 hours in an oil bath at 105° C. In addition, 1.2 g of tetrakis(triphenylphosphine)palladium(0) was introduced in each flask, the oil bath temperature was set to be 115° C., and stirring was further performed for 3 hours. After cooling to room temperature was performed, a water phase was removed, oil phases were collected, and the solvent was removed under reduced pressure. The resulting residue was refined by silica gel column chromatography (neutral gel of 1.5 L, dichloromethane/hexane=1/9 to 2/8) so as to obtain 83.4 g of 3-bromo-4'''-cumyl-1,3':1',3'':1'':3'''-quaterbenzene as a colorless oily substance.

In a 1 L recovery flask, 26.3 g of 3-(2-pyridyl)phenylboronic acid pinacol ester synthesized by the method described in PTL 1, 51.8 g of 3-bromo-4'''-cumyl-1,3':1',3'':1'':3'''-quaterbenzene, 2.16 g of tetrakis(triphenylphosphine)palladium(0), 115 mL of 2M-tripotassium phosphate, 150 mL of ethanol, and 300 mL of toluene were placed, and stirring was performed for 4 hours in an oil bath at 100° C. A water phase was removed, the solvent was removed under reduced pressure, and the resulting residue was refined by silica gel column chromatography (neutral gel of 600 mL, dichloromethane/hexane=2/8) so as to obtain 49.5 g of ligand 2 as a colorless amorphous.

Reaction 9

Synthesis Example 3: Synthesis of Compound 3

Reaction 10

[Chem. 33]

[Chem. 34>

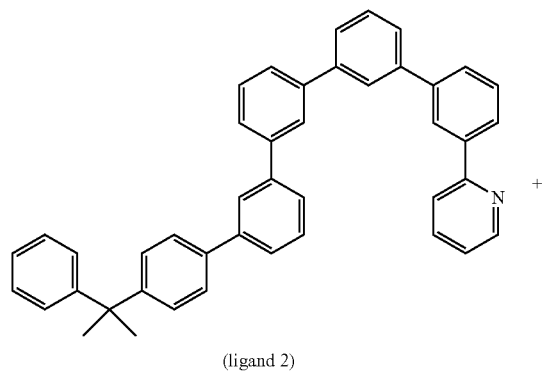

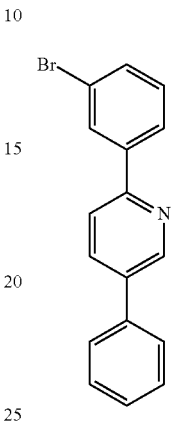

(ligand 2)

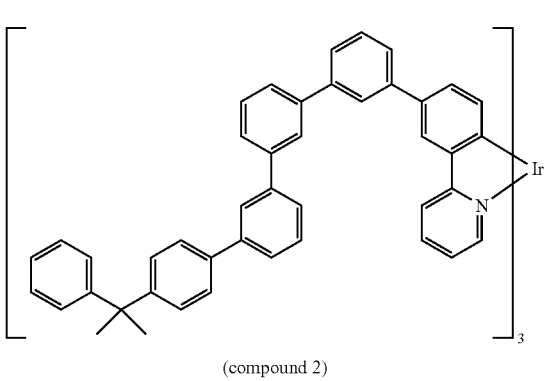

(compound 2)

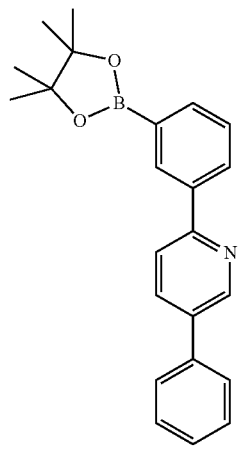

In a 100 mL recovery flask provided with Dimroth condenser with a side tube, 12.6 g of ligand 2, 2.7 g of tris(acetylacetonato)iridium(III) (produced by Furuya Metal Co., Ltd.), 13.5 g of glycerin, and 0.5 mL of phenylcyclohexane were placed, and dipping into an oil bath at 180° C. was performed. The oil bath temperature was increased to 220° C. over 1 hour while stirring was performed. Subsequently, the temperature was increased to 235° C. over 5.5 hours, and stirring was further performed for 2.5 hours. After cooling to room temperature was performed, the residue was washed with 50 mL of water, and the remaining solid was refined by silica gel column chromatography (neutral gel of 600 mL, dichloromethane/hexane=1/1 to 5/1). As a result, 4.2 g of compound 2 was obtained as a yellow solid.

In a 1 L recovery flask, 41.5 g of 2-(3-bromophenyl)-5-phenylpyridine, 39.4 g of bis(pinacolato)diboron, 3.4 g of [1,1'-bis(diphenylphosphino)ferrocene]palladium(II) dichloride dichloromethane adduct, 67 g of potassium acetate, and 350 mL of dimethylsulfoxide were placed, and stirring was performed for 3 hours in an oil bath at 90° C. After cooling to room temperature was performed, 1.2 L of water and 500 mL of dichloromethane were added, liquid separation was performed, and a water phase was extracted with further 100 mL of dichloromethane. The oil phases were collected, the solvent was removed under reduced pressure, and the resulting residue was refined by silica gel column chromatography (neutral gel of 750 mL, ethyl acetate/hexane=15/85 to 2/8) so as to obtain 43.4 g of 3-(5-phenylpyridin-2-yl)phenylboronic acid pinacol ester as a white solid.

Reaction 11

[Chem. 35]

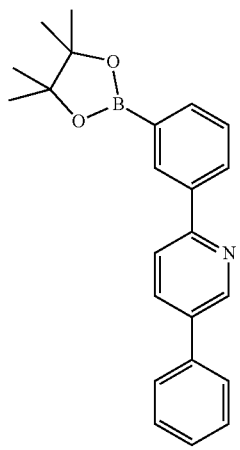

+

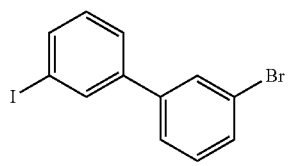

$\xrightarrow[\text{EtOH}]{\substack{[\text{Pd}(\text{PPh}_3)_4] \\ 2\text{M K}_3\text{PO}_4 \\ \text{toluene}}}$

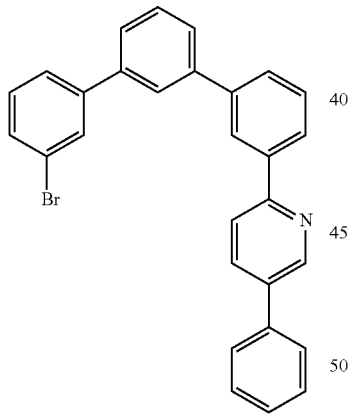

In a 1 L recovery flask, 12.1 g of 3-(5-phenylpyridin-2-yl)phenylboronic acid pinacol ester, 13.4 g of 3-bromo-3'-iodo-1,1'-biphenyl, 1.20 g of tetrakis(triphenylphosphine) palladium(0), 50 mL of 2M-tripotassium phosphate, 50 mL of ethanol, and 100 mL of toluene were placed, and stirring was performed for 6.5 hours in an oil bath at 105° C. A water phase was removed, and the solvent was removed under reduced pressure. The resulting residue was refined by silica gel column chromatography (neutral gel of 650 mL, dichloromethane/hexane=1/1 to 6/4) so as to obtain 12.3 g of (3"-bromo-1,1':3',1"terphenyl-3-yl)-5-phenylpyridine as a colorless amorphous.

Reaction 12

[Chem. 36]

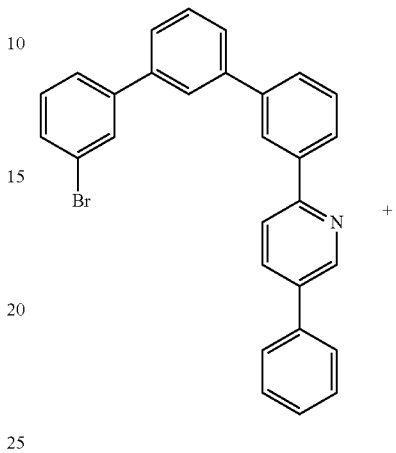

$\xrightarrow[\text{EtOH}]{\substack{[\text{Pd}(\text{PPh}_3)_4] \\ 2\text{M K}_3\text{PO}_4 \\ \text{toluene}}}$

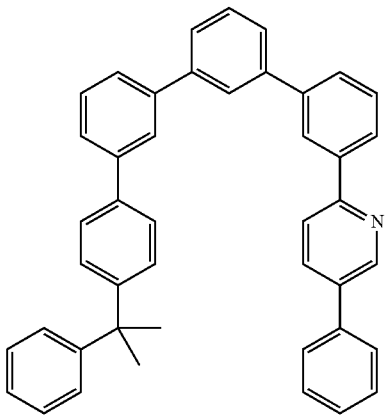

(ligand 3)

In a 1 L recovery flask, 5.9 g of (3"-bromo-1,1':3',1"terphenyl-3-yl)-5-phenylpyridine, 4.3 g of p-cumylphenylboronic acid pinacol ester, 0.38 g of tetrakis(triphenylphosphine)palladium(0), 20 mL of 2M-tripotassium phosphate, 20 mL of ethanol, and 50 mL of toluene were placed, and stirring was performed for 4 hours in an oil bath at 105° C. A water phase was removed, and the solvent was removed under reduced pressure. The resulting residue was refined by silica gel column chromatography (neutral gel of 700 mL, dichloromethane/hexane=1/1 to 6/4) so as to obtain 5.6 g of ligand 3 as a cream-colored amorphous.

Reaction 13

[Chem. 37]

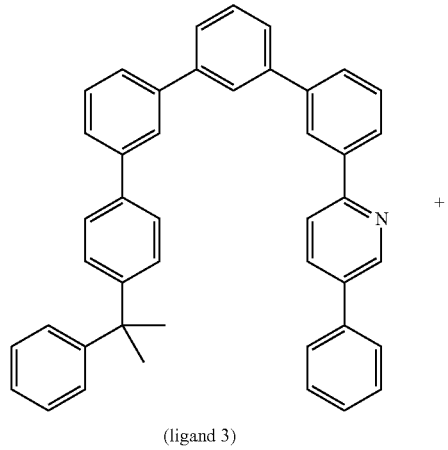

(ligand 3)

[Ir(acac)₃] →(glycerin)

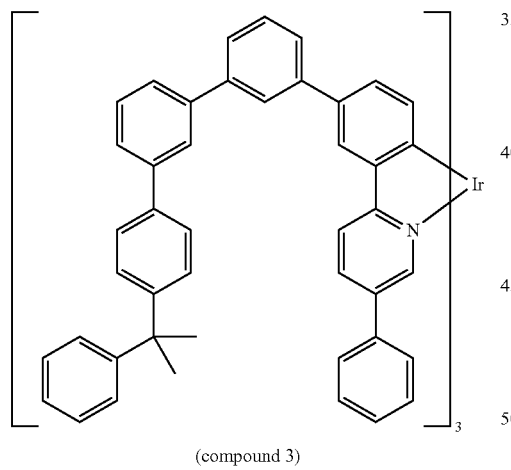

(compound 3)

In a 100 mL recovery flask provided with Dimroth condenser with a side tube, 5.6 g of ligand 3, 1.2 g of tris(acetylacetonato)iridium(III) (produced by Furuya Metal Co., Ltd.), 9.0 g of glycerin, and 0.6 mL of phenylcyclohexane were placed and dipping into an oil bath at 200° C. was performed. The temperature was immediately increased to 235° C., and stirring was performed for 6.5 hours. After cooling to room temperature was performed, the residue was washed with 50 mL of water, and the remaining solid was refined by silica gel column chromatography (neutral gel of 1.2 L, dichloromethane/hexane=3/7 to 1/1). As a result, 1.5 g of compound 3 was obtained as a yellow solid.

Synthesis Example 4: Synthesis of Compound 4

Reaction 14

[Chem. 38]

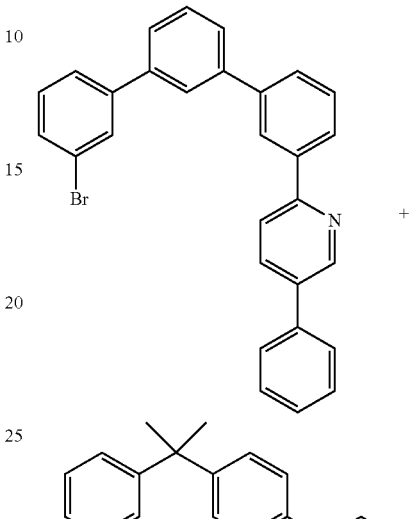

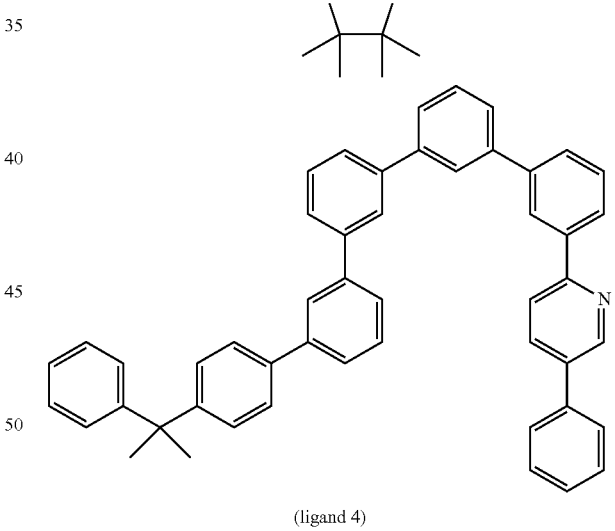

(ligand 4)

In a 1 L recovery flask, 6.2 g of (3″-bromo-1,1′:3′, 1″terphenyl-3-yl)-5-phenylpyridine, 4.4 g of 4′-o-cumyl-1, 1′-biphenyl-3-ylboronic acid pinacol ester, 0.44 g of tetrakis (triphenylphosphine)palladium(0), 20 mL of 2M-tripotassium phosphate, 20 mL of ethanol, and 40 mL of toluene were placed, and stirring was performed for 3 hours in an oil bath at 105° C. A water phase was removed, and the solvent was removed under reduced pressure. The resulting residue was refined by silica gel column chromatography (neutral gel of 200 mL, dichloromethane/hexane=7/3) so as to obtain 6.3 g of ligand 4 as a cream-colored amorphous.

Reaction 15

[Chem. 39]

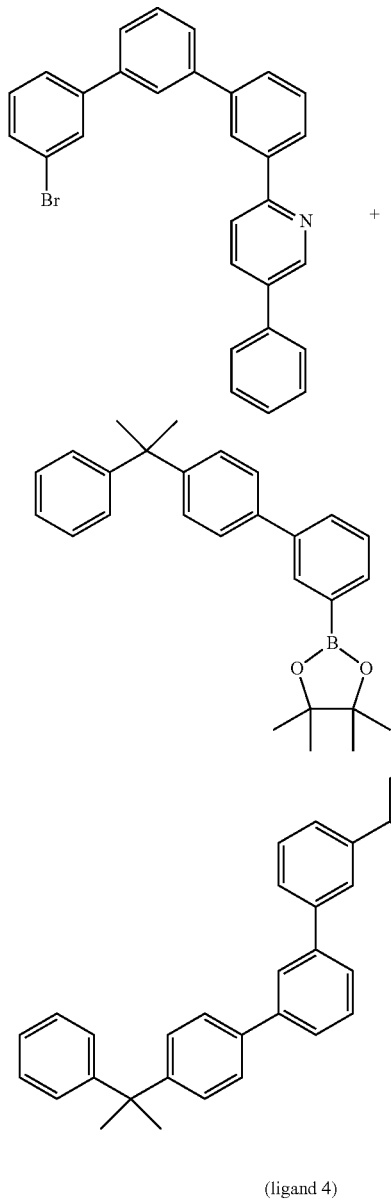

(ligand 4)

In a 100 mL recovery flask provided with Dimroth condenser with a side tube, 6.3 g of ligand 4, 1.4 g of tris(acetylacetonato)iridium(III) (produced by Furuya Metal Co., Ltd.), 7.6 g of glycerin, and 0.4 mL of phenylcyclohexane were placed, and dipping into an oil bath was performed. The temperature was immediately increased to 235° C., and stirring was performed for 7 hours. After cooling to room temperature was performed, the residue was washed with 10 mL of water, and the remaining solid was refined by silica gel column chromatography (neutral gel of 700 mL, dichloromethane/hexane=1/1). As a result, 1.5 g of compound 4 was obtained as a yellow solid.

<Comparative Compound>

Each of comparative compounds 1 to 4 was synthesized referring to the method described in PTL 1.

[Chem. 40]

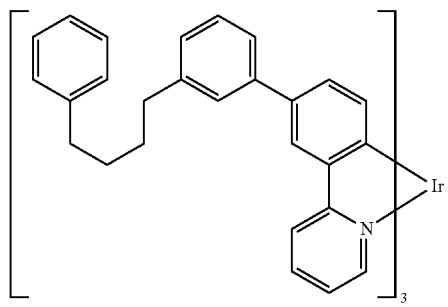

comparative compound 5

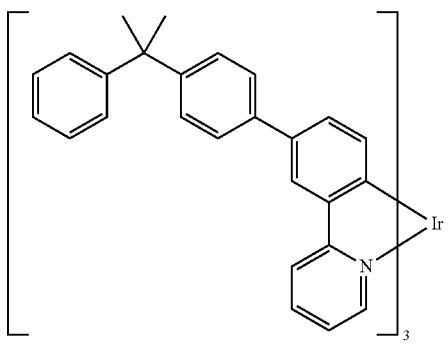

[Solubility Test]

Each of compounds 1 to 4 and comparative compounds 1 to 5 was mixed with cyclohexylbenzene at a concentration of 3% by mass, and it was observed whether dissolution occurred at 70° C. As a result, compounds 1 to 4 and comparative compounds 1 to 4 were dissolved, but comparative compound 5 was not completely dissolved.

[Measurement of Glass Transition Temperature (Tg) by Using Differential Scanning Calorimeter (DSC)]

An apparatus used was DSC6220 produced by Hitachi High-Tech Science Corporation. Regarding a sample, 4 mg each of compounds 1 to 4 and comparative compounds 1 to 4 exhibited a favorable solubility test result was placed in an Al liquid sample container and was hermetically sealed. Thereafter, in an atmosphere of 50 ml/min of nitrogen, the first measurement was performed from room temperature to 270° C. at a temperature increase rate of 10° C./min. After the measurement, the sample container was removed onto a metal block at room temperature so as to be rapidly cooled. Subsequently, the second measurement was performed in the same manner as the first measurement. Regarding the second measurement, when a baseline shift was observed, an intersection temperature of the extrapolation baseline of the low-temperature-side baseline and the tangent at a maximum inclination point of baseline change was read and taken as Tg.

The results are described in Table 1.

Table 1 also describes the above-described solubility test results indicated by good (O) or poor (x) of the solubility.

TABLE 1

|  | Sample | Solubility | Tg (° C.) |
| --- | --- | --- | --- |
| Example 1 | Compound 1 | O | 173 |
| Example 2 | Compound 2 | O | 167 |
| Example 3 | Compound 3 | O | 170 |
| Example 4 | Compound 4 | O | 164 |
| Comparative example 1 | Comparative compound 1 | O | 86 |
| Comparative example 2 | Comparative compound 2 | O | 57 |
| Comparative example 3 | Comparative compound 3 | O | 66 |
| Comparative example 4 | Comparative compound 4 | O | 75 |
| Comparative example 5 | Comparative compound 5 | X | — |

As is clear from Table 1, the iridium complex compound according to the present invention has excellent solvent solubility and excellent heat resistance in combination.

Example 5

An organic electroluminescent element was produced by using a method described below.

A positive electrode was formed by patterning a deposit of indium-tin oxide (ITO) transparent conductive film having a thickness of 50 nm on a glass substrate (sputtering film formation product, produced by Sanyo Vacuum Industries Co., Ltd.) into a stripe having a width of 2 mm by using common photolithographic technology and hydrochloric acid etching. The substrate provided with the patterned ITO was subjected to washing in the order of ultrasonic cleaning with a surfactant aqueous solution, water washing with ultrapure water, ultrasonic cleaning with ultrapure water, and water washing with ultrapure water and, thereafter, was dried with dry air. Finally, ultraviolet ozone cleaning was performed.

Regarding a hole-injection-layer-forming composition, a composition in which 3.0% by mass of hole-transporting polymer compound having a repeating structure denoted by formula (P-1) below and 0.6% by mass of oxidizing agent (HI-1) were dissolved in ethyl benzoate was prepared.

[Chem. 41]
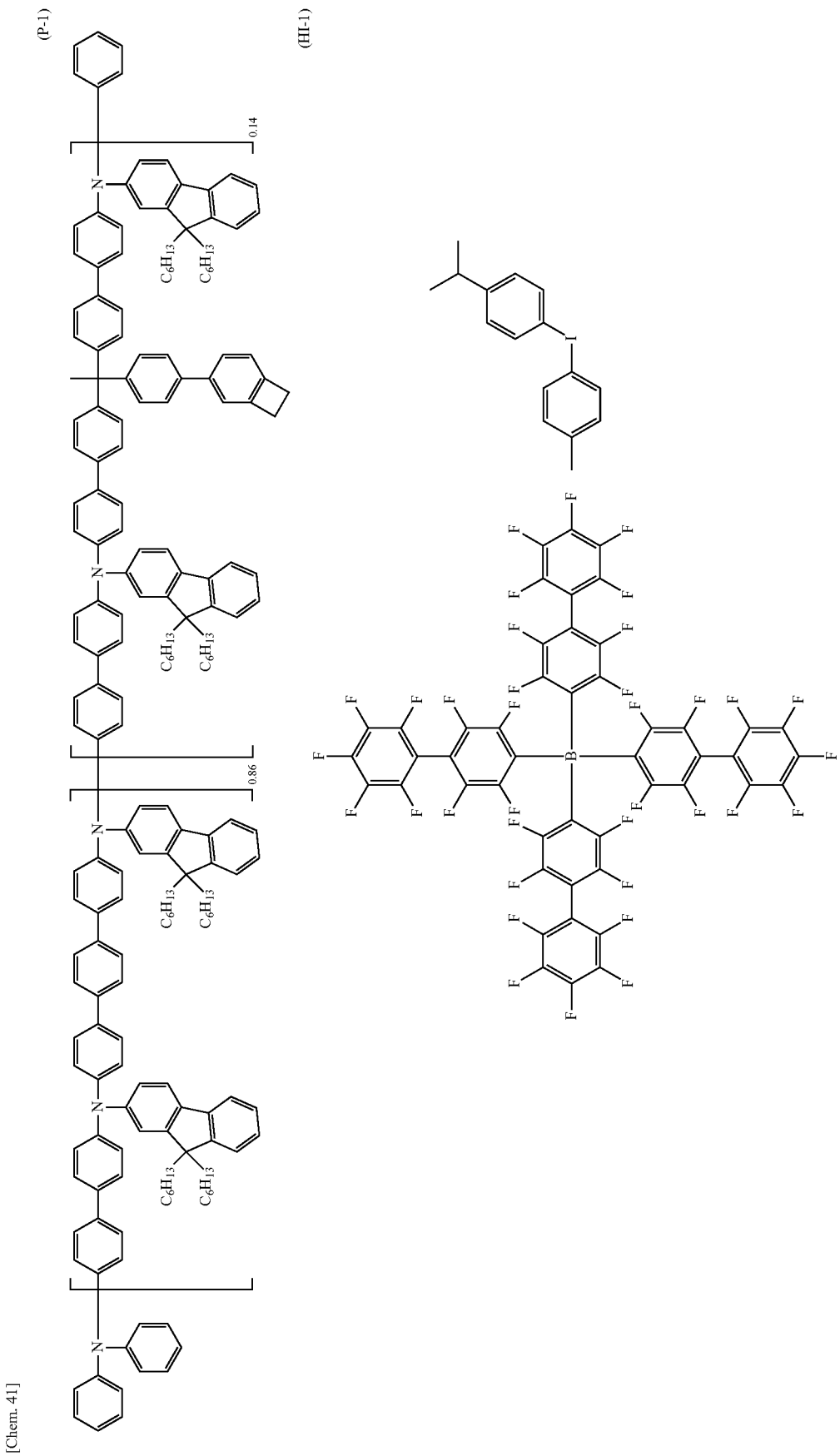

The substrate was spin-coated with the hole-injection-layer-forming composition in air, drying was performed by using a hot plate at 240° C. for 30 minutes in air so as to form a uniform thin film having a film thickness of 45 nm and serving as a hole injection layer.

Next, a hole-transporting-layer-forming composition was prepared by dissolving a charge-transporting polymer compound denoted by structural formula (HT-1) below in cyclohexyl benzene at a concentration of 3.0% by mass.

[Chem. 42]

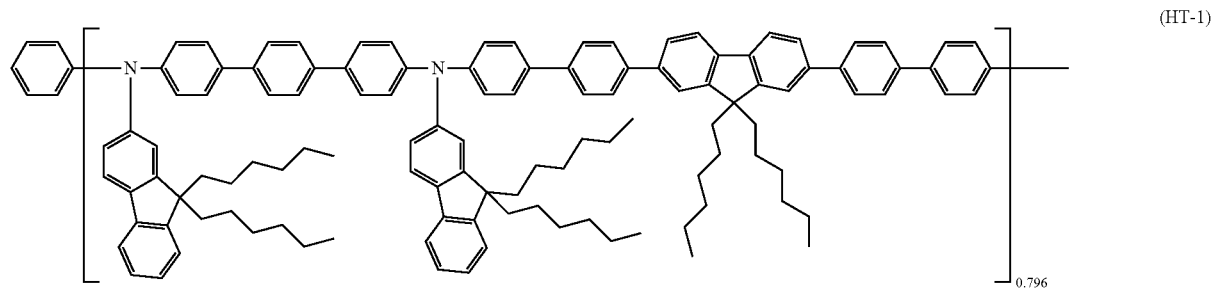

(HT-1)

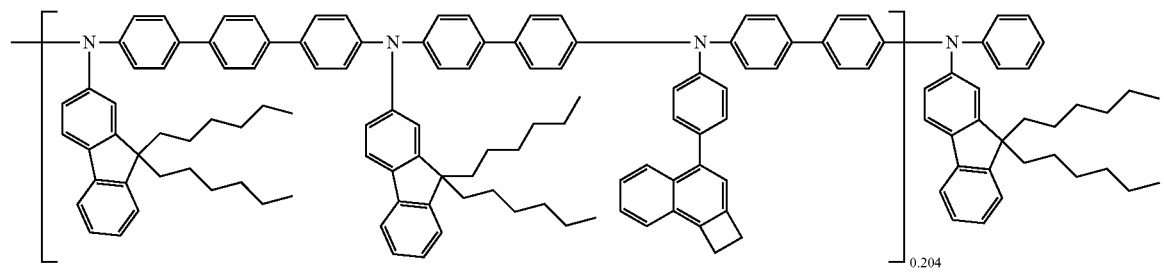

The substrate provided with the hole injection layer through coating film formation was spin-coated with the hole-transporting-layer-forming composition in a nitrogen glove box, and drying was performed by using a hot plate in the nitrogen glove box at 230° C. for 30 minutes so as to form a uniform thin film having a film thickness of 40 nm and serving as a hole-transporting layer.

Subsequently, regarding the material for forming the light-emitting layer, 25 parts by mass of structural formula (H-1) below, 25 parts by mass of (H-2), and 50 parts by mass of (H-3) were used as the host material, 30 parts by mass of structural formula (D-1) below that is compound 1 synthesized in synthesis example 1 was further used as the light-emitting material, and these were dissolved in cyclohexylbenzene so as to prepare a light-emitting-layer-forming composition having a solids concentration of 7.8% by mass.

[Chem. 43]

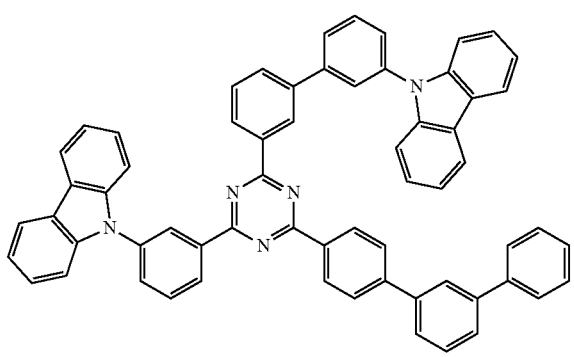

(H-1)

-continued

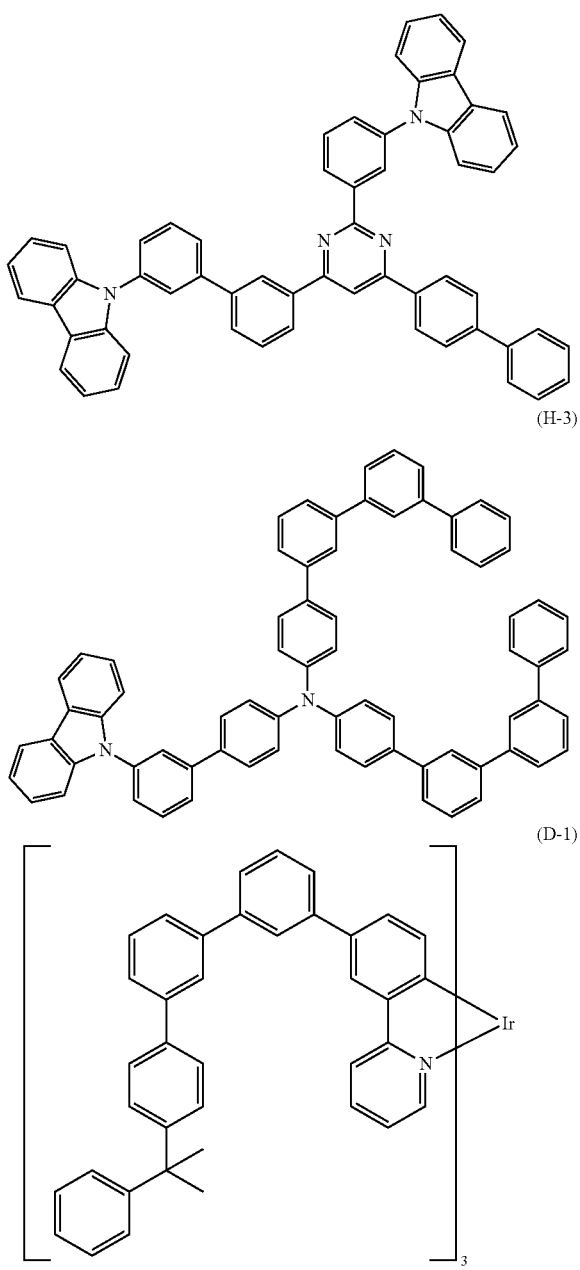

(H-2)

(H-3)

(D-1)

The substrate provided with the hole-transporting layer through coating film formation was spin-coated with the light-emitting-layer-forming composition in a nitrogen glove box, and drying was performed by using a hot plate in the nitrogen glove box at 120° C. for 20 minutes so as to form a uniform thin film having a film thickness of 80 nm and serving as a light-emitting layer. The glass transition temperature of light-emitting material (D-1) is 173° C. as described in Table 1.

The substrate on which films up to the light-emitting layer were formed was placed in the vacuum deposition apparatus, and the interior of the apparatus was evacuated to $2 \times 10^{-4}$ Pa or less.

Next, structural formula (HB-1) below and 8-hydroxy-quinolinolato-lithium were co-deposited on the light-emitting layer at a film thickness ratio of 2:3 at a rate of 1 Å/sec by using a vacuum deposition method so as to form a hole blocking layer having a film thickness of 30 nm.

[Chem. 44]

(HB-1)

Subsequently, a 2-mm-width-stripe-like shadow mask for negative electrode deposition was made to adhere to the substrate so as to orthogonal to the ITO stripe of the positive electrode, and the resulting substrate was disposed in another vacuum deposition apparatus. Then, regarding the negative electrode, aluminum was heated by using a molybdenum boat, and an aluminum layer having a film thickness of 80 nm was formed at a deposition rate of 1 to 8.6 Å/sec so as to form a negative electrode.

In this manner, an organic electroluminescent element including a light emission area portion with a size of 2 mm×2 mm was obtained.

Comparative Example 6

An element was produced in the same manner as example 1 except that the light-emitting material was changed from (D-1) to structural formula (D-2) below serving as comparative compound 2. The glass transition temperature of light-emitting material (D-2) is 57° C. as described in Table 1.

[Chem. 45]

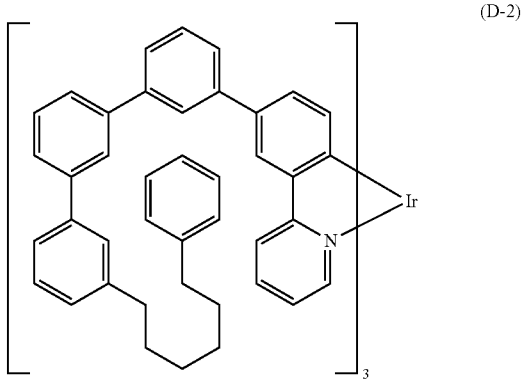

(D-2)

Comparative Example 7

An element was produced in the same manner as example 1 except that the light-emitting material was changed from (D-1) to structural formula (D-3) below. The glass transition temperature of light-emitting material (D-3) is 156° C.

[Chem. 46]

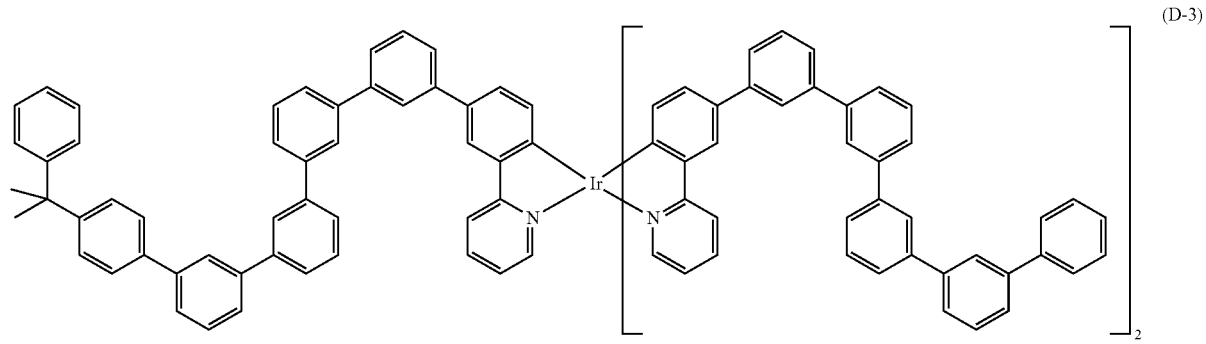

(D-3)

[Evaluation of Element]

The current light emission efficiency (cd/A) at the time when each of the elements obtained in example 5, comparative example 6, and comparative example 7 was made to emit light with brightness of 1,000 cd/m² was taken as an initial current light emission efficiency. After the element was kept for 31 hours in a constant-temperature bath at 120° C., the current light emission efficiency (cd/A) at the time when the element was made to emit light again with brightness of 1,000 cd/m² was taken as a latter current light emission efficiency.

From these values, the Δ current light emission efficiency (%) was calculated by a formula below.

Δ current light emission efficiency (%)={latter current light emission efficiency−initial current light emission efficiency)/initial current light emission efficiency}×100

The Δ current light emission efficiency of each of the elements obtained in example 5, comparative example 6, and comparative example 7 is described in Table 2. As is indicated by the results in Table 2, regarding the organic electroluminescent element produced by using (D-1) that is the iridium complex compound according to the present invention as the light-emitting material, the current light emission efficiency does not deteriorate, and the heat resistance is high even after keeping at 120° C.

TABLE 2

| | Light-emitting material | Δ Current emission efficiency (%) |
|---|---|---|
| Example 5 | D-1 | 2.6 |
| Comparative example 6 | D-2 | −43.8 |
| Comparative example 7 | D-3 | −7.2 |

As is clear from the above-described results, the iridium complex compound according to the present invention has excellent solvent solubility and heat resistance in combination, and the organic EL element including the iridium complex compound according to the present invention can be favorably used as a light-emitting material for car-mounted organic EL display since the operation characteristics are not impaired at high temperatures.

While the present invention has been described in detail using a specific embodiment, it should be apparent to those skilled in the art that various modifications can be made without departing from the spirit and scope of the present invention.

The present application is based on Japanese Patent Application No. 2019-092237 filed on May 15, 2019, which are incorporated herein by reference in their entirety.

REFERENCE SIGNS LIST 1 substrate
2 anode
3 hole injection layer
4 hole transport layer
5 light-emitting layer
6 hole blocking layer
7 electron transport layer
8 electron injection layer
9 cathode
10 organic electroluminescent element

The invention claimed is:
1. An iridium complex compound denoted by a formula (1),

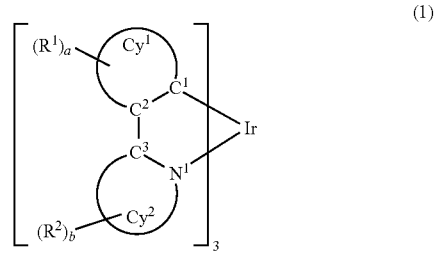

(1)

wherein,
Ir represents an iridium atom,
ring $Cy^1$ represents a monocyclic or fused aromatic ring or a monocyclic or fused heteroaromatic ring, which includes carbon atoms $C^1$ and $C^2$,
ring $Cy^2$ represents a monocyclic or fused heteroaromatic ring, which includes carbon atom $C^3$ and a nitrogen atom $N^1$, each of $R^1$ and $R^2$ represents a hydrogen atom or a substituent, a represents an integer of 0 or more, an upper limit of which is the maximum number of possible substituents on the ring $Cy^1$, b represents an integer of 0 or more, an upper limit of which is the maximum number of possible substituents on the ring $Cy^2$, when there are a plurality of $R^1$ and a plurality of $R^2$, the plurality of $R^1$ and the plurality of $R^2$ are independent of each other and may be the same or may differ from each other, and at least one $R^1$ is a substituent denoted by a formula (2) or a substituent further substituted with a substituent denoted by a formula (2),

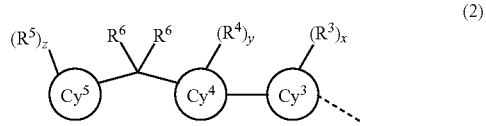
(2)

wherein, the broken line represents a bond, each of ring $Cy^3$, ring $Cy^4$, and ring $Cy^5$ represents a monocyclic aromatic ring or a heteroaromatic ring, ring $Cy^3$ optionally includes multiple linked ring structures, each of $R^3$ to $R^6$ represents a hydrogen atom or a substituent, each of x, y, and z represents an integer of 0 or more, an upper limit of which is the maximum number of possible substituents on the ring $Cy^3$, the ring $cy^4$, and the ring $Cy^5$, respectively, and two $R^6$ and a plurality of $R^3$ to a plurality of $R^5$ when there are a plurality of $R^3$ to a plurality of $R^5$ are independent of each other and may be the same or may differ from each other.

2. The iridium complex compound according to claim 1, wherein the substituent denoted by the formula (2) is a substituent denoted by formula (3),

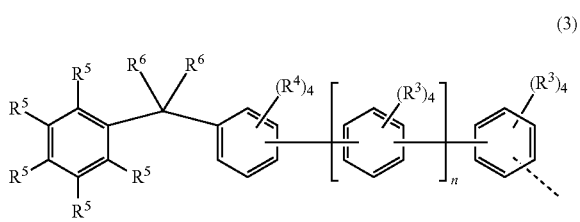
(3)

wherein, each of $R^3$ to $R^6$ represents a hydrogen atom or a substituent, and n represents an integer of 0 to 10.

3. The iridium complex compound according to claim 1, wherein the substituent denoted by formula (2) is a substituent denoted by formula (4),

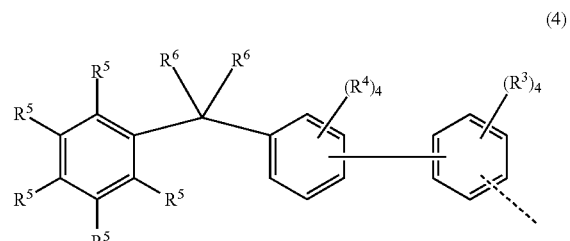
(4)

wherein, each of $R^3$ to $R^6$ represents a hydrogen atom or a substituent.

4. The iridium complex compound according to claim 1, wherein the substituent denoted by formula (2) is a substituent denoted by formula (2A),

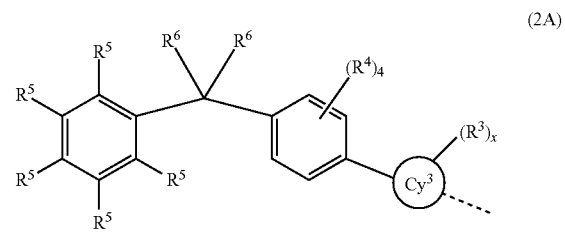
(2A)

wherein, each of a ring $Cy^3$, $R^3$, $R^4$, $R^5$, $R^6$, and x is as defined for formula (2).

5. The iridium complex compound according to claim 1, wherein the substituent denoted by formula (2) is a substituent denoted by formula (3A),

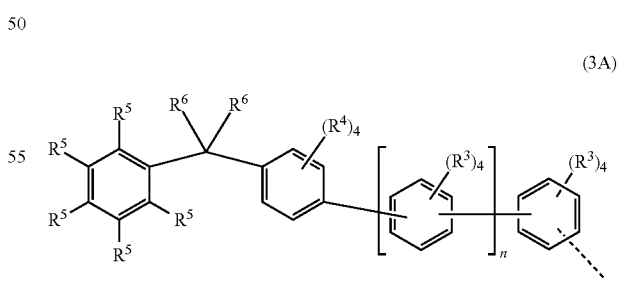
(3A)

wherein, each of $R^3$ to $R^6$ represents a hydrogen atom or a substituent, and n represents an integer of 0 to 10.

6. The iridium complex compound according to claim 1, wherein the substituent denoted by formula (2) is a substituent denoted by formula (4A),

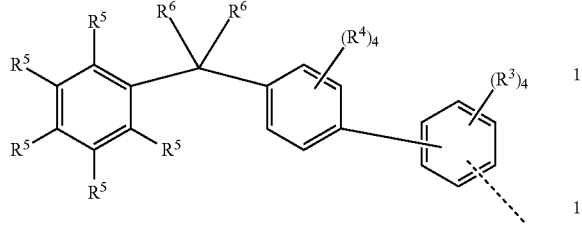

(4A)

wherein each of $R^3$ to $R^6$ represents a hydrogen atom or a substituent.

7. The iridium complex compound according to claim 1, wherein $Cy^3$ in the formula (2) has a partial structure denoted by formula (5),

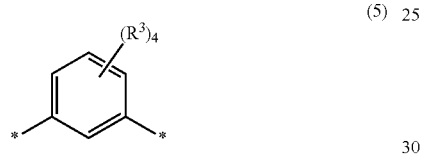

(5)

wherein,
$R^3$ represents a hydrogen atom or a substituent,
and "*" represents a bonding position.

8. The iridium complex compound according to claim 1, wherein the ring $Cy^2$ is a benzene ring.

9. The iridium complex compound according to claim 1, wherein the ring $Cy^2$ is a pyridine ring.

10. The iridium complex compound according to claim 1, wherein each of $R^1$ to $R^6$ is a hydrogen atom or a substituent selected from the group consisting of D, F, Cl, Br, I, —N(R')₂, —CN, —NO₂, —OH, —COOR', —C(=O)R', —C(=O)NR', —P(=O)(R')₂, —S(=O)R', —S(=O)₂R', —OSO₂R', a linear, branched, or cyclic alkyl group having 1 to 30 carbon atoms, a linear, branched, or cyclic alkoxy group having 1 to 30 carbon atoms, a linear, branched, or cyclic alkylthio group having 1 to 30 carbon atoms, a linear, branched, or cyclic alkenyl group having 2 to 30 carbon atoms, a linear, branched, or cyclic alknyl group having 2 to 30 carbon atoms, an aromatic group having 5 to 60 carbon atoms, a heteroaromatic group having 5 to 60 carbon atoms, an aryloxy group having 5 to 40 carbon atoms, an arylthio group having 5 to 40 carbon atoms, an aralkyl group having 5 to 60 carbon atoms, a heteroaralkyl group having 5 to 60 carbon atoms, a diarylamino group having 10 to 40 carbon atoms, an arylheteroarylamino group having 10 to 40 carbon atoms, and a diheteroarylamino group having 10 to 40 carbon atoms, wherein
the alkyl group, the alkoxy group, the alkylthio group, the alkenyl group, the alkynyl group, the aralkyl group, and the heteroaralkyl group may be further substituted with one or more R', one —CH₂— group or two or more non-adjacent —CH₂— groups in these groups may be substituted with —C(—R')=C(—R')—, —C≡C—, —Si(—R')₂—, —C(O)—, —NR'—, —O—, —S—, —CONR'—, or a divalent aromatic group, one or more hydrogen atoms in these groups may be substituted with D, F, Cl, Br, I, or —CN, each of two adjacent $R^1$ to $R^4$ may be bonded to each other to form an aliphatic, aromatic, or heteroaromatic monocyclic ring or fused ring, the aromatic group, the heteroaromatic group, the aryloxy group, the arylthio group, the diarylamino group, the arylheteroarylamino group, and the diheteroarylamino group may be further substituted with one or more R', wherein each R' is independently selected from the group consisting of H, D, F, Cl, Br, I, —N(R")₂, —CN, —NO₂, —Si(R")₃, —B(OR")₂, —C(=O)R", —P(=O)(R")₂, —S(=O)₂R", —OSO₂R", a linear, branched, or cyclic alkyl group having 1 to 30 carbon atoms, a linear, branched, or cyclic alkoxy group having 1 to 30 carbon atoms, a linear, branched, or cyclic alkylthio group having 1 to 30 carbon atoms, a linear, branched, or cyclic alkenyl group having 2 to 30 carbon atoms, a linear, branched, or cyclic alkynyl group having 2 to 30 carbon atoms, an aromatic group having 5 to 60 carbon atoms, a heteroaromatic group having 5 to 60 carbon atoms, an aryloxy group having 5 to 40 carbon atoms, an arylthio group having 5 to 40 carbon atoms, an aralkyl group having 5 to 60 carbon atoms, a heteroaralkyl group having 5 to 60 carbon atoms, a diarylamino group having 10 to 40 carbon atoms, an arylheteroarylamino group having 10 to 40 carbon atoms, and a diheteroarylamino group having 10 to 40 carbon atoms, wherein the alkyl group, the alkoxy group, the alkylthio group, the alkenyl group, the alkynyl group, the aralkyl group, and the heteroaralkyl group may be further substituted with one or more R", one CH₂ group or two or more non-adjacent CH₂ groups in these groups may be substituted with —R"C=CR'—', —C≡C—, —Si(R")₂, —C(=O)—, —NR"—, —O—, —S—, —CONR"—, or a divalent aromatic group, one or more hydrogen atoms in these groups may be substituted with D, F, Cl, Br, I, or CN, and the aromatic group, the heteroaromatic group, the aryloxy group, the arylthio group, the diarylamino group, the arylheteroarylamino group, and the diheteroarylamino group may be further substituted with one or more R", each of two adjacent R' may be bonded to each other to form an aliphatic, aromatic, or heteroaromatic monocyclic ring or fused ring, and each R" is selected from the group consisting of H, D, F, CN, an aliphatic hydrocarbon group having 1 to 20 carbon atoms, an aromatic group having 1 to 20 carbon atoms, and a heteroaromatic group having 1 to 20 carbon atoms, and two or more adjacent R" may be bonded to each other to form an aliphatic, aromatic, or heteroaromatic, monocyclic or fused ring.

11. The iridium complex compound according to claim 1, wherein at least one of $R^1$ is a substituent denoted by formula (2) or is further substituted with a substituent denoted by formula (2).

12. A composition comprising the iridium complex compound according to claim 1 and an organic solvent.

13. An organic electroluminescent element comprising the iridium complex compound according to claim 1.

14. A display device comprising the organic electroluminescent element according to claim 13.

15. An illumination device comprising the organic electroluminescent element according to claim 13.

\* \* \* \* \*